US012652921B2

(12) United States Patent
Kimura et al.

(10) Patent No.: US 12,652,921 B2
(45) Date of Patent: Jun. 9, 2026

(54) DISPLAY APPARATUS, DISPLAY MODULE, AND ELECTRONIC DEVICE WITH PIXEL SET INCLUDING FOUR PIXELS

(71) Applicant: Semiconductor Energy Laboratory Co., Ltd., Kanagawa-ken (JP)

(72) Inventors: Hajime Kimura, Atsugi (JP); Kunio Kimura, Zama (JP); Takuya Kawata, Atsugi (JP)

(73) Assignee: Semiconductor Energy Laboratory Co., Ltd. (JP)

(*) Notice: Subject to any disclaimer, the term of this patent is extended or adjusted under 35 U.S.C. 154(b) by 0 days.

(21) Appl. No.: 18/222,169

(22) Filed: Jul. 14, 2023

(65) Prior Publication Data

US 2024/0032372 A1 Jan. 25, 2024

(30) Foreign Application Priority Data

Jul. 21, 2022 (JP) ................................ 2022-116351

(51) Int. Cl.
*H10K 59/35* (2023.01)
*H10K 59/38* (2023.01)

(52) U.S. Cl.
CPC .......... *H10K 59/351* (2023.02); *H10K 59/38* (2023.02)

(58) Field of Classification Search
None
See application file for complete search history.

(56) References Cited

U.S. PATENT DOCUMENTS 8,946,699 B2 2/2015 Hatano et al.
10,777,762 B2 9/2020 Seo et al.
10,790,462 B2 9/2020 Seo et al.
11,545,642 B2 1/2023 Seo et al.
11,574,961 B2 2/2023 Suzuki et al.
2007/0138947 A1 6/2007 Popovic et al.
2007/0145350 A1 6/2007 Kobori
2007/0200492 A1* 8/2007 Cok .................... H10K 59/877 313/506
2012/0228648 A1 9/2012 Mitsuya
2012/0319569 A1 12/2012 Okamoto et al.
2013/0082589 A1 4/2013 So et al.
(Continued)

FOREIGN PATENT DOCUMENTS

JP 2021-021875 A 2/2021
WO WO 2011/145418 A1 11/2011

*Primary Examiner* — Nduka E Ojeh
(74) *Attorney, Agent, or Firm* — Husch Blackwell LLP

(57) ABSTRACT

A display apparatus includes first to fourth pixels. The first pixel includes a first light-emitting device and a first layer. The first light-emitting device emits first light toward the first layer. An emission spectrum of the first light has an intensity in a blue-light wavelength range and an intensity in a green-light wavelength range. The first layer contains a color conversion material converting blue and green light into red light. The second pixel includes a second light-emitting device and a second layer. The second layer has a function of transmitting blue light. The third pixel includes a third light-emitting device and a third layer. The third layer has a function of absorbing blue light and transmitting green light. The fourth pixel includes a fourth light-emitting device and a fourth layer. The first to fourth light-emitting device provide the same emission spectrum as each other.

12 Claims, 29 Drawing Sheets

703

(56) References Cited

U.S. PATENT DOCUMENTS

| | | | | |
|---|---|---|---|---|
| 2013/0146903 | A1 | 6/2013 | Ichikawa et al. | |
| 2019/0049779 | A1 | 2/2019 | Lee et al. | |
| 2019/0280055 | A1* | 9/2019 | Hack | H10K 59/30 |
| 2020/0006688 | A1* | 1/2020 | Seo | H10K 50/131 |
| 2022/0052278 | A1* | 2/2022 | Lee | C09K 11/06 |
| 2023/0109508 | A1* | 4/2023 | Kwak | H10K 59/32<br>257/40 |
| 2023/0125419 | A1 | 4/2023 | Seo et al. | |
| 2023/0255082 | A1 | 8/2023 | Suzuki et al. | |

* cited by examiner

703

703

6500

6501
6505 6507
6508
6502
6503
6504
6506

6510 6513 6512 6511
6502

6515 6516 6517 6518 6501

7100 7101 7000
7103
7111

7200 7211 7000
7212
7213
7214

7300 7301
7303
7000
7311

7400
7401
7000
7411

9101

9102

9103

9200

9201

9201

9201

DISPLAY APPARATUS, DISPLAY MODULE, AND ELECTRONIC DEVICE WITH PIXEL SET INCLUDING FOUR PIXELS

BACKGROUND OF THE INVENTION

1. Field of the Invention

One embodiment of the present invention relates to a display apparatus, a display module, an electronic device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display apparatus, a light-emitting apparatus, a power storage device, a memory device, a method for driving any of them, and a method for manufacturing any of them.

2. Description of the Related Art

One example of known display apparatuses is disclosed in Patent Document 1, which includes a first quantum dot layer that converts a wavelength of light emitted from a first light-emitting element, a second quantum dot layer that converts a wavelength of light emitted from a second light-emitting element, and an optical reduction film that reduces external light entering the first quantum dot layer and the second quantum dot layer and where a blue subpixel is provided with neither a color filter nor a quantum dot layer.

REFERENCE

[Patent Document 1] Japanese Published Patent Application No. 2021-021875

SUMMARY OF THE INVENTION

An object of one embodiment of the present invention is to provide a novel display apparatus that is highly convenient, useful, or reliable. Another object is to provide a novel display module that is highly convenient, useful, or reliable. Another object of one embodiment of the present invention is to provide a novel electronic device that is highly convenient, useful, or reliable. Another object of one embodiment of the present invention is to provide a novel display apparatus, a novel display module, a novel electronic device, or a novel semiconductor device.

Note that the description of these objects does not preclude the existence of other objects. One embodiment of the present invention does not need to achieve all these objects. Other objects will be apparent from and can be derived from the description of the specification, the drawings, the claims, and the like.

(1) One embodiment of the present invention is a display apparatus including a set of pixels. The set of pixels includes a first pixel, a second pixel, a third pixel, and a fourth pixel.

The first pixel includes a first light-emitting device and a first layer. The first light-emitting device overlaps with the first layer. The first light-emitting device emits first light toward the first layer. An emission spectrum of the first light has an intensity in a blue-light wavelength range and an intensity in a green-light wavelength range. The first layer is configured to absorb the first light. The first layer contains a color conversion material that converts blue and green light into red light.

The second pixel includes a second light-emitting device and a second layer. The second light-emitting device overlaps with the second layer. The second light-emitting device emits second light toward the second layer. An emission spectrum of the second light is the same as the emission spectrum of the first light. The second layer is configured to transmit blue light.

The third pixel includes a third light-emitting device and a third layer. The third light-emitting device overlaps with the third layer. The third light-emitting device emits third light toward the third layer. An emission spectrum of the third light is the same as the emission spectrum of the first light. The third layer is configured to absorb blue light and transmit green light.

The fourth pixel includes a fourth light-emitting device and a fourth layer. The fourth light-emitting device overlaps with the fourth layer. The fourth light-emitting device emits fourth light toward the fourth layer. An emission spectrum of the fourth light is the same as the emission spectrum of the first light.

(2) Another embodiment of the present invention is the above display apparatus where the third layer contains a color conversion material that converts blue light into green light.

With such a structure, a full color image can be displayed using the first pixel, the second pixel, the third pixel, and the fourth pixel. Furthermore, the first light-emitting device, the second light-emitting device, the third light-emitting device, and the fourth light-emitting device can emit light with the same emission spectrum. Furthermore, structures of the first light-emitting device, the second light-emitting device, the third light-emitting device, and the fourth light-emitting device can be made the same as each other. Furthermore, the first light-emitting device, the second light-emitting device, the third light-emitting device, and the fourth light-emitting device can be formed in the same step. Furthermore, a process of manufacturing the display apparatus can be simplified. Furthermore, the human eye has higher visual sensitivity with respect to green light than that with respect to blue light with high color purity. Furthermore, a spectrum of blue light with high color purity has a narrow full width at half maximum, and a spectrum of light including blue and green light has a wide full width at half maximum. Furthermore, an emission spectrum of a light-emitting substance causing a large Stokes shift, for example, an emission spectrum of a phosphorescent substance, has a wide full width at half maximum. Furthermore, a phosphorescent substance has higher emission efficiency than a fluorescent substance. A light-emitting device emitting light including blue and green light has higher emission efficiency than a light-emitting device emitting blue light with high color purity. Furthermore, higher emission efficiency enables power consumption to be reduced. A light-emitting device emitting light including blue and green light has higher reliability than a light-emitting device emitting blue light with high color purity. In addition, the reliability can be increased. As a result, a novel display apparatus that is highly convenient, useful, or reliable can be provided.

(3) Another embodiment of the present invention is the above display apparatus where the fourth layer transmits the fourth light.

With such a structure of the fourth pixel, display can be performed using light including blue and green light. Furthermore, luminance of the second pixel and the third pixel can be suppressed with use of the fourth pixel. Furthermore, the fourth pixel can utilize light more efficiently than the second pixel and the third pixel. Furthermore, power consumption can be reduced. Furthermore, the reliability can be increased. As a result, a novel display apparatus that is highly convenient, useful, or reliable can be provided.

(4) Another embodiment of the present invention is the above display apparatus where the fourth layer is configured to transmit and absorb the fourth light and to convert the absorbed light into red light.

(5) Another embodiment of the present invention is the above display apparatus where the fourth layer contains a color conversion material that converts blue and green light into red light.

(6) Another embodiment of the present invention is the above display apparatus where the fourth layer contains a color conversion material that converts green light into red light.

(7) Another embodiment of the present invention is the above display apparatus where the fourth layer contains a color conversion material that converts blue light into red light and a color conversion material that converts green light into red light.

With such a structure of the fourth pixel, display can be performed using light including blue light, green light, and red light. Furthermore, luminance of the first pixel, the second pixel, and the third pixel can be suppressed with use of the fourth pixel. Furthermore, the reliability can be increased. As a result, a novel display apparatus that is highly convenient, useful, or reliable can be provided.

(8) One embodiment of the present invention is a display apparatus including a set of pixels. The set of pixels include a first pixel, a second pixel, a third pixel, and a fourth pixel.

The first pixel includes a first light-emitting device and a first layer. The first light-emitting device overlaps with the first layer. The first light-emitting device emits first light toward the first layer. An emission spectrum of the first light has an intensity in a blue-light wavelength range. The first layer is configured to absorb the first light. The first layer contains a color conversion material that converts blue light into red light.

The second pixel includes a second light-emitting device and a second layer. The second light-emitting device overlaps with the second layer. The second light-emitting device emits second light toward the second layer. An emission spectrum of the second light is the same as the emission spectrum of the first light. The second layer is configured to transmit blue light.

The third pixel includes a third light-emitting device and a third layer. The third light-emitting device overlaps with the third layer. The third light-emitting device emits third light toward the third layer. An emission spectrum of the third light is the same as the emission spectrum of the first light. The third layer is configured to absorb blue light. The third layer contains a color conversion material converting blue light into green light.

The fourth pixel includes a fourth light-emitting device and a fourth layer. The fourth light-emitting device overlaps with the fourth layer. The fourth light-emitting device emits fourth light toward the fourth layer. An emission spectrum of the fourth light is the same as the emission spectrum of the first light. The fourth layer is configured to transmit and absorb the fourth light and convert blue light into yellow light.

(9) Another embodiment of the present invention is the above display apparatus where the fourth layer contains a color conversion material that converts blue light into yellow light.

(10) Another embodiment of the present invention is the above display apparatus where the fourth layer contains a color conversion material that converts blue light into green light and a color conversion material that converts blue light into red light.

With such a structure, a full color image can be displayed using the first pixel, the second pixel, the third pixel, and the fourth pixel. Furthermore, the first light-emitting device, the second light-emitting device, the third light-emitting device, and the fourth light-emitting device can emit light with the same emission spectrum. Furthermore, structures of the first light-emitting device, the second light-emitting device, the third light-emitting device, and the fourth light-emitting device can be made the same as each other. Furthermore, the first light-emitting device, the second light-emitting device, the third light-emitting device, and the fourth light-emitting device can be formed in the same step. Furthermore, a process of manufacturing the display apparatus can be simplified. Furthermore, with the fourth pixel, display can be performed using light including blue light, green light, and red light. Furthermore, luminance of the first pixel, the second pixel, and the third pixel can be suppressed with use of the fourth pixel. Furthermore, the reliability can be increased. As a result, a novel display apparatus that is highly convenient, useful, or reliable can be provided.

(11) Another embodiment of the present invention is a display module including the display apparatus described in any of the above and at least one of a connector and an integrated circuit.

(12) Another embodiment of the present invention is an electronic device including the display apparatus described in any of the above and at least one of a battery, a camera, a speaker, and a microphone.

Although the block diagram in drawings attached to this specification shows components classified based on their functions in independent blocks, it is difficult to classify actual components based on their functions completely, and one component can have a plurality of functions.

Note that the light-emitting apparatus in this specification includes, in its category, an image display apparatus that uses a light-emitting device. The light-emitting apparatus may also include, in its category, a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

According to one embodiment of the present invention, a novel display apparatus that is highly convenient, useful, or reliable can be provided. Another embodiment of the present invention can provide a novel display module that is highly convenient, useful, or reliable. Another embodiment of the present invention can provide a novel electronic device that is highly convenient, useful, or reliable. Furthermore, a novel display apparatus can be provided. Furthermore, a novel display module can be provided. Furthermore, a novel electronic device can be provided.

Note that the description of these effects does not preclude the existence of other effects. One embodiment of the present invention does not necessarily have all these effects.

Other effects will be apparent from and can be derived from the description of the specification, the drawings, the claims, and the like.

DETAILED DESCRIPTION OF THE INVENTION

Figure 1A:
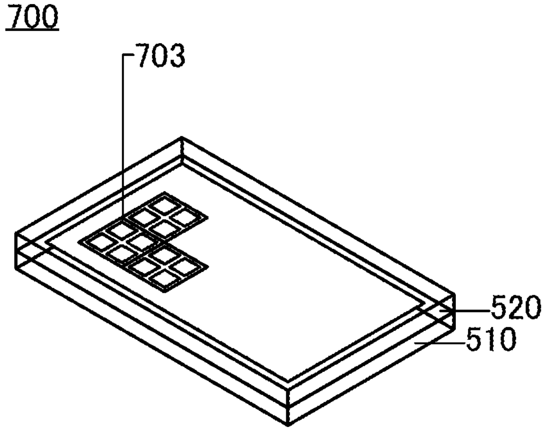
FIGS. 1A and 1B illustrate a structure of a display apparatus of an embodiment.

A display apparatus of one embodiment of the present invention includes a first pixel, a second pixel, a third pixel, and a fourth pixel. The first pixel includes a first light-emitting device and a first layer. The first light-emitting device emits first light toward the first layer. An emission spectrum of the first light has intensities in a blue-light wavelength range and a green-light wavelength range. The first layer contains a color conversion material that converts blue and green light into red light. The second pixel includes a second light-emitting device and a second layer. The second light-emitting device emits second light toward the second layer. An emission spectrum of the second light is the same as the emission spectrum of the first light. The second layer has a function of transmitting blue light. The third pixel includes a third light-emitting device and a third layer. The third light-emitting device emits third light toward the third layer. An emission spectrum of the third light is the same as the emission spectrum of the first light. The third layer has a function of absorbing blue light and transmitting green light. The fourth pixel includes a fourth light-emitting device and a fourth layer. The fourth light-emitting device emits fourth light toward the fourth layer. An emission spectrum of the fourth light is the same as the emission spectrum of the first light.

With such a structure, a full color image can be displayed using the first pixel, the second pixel, and the third pixel, and the fourth pixel. Furthermore, the first light-emitting device, the second light-emitting device, the third light-emitting device, and the fourth light-emitting device can emit light with the same emission spectrum. Furthermore, structures of the first light-emitting device, the second light-emitting device, the third light-emitting device, and the fourth light-emitting device can be made the same as each other. Furthermore, the first light-emitting device, the second light-emitting device, the third light-emitting device, and the fourth light-emitting device can be formed in the same step. Furthermore, a process of manufacturing the display apparatus can be simplified. Furthermore, the human eye has higher visual sensitivity with respect to green light than that with respect to blue light with high color purity. Furthermore, a spectrum representing blue light with high color purity has a narrow full width at half maximum, and a spectrum representing both blue and green light has a wide full width at half maximum. Furthermore, an emission spectrum of a light-emitting substance causing a large Stokes shift, e.g., an emission spectrum of a phosphorescent substance, has a wide full width at half maximum. Furthermore, a phosphorescent substance has higher emission efficiency than a fluorescent substance. A light-emitting device emitting light including blue and green light has higher emission efficiency than a light-emitting device emitting blue light with high color purity. Furthermore, higher emission efficiency enables power consumption to be reduced. A light-emitting device emitting light including blue and green light has higher reliability than a light-emitting device emitting blue light with high color purity. In addition, the reliability can be increased. As a result, a novel display apparatus that is highly convenient, useful, or reliable can be provided.

Embodiments will be described in detail with reference to the drawings. Note that the embodiments of the present invention are not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, a structure of a display apparatus of one embodiment of the present invention will be described with reference to FIGS. 1A and 1B and FIGS. 2A and 2B.

Figure 1B:
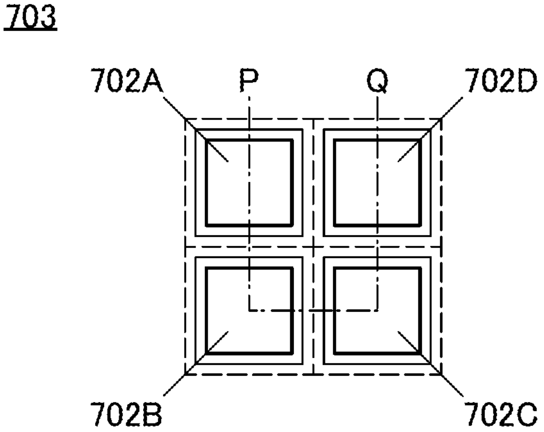

FIG. 1A is a perspective view illustrating a structure of the display apparatus of one embodiment of the present invention, and FIG. 1B is a front view illustrating part of the structure of the display apparatus of one embodiment of the present invention.

Figure 2A:
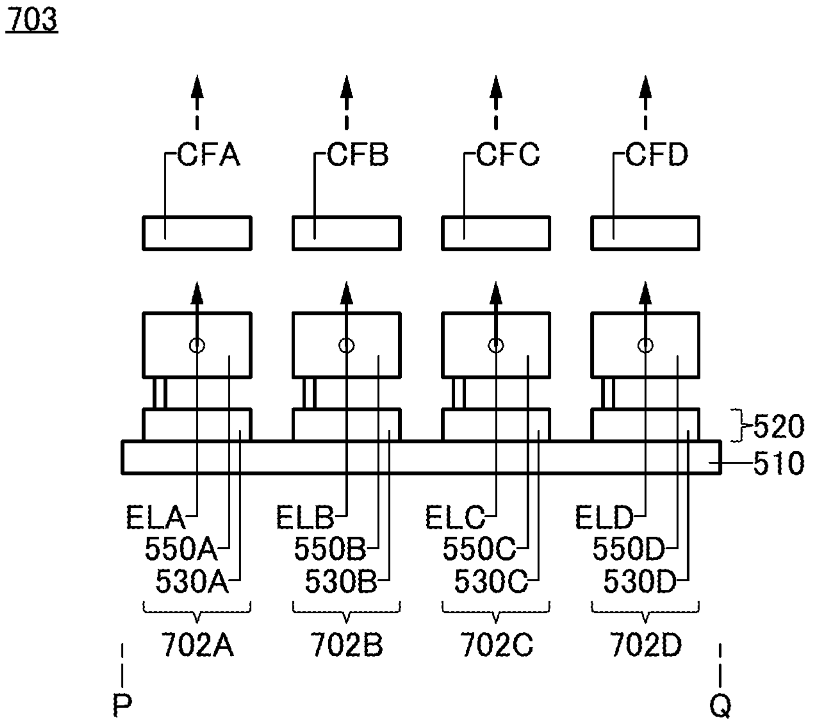
FIGS. 2A and 2B each illustrate a structure of a display apparatus of an embodiment.
Figure 2B:
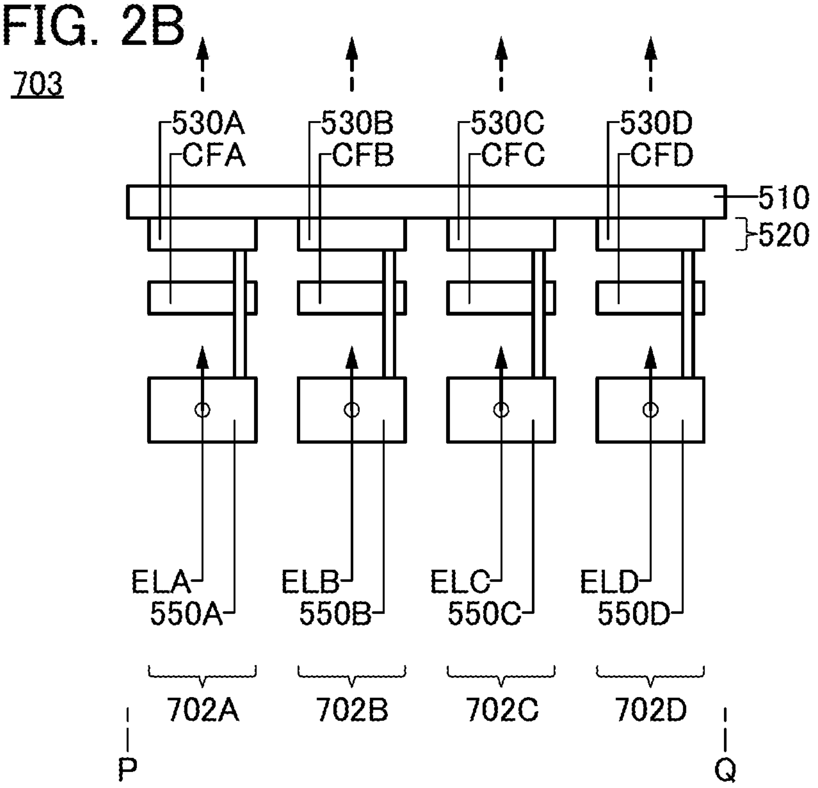

FIG. 2A is a cross-sectional view taken along line P-Q in FIG. 1B. FIG. 2B is a cross-sectional view illustrating a structure different from that in FIG. 2A.

Structure Example 1 of Display Apparatus 700

One embodiment of the present invention is a display apparatus 700 including a pixel 703 that is a set of pixels (see FIG. 1A). The pixel 703 (the set of pixels) is composed of a pixel 702A, a pixel 702B, a pixel 702C, and a pixel 702D (see FIG. 1B).

The display apparatus 700 includes a substrate 510 and a functional layer 520 (see FIG. 1A). The functional layer 520 overlaps with the substrate 510, and the functional layer 520 includes a pixel circuit 530A, a pixel circuit 530B, a pixel circuit 530C, and a pixel circuit 530D (see FIG. 2A).

Structure Example of Pixel 702A

The pixel 702A includes a light-emitting device 550A and a layer CFA, and the light-emitting device 550A overlaps with the layer CFA (see FIG. 2A). The pixel 702A also includes the pixel circuit 530A, and the pixel circuit 530A is electrically connected to the light-emitting device 550A.

Structure Example of Light-Emitting Device 550A

The light-emitting device 550A emits light ELA toward the layer CFA, and an emission spectrum of the light ELA shows blue and green light. In other words, the emission spectrum of the light ELA have intensities in a blue-light wavelength range and a green-light wavelength range. Note that in this specification, blue light includes light whose wavelength is greater than or equal to 430 nm and less than 490 nm, green light includes light whose wavelength is greater than or equal to 490 nm and less than 550 nm, and red light includes light whose wavelength is greater than or equal to 640 nm and less than 770 nm.

For example, an organic EL element can be used as the light-emitting device 550A. Alternatively, an inorganic LED can be used as the light-emitting device 550A.

For example, a light-emitting device containing a first light-emitting material having a blue-light emission spectrum and a second light-emitting material having a green-light emission spectrum can be used as the light-emitting device 550A. Alternatively, a single light-emitting material having a broad emission spectrum with blue and green light can be used for the light-emitting device 550A. The light-emitting material(s) whose emission spectrum shows blue and green light has higher emission efficiency than a light-emitting material of blue light with high color purity. The use of a material with high emission efficiency enables power consumption of the light-emitting device to be reduced.

An example of a structure of a light-emitting device applicable to the light-emitting device 550A will be described in detail in Embodiments 2 to 6.

Structure Example of Layer CFA

The layer CFA has a function of absorbing the light ELA. The layer CFA contains a color conversion material that converts blue and green light into red light.

Figure 3A:
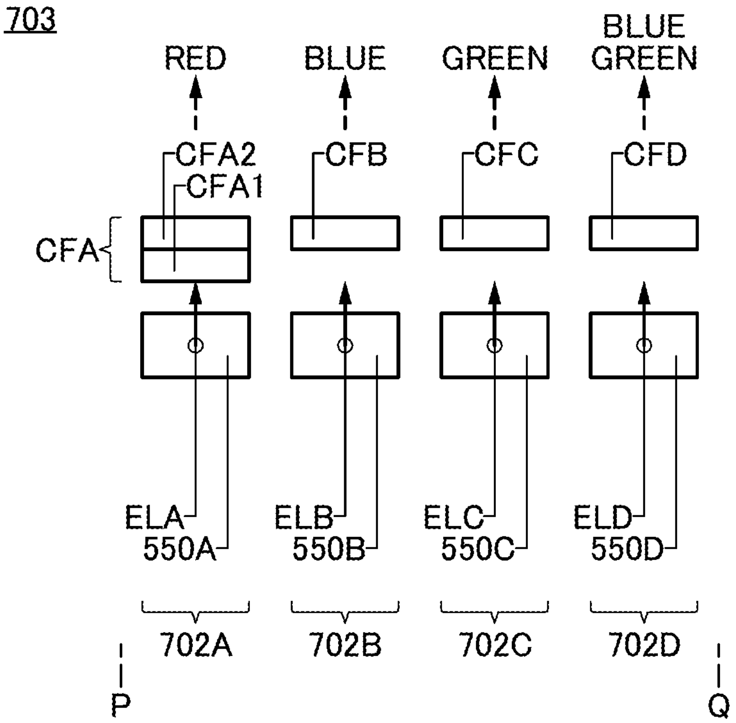
FIGS. 3A and 3B each illustrate a structure of a display apparatus of an embodiment.

For example, the layer CFA can have a structure in which a plurality of films are stacked (see FIG. 3A). Specifically, a structure in which a layer CFA1 and a layer CFA2 are stacked can be used as the layer CFA.

A color conversion material that converts a color of light emitted by a light-emitting device can be used for the layer CFA1. Furthermore, a coloring material that absorbs light emitted by the light-emitting device can be used for the layer CFA2. Accordingly, the layer CFA1 can efficiently convert a color of light emitted by the light-emitting device. The layer CFA2 can absorb light of the light-emitting device, which has passed through the layer CFA1, i.e., light of a color that has not been converted by the layer CFA1. In addition, the layer CFA2 can absorb external light and decrease the intensity of external light reaching the layer CFA1 through the layer CFA2.

As the color conversion material, a phosphor can be used for the layer CFA, for example. Specifically, a quantum dot (QD) can be used for the layer CFA. The quantum dot has an emission spectrum with a narrow peak. Accordingly, light emission with high color purity can be obtained. Moreover, the light ELA can be converted into red light with high color purity.

For example, the layer CFA can use a coloring material that absorbs light whose wavelength is less than 640 nm and transmits light whose wavelength is greater than or equal to 640 nm and less than 770 nm. Specifically, a coloring material for a color filter can be used for the layer CFA. Thus, red light RED with high color purity can be extracted. The pixel 702A can be used to display a red color.

Structure Example of Pixel 702B

The pixel 702B includes a light-emitting device 550B and a layer CFB, and the light-emitting device 550B overlaps with the layer CFB (see FIG. 2A). The pixel 702B also includes the pixel circuit 530B, and the pixel circuit 530B is electrically connected to the light-emitting device 550B.

Structure Example of Light-Emitting Device 550B

The light-emitting device 550B emits light ELB toward the layer CFB, and an emission spectrum of the light ELB is the same as that of the light ELA. For example, the light-emitting device 550B can employ the same structure as the light-emitting device 550A.

Structure Example of Layer CFB

The layer CFB has a function of transmitting blue light and absorbing green light (see FIG. 3A). For example, the layer CFB can use a coloring material that transmits light whose wavelength is less than 490 nm and absorbs light whose wavelength is greater than or equal to 490 nm. Specifically, a coloring material for a color filter can be used for the layer CFB. Accordingly, blue light BLUE with high color purity can be extracted. The pixel 702B can be used to display a blue color.

Structure Example of Pixel 702C

The pixel 702C includes a light-emitting device 550C and a layer CFC, and the light-emitting device 550C overlaps with the layer CFC (see FIG. 2A). The pixel 702C also includes the pixel circuit 530C, and the pixel circuit 530C is electrically connected to the light-emitting device 550C.

Structure Example of Light-Emitting Device 550C

The light-emitting device 550C emits light ELC toward the layer CFC, and an emission spectrum of the light ELC is the same as that of the light ELA. For example, the light-emitting device 550C can employ the same structure as the light-emitting device 550A.

Structure Example 1 of Layer CFC

The layer CFC has a function of absorbing blue light and transmitting green light (see FIG. 3A). For example, the layer CFC can use a coloring material that absorbs light whose wavelength is less than 490 nm and transmits light whose wavelength is greater than or equal to 490 nm and less than 550 nm. Specifically, a coloring material for a color filter can be used for the layer CFC. Accordingly, green light GREEN with high color purity can be extracted. The pixel 702C can be used to display a green color.

Structure Example 2 of Layer CFC

Alternatively, the layer CFC can use a color conversion material that converts blue light into green light.

Figure 3B:
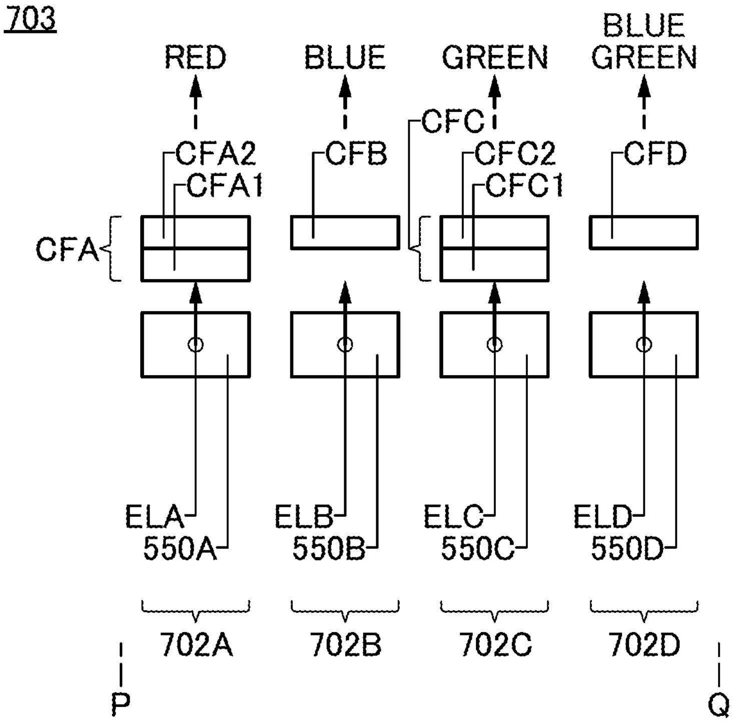

For example, the layer CFC can have a structure in which a plurality of films are stacked (see FIG. 3B). Specifically, a structure in which a layer CFC1 and a layer CFC2 are stacked can be used as the layer CFC.

A color conversion material that converts a color of light emitted by a light-emitting device can be used for the layer CFC1. Furthermore, a coloring material that absorbs light emitted by the light-emitting device can be used for the layer CFC2. Accordingly, the layer CFC1 can efficiently convert a color of light emitted by the light-emitting device. The layer CFC2 can absorb light of the light-emitting device, which has passed through the layer CFC1, i.e., light of a color that has not been converted by the layer CFC1. In addition, the layer CFC2 can absorb external light and decrease the intensity of external light reaching the layer CFC1 through the layer CFC2.

As the color conversion material, a phosphor can be used for the layer CFC. Specifically, a quantum dot can be used for the layer CFC. Accordingly, the light ELC can be converted into the green light GREEN with high color purity.

Structure Example of Pixel 702D

The pixel 702D includes a light-emitting device 550D and a layer CFD, and the light-emitting device 550D overlaps with the layer CFD (see FIG. 2A). The pixel 702D also includes the pixel circuit 530D, and the pixel circuit 530D is electrically connected to the light-emitting device 550D.

Structure Example of Light-Emitting Device 550D

The light-emitting device 550D emits light ELD toward the layer CFD, and an emission spectrum of the light ELD is the same as that of the light ELA. For example, the light-emitting device 550D can employ the same structure as the light-emitting device 550A.

Accordingly, with use of the pixel 702A, the pixel 702B, the pixel 702C, and the pixel 702D, a full color image can be displayed. Furthermore, the light-emitting device 550A, the light-emitting device 550B, the light-emitting device 550C, and the light-emitting device 550D can emit light with the same emission spectrum. Furthermore, the light-emitting device 550A, the light-emitting device 550B, the light-emitting device 550C, and the light-emitting device 550D can have the same structure. Furthermore, the light-emitting device 550A, the light-emitting device 550B, the light-emitting device 550C, and the light-emitting device 550D can be formed in the same step. Furthermore, a process of manufacturing the display apparatus can be simplified. Furthermore, the human eye has higher visual sensitivity with respect to green light than that with respect to blue light with high color purity. Furthermore, a spectrum representing blue light with high color purity has a narrow full width at half maximum, and a spectrum representing both blue and green light has a wide full width at half maximum. Furthermore, an emission spectrum of a light-emitting substance causing a large Stokes shift, e.g., an emission spectrum of a phosphorescent substance, has a wide full width at half maximum. Furthermore, a phosphorescent substance has higher emission efficiency than a fluorescent substance. A light-emitting device emitting light including blue and green light has higher emission efficiency than a light-emitting device emitting blue light with high color purity. Furthermore, higher emission efficiency enables power consumption to be reduced. A light-emitting device emitting light including blue and green light has higher reliability than a light-emitting device emitting blue light with high color purity. In addition, the reliability can be increased. As a result, a novel display apparatus that is highly convenient, useful, or reliable can be provided.

Structure Example 1 of Layer CFD

The layer CFD transmits the light ELD (see FIGS. 3A and 3B). Accordingly, the blue light BLUE and the green light GREEN can be used for display. The pixel 702D can be used to compensate for the luminance of the pixel 702B and the pixel 702C. Furthermore, the pixel 702D can be used to suppress the luminance of the pixel 702B and the pixel 702C.

Accordingly, the pixel 702D enables a color to be displayed with use of light including blue and green light. Furthermore, luminance of the pixel 702B and the pixel 702C can be suppressed with use of the pixel 702D. Furthermore, the pixel 702D can utilize light more efficiently than the pixel 702B and the pixel 702C. Furthermore, the power consumption can be reduced. Furthermore, the reliability can be increased. As a result, a novel display apparatus that is highly convenient, useful, or reliable can be provided.

Structure Example 2 of Layer CFD

Figure 4:
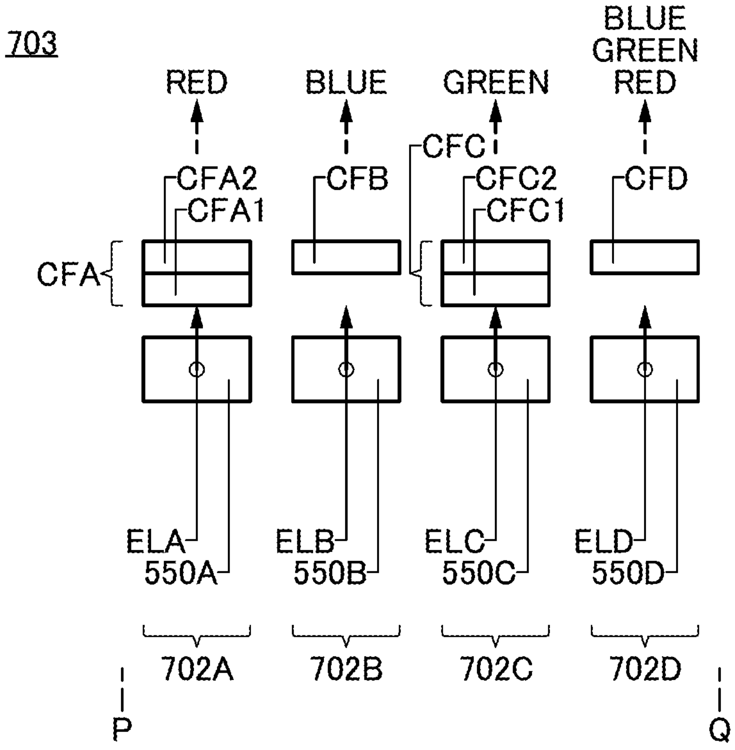
FIG. 4 illustrates a structure of a display apparatus of an embodiment.

The layer CFD transmits and absorbs the light ELD. Furthermore, the layer CFD has a function of converting absorbed light into red light (see FIG. 4). For example, a color conversion material can be used for the layer CFD. Accordingly, the blue light BLUE, the green light GREEN, and the red light RED can be used for display. Furthermore, the pixel 702D can be used to compensate for luminance of the other pixels. Moreover, the pixel 702D can be used to suppress luminance of the other pixels.

Structure Example 3 of Layer CFD

In particular, a color conversion material that converts blue and green light into red light can be used for the layer CFD. For example, a phosphor that converts blue and green light into red light can be used for the layer CFD. Specifically, a quantum dot can be used for the layer CFD.

Structure Example 4 of Layer CFD

Furthermore, a color conversion material that converts green light into red light can be used for the layer CFD. For example, a phosphor that converts green light selectively can be used for the layer CFD. Specifically, a quantum dot can be used for the layer CFD.

Structure Example 5 of Layer CFD

Furthermore, a color conversion material that converts blue light into red light and a conversion material that converts green light into red light can be used for the layer CFD. For example, two kinds of phosphors can be used for the layer CFD. Specifically, two kinds of quantum dots can be used for the layer CFD.

Accordingly, the pixel 702D enables a color to be displayed with use of light including blue light, green light, and red light. Furthermore, luminance of the pixel 702A, the pixel 702B, and the pixel 702C can be suppressed with use of the pixel 702D. Furthermore, the reliability can be increased. As a result, a novel display apparatus that is highly convenient, useful, or reliable can be provided.

Structure Example 2 of Display Apparatus 700

One embodiment of the present invention is a display apparatus including the pixel 703 that is a set of pixels (see FIG. 1A). The pixel 703 (the set of pixels) is composed of the pixel 702A, the pixel 702B, the pixel 702C, and the pixel 702D (see FIG. 1B).

The display apparatus 700 includes the substrate 510 and the functional layer 520 (see FIG. 1A). The functional layer 520 overlaps with the substrate 510, and the functional layer 520 includes the pixel circuit 530A, the pixel circuit 530B, the pixel circuit 530C, and the pixel circuit 530D (see FIG. 2A).

The structure described in <Structure example 2 of display apparatus 700> in one embodiment of the present invention is different from that in <Structure example 1 of display apparatus 700>. Specifically, the light-emitting device 550A, the light-emitting device 550B, the light-emitting device 550C, and the light-emitting device 550D each provide an emission spectrum showing a blue light (blue-light emission spectrum) instead of the emission spectrum showing blue and green light, which is a point of difference from <Structure example 1 of display apparatus 700>. Different parts will be described in detail below, and the above description is referred to for parts having the same structure as the above.

Structure Example of Pixel 702A

The pixel 702A includes the light-emitting device 550A and the layer CFA, and the light-emitting device 550A overlaps with the layer CFA (see FIG. 2A). The pixel 702A also includes the pixel circuit 530A, and the pixel circuit 530A is electrically connected to the light-emitting device 550A.

Structure Example of Light-Emitting Device 550A

The light-emitting device 550A emits the light ELA toward the layer CFA, and the light ELA is represented by a blue-light emission spectrum.

For example, an organic EL element can be used as the light-emitting device 550A. Alternatively, an inorganic LED can be used as the light-emitting device 550A.

For example, a light-emitting device containing a first light-emitting material having a blue-light emission spectrum can be used as the light-emitting device 550A.

An example of a structure of a light-emitting device applicable to the light-emitting device 550A will be described in detail in Embodiments 2 to 6.

Structure Example of Layer CFA

The layer CFA has a function of absorbing the light ELA. The layer CFA contains a color conversion material converting blue light into red light.

Figure 5A:
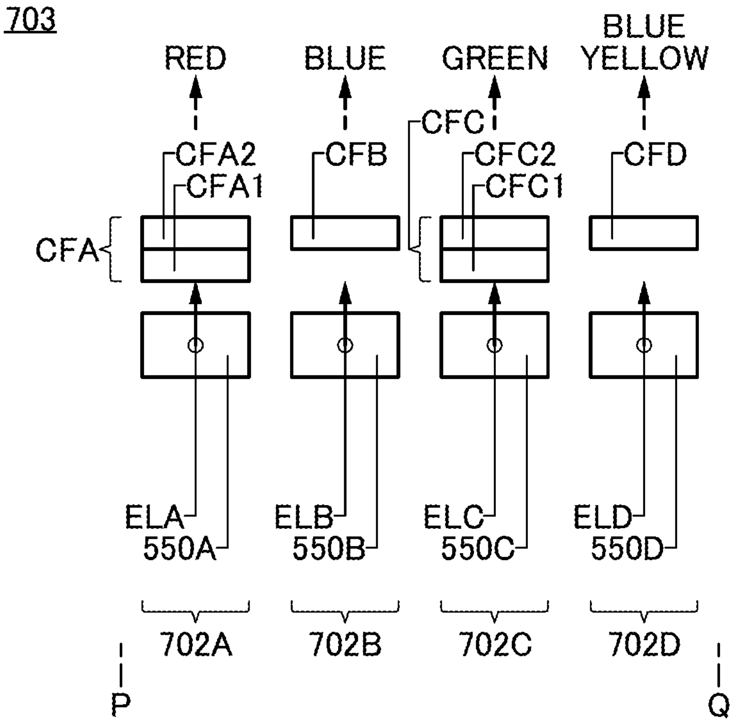
FIGS. 5A and 5B each illustrate a structure of a display apparatus of an embodiment.

For example, the layer CFA can have a structure in which a plurality of films are stacked (see FIG. 5A). Specifically, a structure in which the layer CFA1 and the layer CFA2 are stacked can be used as the layer CFA.

A color conversion material that converts a color of light emitted by a light-emitting device can be used for the layer CFA1. Furthermore, a coloring material that absorbs light emitted by the light-emitting device can be used for the layer CFA2. Accordingly, the layer CFA1 can efficiently convert a color of light emitted by the light-emitting device. The layer CFA2 can absorb light of the light-emitting device, which has passed through the layer CFA1, i.e., light of a color that has not been converted by the layer CFA1. In addition, the layer CFA2 can absorb external light and decrease the intensity of external light reaching the layer CFA1 through the layer CFA2.

As the color conversion material, a phosphor can be used for the layer CFA, for example. Specifically, a quantum dot can be used for the layer CFA. Accordingly, the light can be converted into red light with high color purity.

For example, the layer CFA can use a coloring material that absorbs light whose wavelength is less than 640 nm and transmits light whose wavelength is greater than or equal to 640 nm and less than 770 nm. Specifically, a coloring material for a color filter can be used for the layer CFA. Thus, red light RED with high color purity can be extracted. The pixel 702A can be used to display a red color.

Structure Example of Pixel 702B

The pixel 702B includes the light-emitting device 550B and the layer CFB, and the light-emitting device 550B overlaps with the layer CFB (see FIG. 2A). The pixel 702B also includes the pixel circuit 530B, and the pixel circuit 530B is electrically connected to the light-emitting device 550B.

Structure Example of Light-Emitting Device 550B

The light-emitting device 550B emits the light ELB toward the layer CFB, and an emission spectrum of the light ELB is the same as that of the light ELA (see FIG. 5A). For example, the light-emitting device 550B can employ the same structure as the light-emitting device 550A.

Structure Example of Layer CFB

The layer CFB has a function of transmitting blue light.

Structure Example of Pixel 702C

The pixel 702C includes the light-emitting device 550C and the layer CFC, and the light-emitting device 550C overlaps with the layer CFC (see FIG. 2A). The pixel 702C also includes the pixel circuit 530C, and the pixel circuit 530C is electrically connected to the light-emitting device 550C.

Structure Example of Light-Emitting Device 550C

The light-emitting device 550C emits the light ELC toward the layer CFC, and an emission spectrum of the light ELC is the same as that of the light ELA (see FIG. 5A). For example, the light-emitting device 550C can employ the same structure as the light-emitting device 550A.

Structure Example of Layer CFC

The layer CFC contains a color conversion material converting blue light into green light. The layer CFC has a function of absorbing blue light.

Figure 5B:
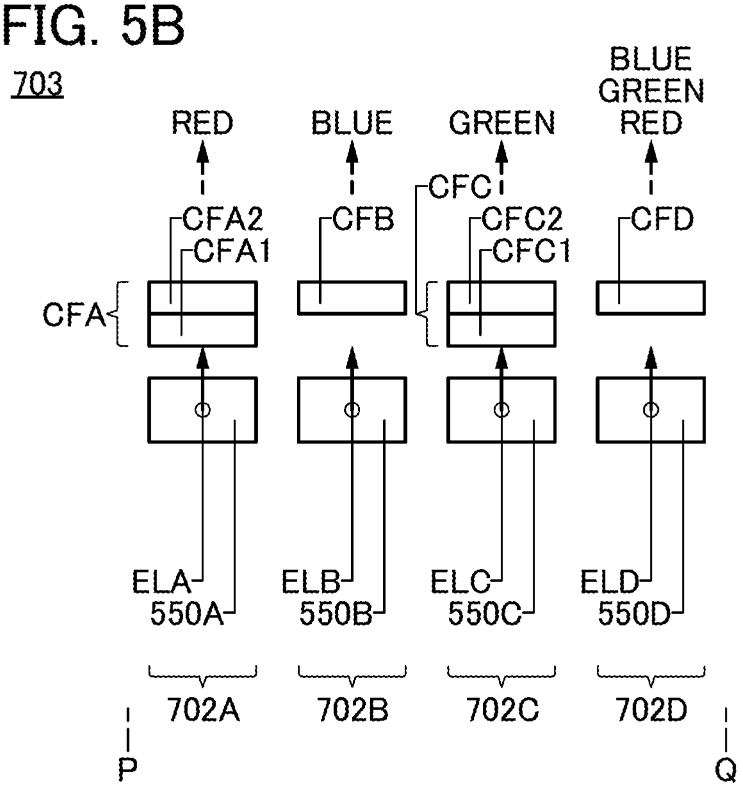

For example, the layer CFC can have a structure in which a plurality of films are stacked (see FIG. 5B). Specifically, a structure in which the layer CFC1 and the layer CFC2 are stacked can be used as the layer CFC.

A color conversion material that converts a color of light emitted by a light-emitting device can be used for the layer CFC1. Furthermore, a coloring material that absorbs light emitted by the light-emitting device can be used for the layer CFC2. Accordingly, the layer CFC1 can efficiently convert a color of light emitted by the light-emitting device. The layer CFC2 can absorb light of the light-emitting device, which has passed through the layer CFC1, i.e., light of a color that has not been converted by the layer CFC1. In addition, the layer CFC2 can absorb external light and decrease the intensity of external light reaching the layer CFC1 through the layer CFC2.

As the color conversion material, a phosphor can be used for the layer CFC, for example. Specifically, a quantum dot can be used for the layer CFC. Accordingly, the light can be converted into green light with high color purity.

Structure Example of Pixel 702D

The pixel 702D includes the light-emitting device 550D and the layer CFD, and the light-emitting device 550D overlaps with the layer CFD (see FIG. 2A). The pixel 702D also includes the pixel circuit 530D, and the pixel circuit 530D is electrically connected to the light-emitting device 550D.

Structure Example of Light-Emitting Device 550D

The light-emitting device 550D emits the light ELD toward the layer CFD, and an emission spectrum of the light ELD is the same as that of the light ELA (see FIG. 5A). For example, the light-emitting device 550D can employ the same structure as the light-emitting device 550A.

Structure Example 1 of Layer CFD

The layer CFD transmits and absorbs the light ELD. The layer CFD has a function of converting blue light into yellow light (see FIG. 5A).

The yellow light includes light whose wavelength is at least greater than or equal to 550 nm and less than 640 nm.

Structure Example 2 of Layer CFD

A color conversion material that converts blue light into yellow light can be used for the layer CFD. Accordingly, the blue light BLUE and the yellow light YELLOW can be used for display. Furthermore, the pixel 702D can be used to compensate for luminance of the other pixels. Moreover, the pixel 702D can be used to suppress luminance of the other pixels.

Structure Example 3 of Layer CFD

A color conversion material that converts blue light into green light and a color conversion material that converts blue light into red light can be used for the layer CFD (see FIG. 5B). Accordingly, the blue light BLUE, the green light GREEN, and the red light RED can be used for display. Furthermore, the pixel 702D can be used to compensate for luminance of the other pixels. Moreover, the pixel 702D can be used to suppress luminance of the other pixels.

Accordingly, with use of the pixel 702A, the pixel 702B, the pixel 702C, and the pixel 702D, a full color image can be displayed. Furthermore, the light-emitting device 550A, the light-emitting device 550B, the light-emitting device 550C, and the light-emitting device 550D can emit light with the same emission spectrum. Furthermore, the light-emitting device 550A, the light-emitting device 550B, the light-emitting device 550C, and the light-emitting device 550D can have the same structure. Furthermore, the light-emitting device 550A, the light-emitting device 550B, the light-emitting device 550C, and the light-emitting device 550D can be formed in the same step. Furthermore, a process of manufacturing the display apparatus can be simplified. Furthermore, the pixel 702D enables a color to be display with use of light including blue light, green light, and red light. Furthermore, luminance of the pixel 702A, the pixel 702B, and the pixel 702C can be suppressed with use of the pixel 702D. Furthermore, the reliability can be increased. As a result, a novel display apparatus that is highly convenient, useful, or reliable can be provided.

Structure Example 3 of Display Apparatus 700

Figure 6:
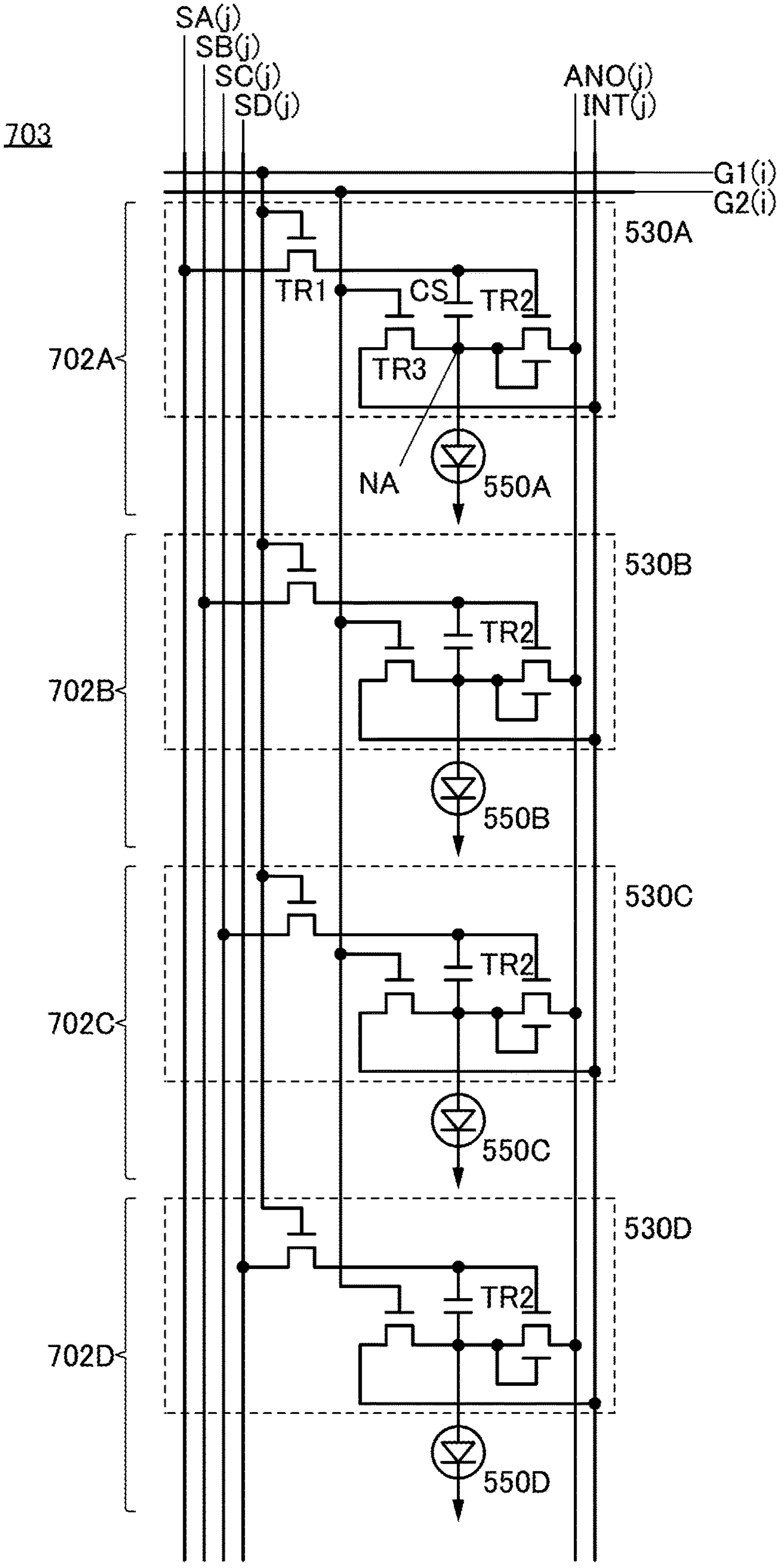
FIG. 6 is a circuit diagram illustrating a structure of a display apparatus of an embodiment.

One embodiment of the present invention is a display apparatus including the pixel 703 that is a set of pixels (see FIG. 6). The pixel 703 (the set of pixels) is composed of the pixel 702A, the pixel 702B, the pixel 702C, and the pixel 702D.

The display apparatus 700 includes the substrate 510 and the functional layer 520 (see FIG. 1A). The functional layer 520 overlaps with the substrate 510, and the functional layer 520 includes the pixel circuit 530A, the pixel circuit 530B, the pixel circuit 530C, and the pixel circuit 530D (see FIG. 2B).

Furthermore, the functional layer 520 includes a conductive film G1(i), a conductive film G2(i), a conductive film SA(j), a conductive film SB(j), a conductive film SC(j), a conductive film SD(j), a conductive film ANO(j), and a conductive film INT(j) (see FIG. 6).

Structure Example of Conductive Film

The conductive film G1(i) is electrically connected to the pixel circuit 530A, the pixel circuit 530B, the pixel circuit 530C, and the pixel circuit 530D and supplies a first control signal, for example.

The conductive film G2(i) is electrically connected to the pixel circuit 530A, the pixel circuit 530B, the pixel circuit 530C, and the pixel circuit 530D and supplies a second control signal, for example.

The conductive film SA(j) is electrically connected to the pixel circuit 530A and supplies a first image signal, for example.

The conductive film SB(j) is electrically connected to the pixel circuit 530B and supplies a second image signal, for example.

The conductive film SC(j) is electrically connected to the pixel circuit 530C and supplies a third image signal, for example.

The conductive film SD(j) is electrically connected to the pixel circuit 530A and supplies a fourth image signal, for example.

The conductive film INT(j) is electrically connected to the pixel circuit 530A, the pixel circuit 530B, the pixel circuit 530C, and the pixel circuit 530D and supplies a potential for initializing the pixel circuits, for example.

The conductive film ANO(j) is electrically connected to the pixel circuit 530A, the pixel circuit 530B, the pixel circuit 530C, and the pixel circuit 530D and supplies power for driving the light-emitting device, for example.

Structure Example 1 of Pixel Circuit

The pixel circuit 530A includes a transistor TR1, a transistor TR2, a transistor TR3, and a capacitor CS. The pixel circuit 530A also include a node NA, and the node NA is electrically connected to the light-emitting device 550A.

The transistor TR1 includes a gate electrode electrically connected to the conductive film G1(i), a first electrode electrically connected to the conductive film SA(j), and a second electrode.

The transistor TR2 includes a gate electrode electrically connected to the second electrode of the transistor TR1, a first electrode electrically connected to the conductive film ANO(j), and a second electrode electrically connected to the node NA.

The transistor TR3 includes a gate electrode electrically connected to the conductive film G2(i), a first electrode electrically connected to the conductive film INT(j), and a second electrode electrically connected to the node NA.

The capacitor CS includes a first conductive film electrically connected to the second electrode of the transistor TR1 and a second conductive film electrically connected to the node NA. The second conductive film overlaps with the first conductive film, and a dielectric is sandwiched between the second conductive film and the first conductive film.

At the node NA, the second electrode of the transistor TR2, the second electrode of the transistor TR3, and the second conductive film of the capacitor CS are electrically connected.

Structure Example 2 of Pixel Circuit

Each of the pixel circuit 530A, the pixel circuit 530B, the pixel circuit 530C, and the pixel circuit 530D includes the transistor TR2. The transistors TR2 in the above pixel circuits have the same size. The transistors TR2 in the above pixel circuits have the same channel width. Accordingly, the driving capability of the light-emitting device 550A, the light-emitting device 550B, the light-emitting device 550C, and the light-emitting device 550D can be the same. In addition, the capability of supplying current can be equivalent between the light-emitting device 550A, the light-emitting device 550B, the light-emitting device 550C, and the light-emitting device 550D.

Structure Example 3 of Pixel Circuit

Each of the pixel circuit 530A, the pixel circuit 530B, the pixel circuit 530C, and the pixel circuit 530D includes the transistor TR2. The transistor TR2 included in the pixel circuit 530D can be made smaller than the transistors TR2 included in the pixel circuit 530A, the pixel circuit 530B, or the pixel circuit 530C. Light emitted by the light-emitting device 550D is less likely to be absorbed by the layer CFD. Thus, luminance required for the light-emitting device 550D can be low. Even when a transistor with low driving capability is used as the transistor TR2, the required luminance can be obtained. Furthermore, even when a transistor with low driving capability is used as the transistor TR2, the required current can be supplied to the light-emitting device 550D.

Structure Example 4 of Display Apparatus 700

One embodiment of the present invention is a display apparatus including the pixel 703 that is a set of pixels (see FIG. 1A). The pixel 703 (the set of pixels) is composed of the pixel 702A, the pixel 702B, the pixel 702C, and the pixel 702D (see FIG. 1B).

The display apparatus 700 includes the substrate 510 and the functional layer 520 (see FIG. 1A). The functional layer 520 overlaps with the substrate 510, and the functional layer 520 includes the pixel circuit 530A, the pixel circuit 530B, the pixel circuit 530C, and the pixel circuit 530D (see FIG. 2B).

Note that the structure described in <Structure example 4 of display apparatus 700> of one embodiment of the present invention is different from that in <Structure example 1 of display apparatus 700> in the following points: the layer CFA is located between the light-emitting device 550A and the pixel circuit 530A; the layer CFB is located between the light-emitting device 550B and the pixel circuit 530B; the layer CFC is located between the light-emitting device 550C and the pixel circuit 530C; and the layer CFD is located between the light-emitting device 550D and the pixel circuit 530D. In other words, <Structure example 1 of display apparatus 700> shown with FIG. 2A is a top-emission display apparatus, and <Structure example 3 of display apparatus 700> shown with FIG. 2B is a bottom-emission display apparatus.

Note that this embodiment can be combined with any of the other embodiments in this specification as appropriate.

Embodiment 2

In this embodiment, a structure of a light-emitting device that can be used for a display apparatus of one embodiment of the present invention will be described with reference to FIGS. 7A and 7B.

Figure 7A:
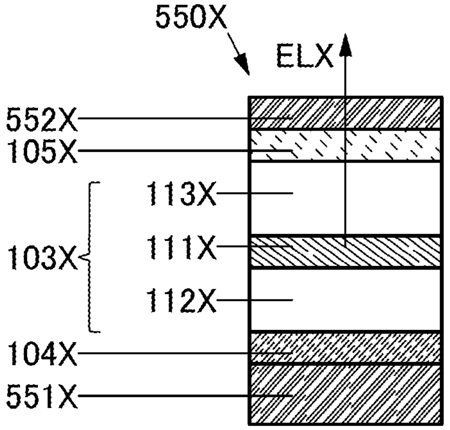
FIGS. 7A and 7B illustrate a structure of a light-emitting device of an embodiment.
Figure 7B:
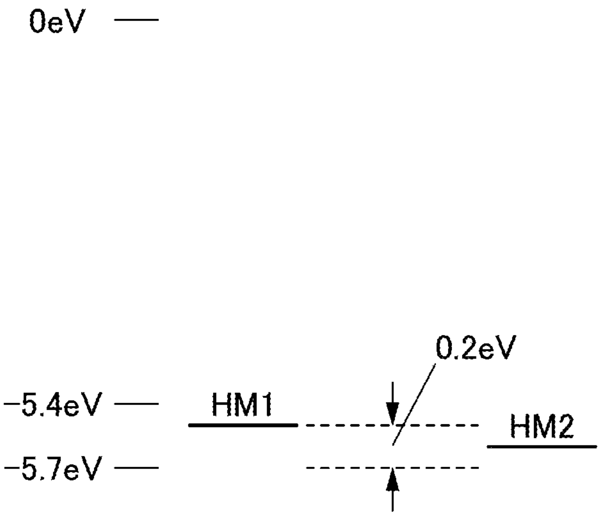

FIG. 7A is a cross-sectional view illustrating a structure of a light-emitting device of one embodiment of the present invention, and FIG. 7B is a diagram illustrating energy levels of materials used for the light-emitting device of one embodiment of the present invention.

A structure of a light-emitting device 550X described in this embodiment can be used for a display apparatus of one embodiment of the present invention. The description for the structure of the light-emitting device 550X can be applied for the light-emitting device 550A. Specifically, the description of the light-emitting device 550X can be used for the description of the light-emitting device 550A by replacing "X" in the reference numerals of the components of the light-emitting device 550X with "A". Similarly, the description of the light-emitting device 550X can be used for the description of the light-emitting device 550B, the light-emitting device 550C, or the light-emitting device 550D by replacing "X" in the reference numerals of the components of the components of the light-emitting device 550X with "B", "C", or "D".

Structure Example of Light-Emitting Device 550X

The light-emitting device 550X described in this embodiment includes an electrode 551X, an electrode 552X, and a unit 103X. The electrode 552X overlaps with the electrode 551X, and the unit 103X is located between the electrode 552X and the electrode 551X.

Structure Example of Unit 103X

The unit 103X has a single-layer structure or a stacked-layer structure. The unit 103X includes a layer 111X, the layer 112X, and a layer 113X, for example (see FIG. 7A). The unit 103X has a function of emitting light ELX.

The layer 111X is located between the layer 113X and the layer 112X, the layer 113X is located between the electrode 552X and the layer 111X, and the layer 112X is located between the layer 111X and the electrode 551X.

For example, a layer selected from functional layers such as a light-emitting layer, a hole-transport layer, an electron-transport layer, and a carrier-blocking layer can be used for the unit 103X. A layer selected from functional layers such as a hole-injection layer, an electron-injection layer, an exciton-blocking layer, and a charge-generation layer can also be used for the unit 103X.

Structure Example of Layer 112X

A hole-transport material can be used for the layer 112X, for example. The layer 112X can be referred to as a hole-transport layer. A material having a wider bandgap than the light-emitting material contained in the layer 111X is preferably used for the layer 112X. In that case, transfer of energy from excitons generated in the layer 111X to the layer 112X can be inhibited.

[Hole-Transport Material]

A material having a hole mobility of $1\times10^{-6}$ $cm^2/Vs$ or higher can be suitably used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

The following are examples that can be used as a compound having an aromatic amine skeleton: 4,4'-bis[N-(1-naphthyl)-N-phenylamino]biphenyl (abbreviation: NPB), N,N-diphenyl-N,N-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF).

As a compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP) can be used.

As a compound having a thiophene skeleton, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV) can be used, for example.

As a compound having a furan skeleton, 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be used, for example.

Structure Example of Layer 113X

An electron-transport material, a material having an anthracene skeleton, and a mixed material can be used for the layer 113X, for example. The layer 113X can be referred to as an electron-transport layer. A material having a wider bandgap than the light-emitting material contained in the layer 111X is preferably used for the layer 113X. In that case, energy transfer from excitons generated in the layer 111X to the layer 113X can be inhibited.

[Electron-Transport Material]

A material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material, for example. In this case, the electron-transport property in the electron-transport layer can be suppressed. The amount of electrons injected into the light-emitting layer can be controlled. The light-emitting layer can be prevented from having excess electrons.

For example, a metal complex or an organic compound having a π-electron deficient heteroaromatic ring skeleton can be used as the electron-transport material.

As a metal complex, bis(10-hydroxybenzo[h]quinolinato)beryllium(II) (abbreviation: $BeBq_2$), bis(2-methyl-8-quinolinolato)(4-phenylphenolato)aluminum(III) (abbreviation: BAlq), bis(8-quinolinolato)zinc(II) (abbreviation: Znq), bis

[2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As an organic compound having a π-electron deficient heteroaromatic ring skeleton, a heterocyclic compound having a polyazole skeleton, a heterocyclic compound having a diazine skeleton, a heterocyclic compound having a pyridine skeleton, or a heterocyclic compound having a triazine skeleton can be used, for example. In particular, the heterocyclic compound having a diazine skeleton or the heterocyclic compound having a pyridine skeleton has favorable reliability and thus are preferable. In addition, the heterocyclic compound having a diazine (pyrimidine or pyrazine) skeleton has a high electron-transport property to contribute to a reduction in driving voltage.

As a heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II) can be used, for example.

As a heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[fh]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn) can be used, for example.

As a heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As a heterocyclic compound having a triazine skeleton, 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02) can be used, for example.

[Material Having Anthracene Skeleton]

An organic compound having an anthracene skeleton can be used for the layer 113X. In particular, an organic compound having both an anthracene skeleton and a heterocyclic skeleton can be suitably used.

For example, an organic compound having both an anthracene skeleton and a nitrogen-containing five-membered ring skeleton can be used for the layer 113X. Alternatively, an organic compound having both an anthracene skeleton and a nitrogen-containing five-membered ring skeleton where two heteroatoms are included in a ring can be used for the layer 113X. Specifically, a pyrazole ring, an imidazole ring, an oxazole ring, a thiazole ring, or the like can be suitably used as the heterocyclic skeleton.

For example, an organic compound having both an anthracene skeleton and a nitrogen-containing six-membered ring skeleton can be used for the layer 113X. Alternatively, an organic compound having both an anthracene skeleton and a nitrogen-containing six-membered ring skeleton where two heteroatoms are included in a ring can be used for the layer 113X. Specifically, a pyrazine ring, a pyrimidine ring, a pyridazine ring, or the like can be suitably used as the heterocyclic skeleton.

Structure Example of Mixed Material

A material in which a plurality of kinds of substances are mixed can be used for the layer 113X. Specifically, a mixed material which contains an alkali metal, an alkali metal compound, or an alkali metal complex and an electron-transport substance can be used for the layer 113X. Note that the electron-transport material preferably has a HOMO level of −6.0 eV or higher.

The mixed material can be suitably used for the layer 113X in combination with a structure using a composite material, which is separately described, for a layer 104X. For example, a composite material of an electron-accepting substance and a hole-transport material can be used for the layer 104X. Specifically, a composite material of an electron-accepting substance and a substance having a relatively deep HOMO level HM1, which is higher than or equal to −5.7 eV and lower than or equal to −5.4 eV, can be used for the layer 104X (see FIG. 7B). Using the mixed material for the layer 113X in combination with the structure using such a composite material for the layer 104X leads to an increase in the reliability of the light-emitting device.

Furthermore, a structure using a hole-transport material for the layer 112X is preferably combined with the structure using the mixed material for the layer 113X and the composite material for the layer 104X. For example, a substance having a HOMO level HM2, which differs by −0.2 eV to 0 eV from the relatively deep HOMO level HM1, can be used for the layer 112X (see FIG. 7B). This leads to an increase in the reliability of the light-emitting device. Note that in this specification and the like, the structure of the above-described light-emitting device may be referred to as a Recombination-Site Tailoring Injection structure (ReSTI structure).

The concentration of the alkali metal, the alkali metal compound, or the alkali metal complex preferably changes in the thickness direction of the layer 113X (including the case where the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

Structure Example 1 of Layer 111X

Either a structure containing a light-emitting material or a structure containing a light-emitting material and a host material can be employed for the layer 111X, for example. The layer 111X can be referred to as a light-emitting layer. The layer 111X is preferably provided in a region where holes and electrons are recombined. This allows efficient conversion of energy generated by recombination of carriers into light and emission of the light.

Furthermore, the layer 111X is preferably provided apart from a metal used for the electrode or the like. In that case, a quenching phenomenon caused by the metal used for the electrode or the like can be inhibited.

It is preferable that a distance from an electrode or the like having reflectivity to the layer 111X be adjusted and the layer 111X be placed in an appropriate position in accordance with an emission wavelength. With this structure, the amplitude can be increased by utilizing an interference phenomenon between light reflected by the electrode or the like and light emitted from the layer 111X. Light with a predetermined wavelength can be intensified and the spectrum of the light can be narrowed. In addition, bright light emission colors with high intensity can be obtained. In other words, the layer 111X is placed in an appropriate position, for example, between electrodes and the like, and thus a microcavity structure can be formed.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as light ELX from the light-emitting material (see FIG. 7A).

For example, a material that emits blue and green light can be used for the layer 111X. Alternatively, the layer 111X can be a layer in which a layer containing a material that emits blue light and a layer containing a material that emits green light are stacked.

The material emitting blue light has an emission spectrum whose emission intensity peak is positioned in a region of a wavelength greater than or equal to 430 nm and less than 490 nm. The material emitting green light has an emission spectrum whose emission intensity peak is positioned in a region of a wavelength greater than or equal to 490 nm and less than 550 nm.

[Fluorescent Substance]

A fluorescent substance can be used for the layer 111X. For example, the following fluorescent substances can be used for the layer 111X. Note that fluorescent substances that can be used for the layer 111X are not limited to the following, and a variety of known fluorescent substances can be used.

Specifically, any of the following fluorescent substances can be used: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N'-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)tri phenyl amine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N"-(2-tert-butylanthracene-9,10-diyldi-4,1-phenylene)bis(N,N',N'-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N,N-(pyrene-1,6-diyl)bis[(6,N-diphenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), 3,10-bis[N-(dibenzofuran-3-yl)-N-phenylamino]naphtho[2,3-b;6,7-b']bisbenzofuran (abbreviation: 3,10FrA2Nbf(IV)-02), and the like.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

Other examples of fluorescent substances include N-[4-(9,10-diphenyl-2-anthryl)phenyl]-N,N,N-triphenyl-1,4-phenylenedi amine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenedi amine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), coumarin 545T, N,N'-diphenylquinacridone (abbreviation: DPQd), rubrene, and 5,12-bis(1,1'-biphenyl-4-yl)-6,11-diphenyltetracene (abbreviation: BPT).

Other examples of fluorescent substances include 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[4]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

[Phosphorescent Substance]

A phosphorescent substance can be used for the layer 111X. For example, phosphorescent substances described below as examples can be used for the layer 111X. Note that phosphorescent substances that can be used for the layer 111X are not limited to the following, and a variety of known phosphorescent substances can be used for the layer 111X.

For example, any of the following can be used for the layer 111X: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: $[Ir(mpptz\text{-}dmp)_3]$), tris(5-methyl-3,4-diphenyl-4H-1,2,4-triazolato)iridium(III) (abbreviation: $[Ir(Mptz)_3]$), tris[4-(3-biphenyl)-5-isopropyl-3-phenyl-4H-1,2,4-triazolato]iridium(III) (abbreviation: $[Ir(iPrptz\text{-}3b)_3]$), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: $[Ir(Mptz1\text{-}mp)_3]$), tris(1-methyl-5-phenyl-3-propyl-1H-1,2,4-triazolato]iridium(III) (abbreviation: $[Ir(Prptz1\text{-}Me)_3]$), or the like can be used.

As an organometallic iridium complex having an imidazole skeleton or the like, fac-tris[1-(2,6-diisopropylphenyl)-2-phenyl-1H-imidazole]iridium(III) (abbreviation: $[Ir(iPrpim)_3]$), tris[3-(2,6-dimethylphenyl)-7-methylimidazo[1,2-f]phenanthridinato]iridium(III) (abbreviation: $[Ir(dmpimpt\text{-}Me)_3]$), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $Ir(CF_3ppy)_2(pic)$), bis[2-(4',6'-difluorophenyl)pyridinato-N,$C^{2'}$]iridium(III) acetylacetonate (abbreviation: FIracac), or the like can be used.

[Phosphorescent Substance (Green)]

As an organometallic iridium complex having a pyrimidine skeleton or the like, tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetyl acetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetyl acetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), (acetyl acetonato)bis(4,6-diphenylpyrimidinato)iridium(III) (abbreviation: $[Ir(dppm)_2(acac)]$), or the like can be used.

As an organometallic iridium complex having a pyrazine skeleton or the like, (acetyl acetonato)bis(3,5-dimethyl-2-phenylpyrazinato)iridium(III) (abbreviation: $[Ir(mppr\text{-}Me)_2(acac)]$), (acetyl acetonato)bis(5-isopropyl-3-methyl-2-phenylpyrazinato)iridium(III) (abbreviation: $[Ir(mppr\text{-}iPr)_2(acac)]$), or the like can be used.

As an organometallic iridium complex having a pyridine skeleton or the like, tris(2-phenylpyridinato-N,$C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetyl acetonate (abbreviation: $[Ir(pq)_2(acac)]$), [2-$d_3$-methyl-8-(2-pyridinyl-κN)benzofuro[2,3-b]pyridine-κC]bis[2-(5-d3-methyl-2-pyridinyl-κN2)phenyl-κC]iridium(III) (abbreviation: $[Ir(5mppy\text{-}d3)_2(mbfpypy\text{-}d3)]$), [2-$d_3$-methyl-(2-pyridinyl-κN)benzofuro[2,3-b]pyridine-κC]bis[2-(2-pyridinyl-κN)phenyl-κC]iridium(III) (abbreviation: $[Ir(ppy)_2(mbfpypy\text{-}d3)]$), or the like can be used.

Examples of a rare earth metal complex are tris(acetylacetonato) (monophenanthroline)terbium(III) (abbreviation: $Tb(acac)_3(Phen)$), and the like.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: $[Ir(5mdppm)_2(dibm)]$), bis[4,6-bis(3-methylphenyl)pyrimidinato](dipivaloylmethanato)iridium(III) (abbreviation: $[Ir(5mdppm)_2(dpm)]$), bis[4,6-di(naphthalen-1-yl)pyrimidinato](dipivaloylmethanato)iridium(III) (abbreviation: $[Ir(d1npm)_2(dpm)]$), or the like can be used.

As an organometallic iridium complex having a pyrazine skeleton or the like, (acetylacetonato)bis(2,3,5-triphenylpyrazinato)iridium(III) (abbreviation: $[Ir(tppr)_2(acac)]$), bis(2,3,5-triphenylpyrazinato)(dipivaloylmethanato)iridium(III) (abbreviation: $[Ir(tppr)_2(dpm)]$), (acetylacetonato)bis[2,3-bis(4-fluorophenyl)quinoxalinato]iridium(III) (abbreviation: $[Ir(Fdpq)_2(acac)]$), or the like can be used.

As an organometallic iridium complex having a pyridine skeleton or the like, tris(1-phenylisoquinolinato-N,$C^{2'}$)iridium(III) (abbreviation: $[Ir(piq)_3]$), bis(1-phenylisoquinolinato-N,$C^{2'}$)iridium(III) acetylacetonate (abbreviation: $[Ir(piq)_2(acac)]$), or the like can be used.

As a rare earth metal complex or the like, tris(1,3-diphenyl-1,3-propanedionato)(monophenanthroline)europium(III) (abbreviation: $[Eu(DBM)_3(Phen)]$), tris[1-(2-thenoyl)-3,3,3-trifluoroacetonato](monophenanthroline)europium(III) (abbreviation: $[Eu(TTA)_3(Phen)]$), or the like can be used.

As a platinum complex or the like, 2,3,7,8,12,13,17,18-octaethyl-21H,23H-porphyrin platinum(II) (abbreviation: PtOEP) or the like can be used.

[Substance Exhibiting Thermally Activated Delayed Fluorescence (TADF Material)]

A TADF material can be used for the layer 111X. When a TADF material is used as the light-emitting substance, the S1 level of the host material is preferably higher than that of the TADF material. In addition, the T1 level of the host material is preferably higher than that of the TADF material.

For example, TADF materials described below as examples can be used as the light-emitting material. Note that without being limited thereto, a variety of known TADF materials can be used as the light-emitting material.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 77 K to 10 K) is used for an index of the T1 level. When the energy level of a wavelength where a line is extrapolated as a tangent to the fluorescent spectrum at a tail on the short wavelength side is the S1 level and the energy level of a wavelength where a line is extrapolated as a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can also be used for the TADF material.

Specifically, the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formula 1]

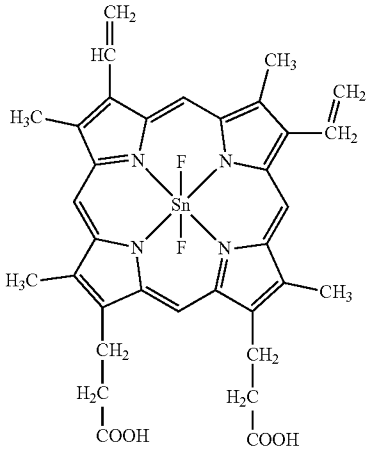

$SnF_2$(Proto IX)

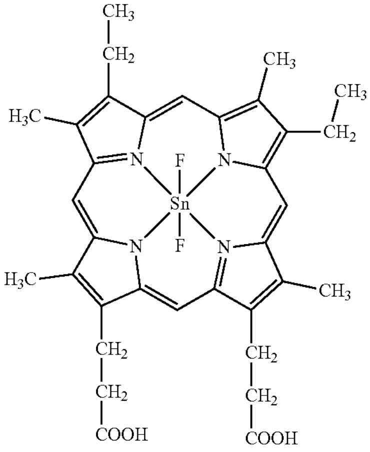

$SnF_2$(Meso IX)

-continued

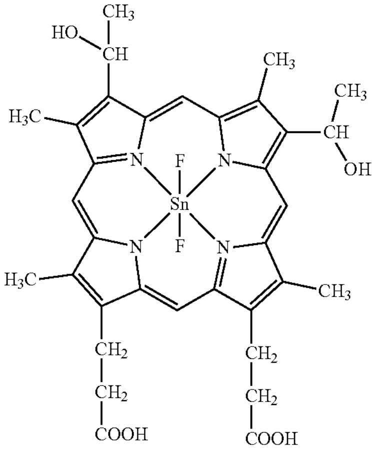

$SnF_2$(Hemato IX)

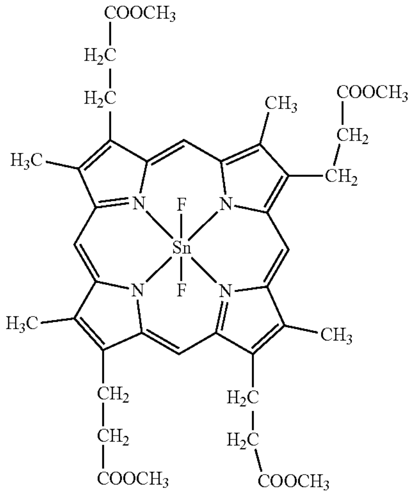

$SnF_2$(Copro III-4Me)

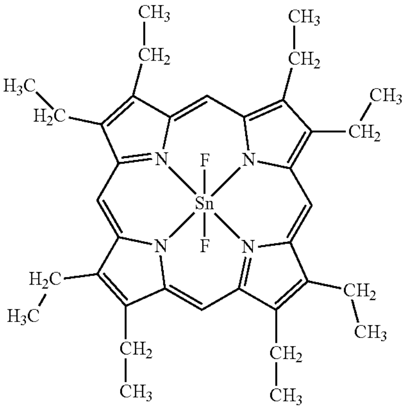

$SnF_2$(OEP)

-continued

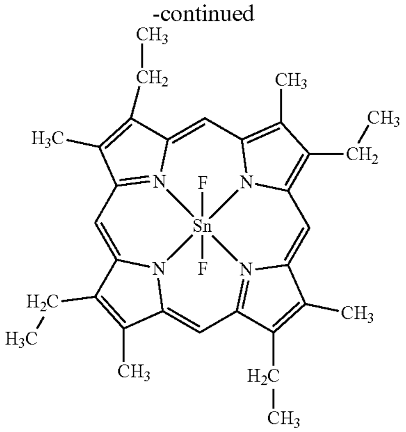

SnF2(Etio I)

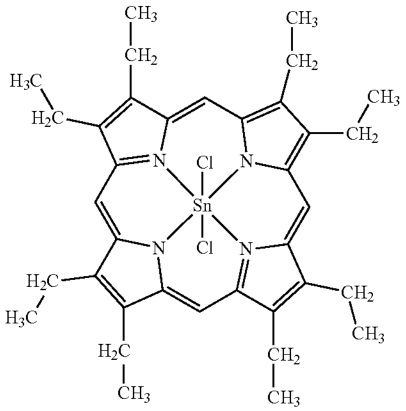

PtCl2OEP

Furthermore, a heterocyclic compound including one or both of a π-electron rich heteroaromatic ring and a π-electron deficient heteroaromatic ring can be used, for example, as the TADF material.

Specifically, the following compounds whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

[Chemical Formula 2]

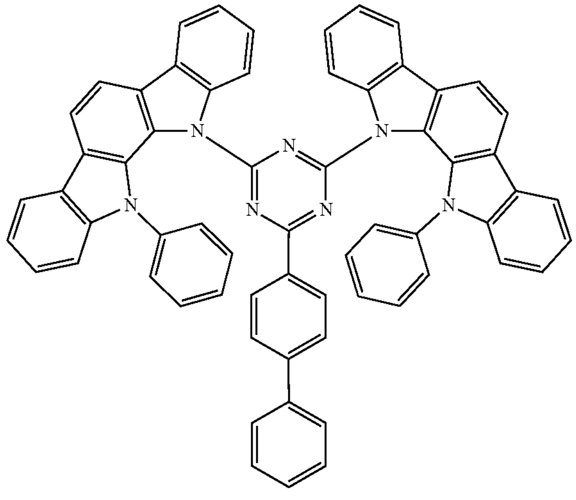

PIC-TRZ

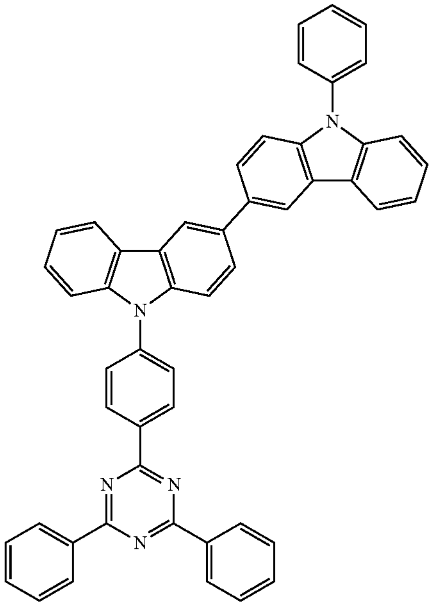

PCCzPTzn

-continued

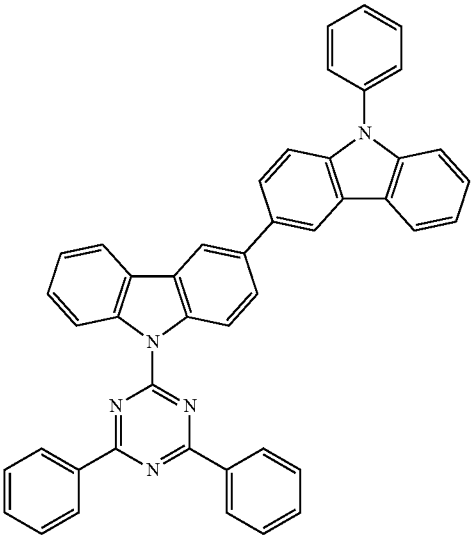

PCCzTzn

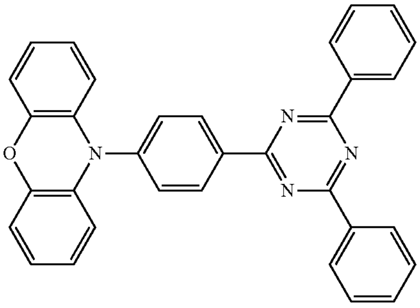

PXZ-TRZ

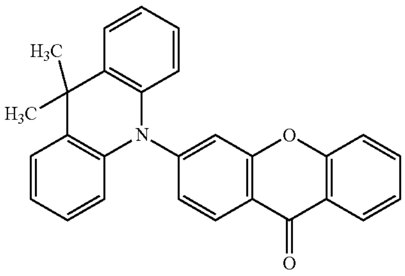

ACRXTN

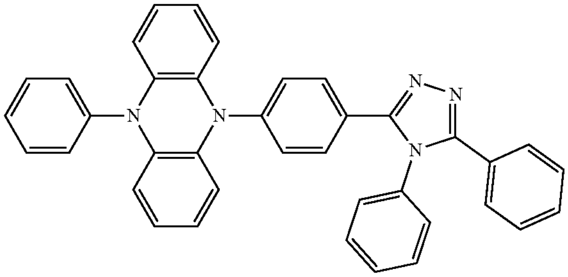

PPZ-3TPT

-continued

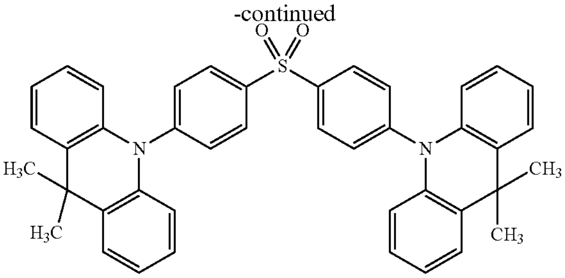

DMAC-DPS

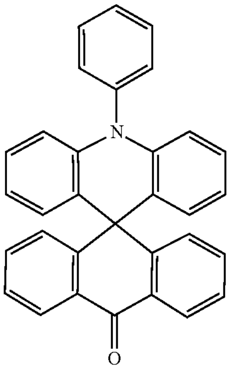

ACRSA

Such a heterocyclic compound is preferable because of its excellent electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high electron-accepting properties and high reliability.

Among skeletons including the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane and boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Structure Example 2 of Layer 111X

A carrier-transport material can be used as the host material. For example, a hole-transport material, an electron-transport material, a TADF material, a material having an anthracene skeleton, or a mixed material can be used as the host material. A material having a wider bandgap than the light-emitting material contained in the layer 111X is preferably used as the host material. Thus, transfer of energy from excitons generated in the layer 111X to the host material can be inhibited.

[Hole-Transport Material]

A material having a hole mobility of $1\times10^{-6}$ $cm^2/Vs$ or higher can be suitably used as the hole-transport material. For example, a hole-transport material that can be used for the layer 112X can be used for the layer 111X.

[Electron-Transport Material]

A metal complex or an organic compound having a π-electron deficient heteroaromatic ring skeleton can be used as the electron-transport material. For example, an electron-transport material that can be used for the layer 113X can be used for the layer 111X.

[Material Having Anthracene Skeleton]

An organic compound having an anthracene skeleton can be used as the host material. An organic compound having an anthracene skeleton is particularly preferable in the case where a fluorescent substance is used as a light-emitting substance. Thus, a light-emitting device with high emission efficiency and high durability can be obtained.

Among the organic compounds having an anthracene skeleton, an organic compound having a diphenylanthracene skeleton, in particular, a 9,10-diphenylanthracene skeleton, is chemically stable and thus is preferable. The host material preferably has a carbazole skeleton because the hole-injection and hole-transport properties are improved. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

Examples of the substances that can be used include 6-[3-(9,10-diphenyl-2-anthryl)phenyl]benzo[b]naphtho[1,2-d]furan (abbreviation: 2mBnfPPA), 9-phenyl-10-[4-(9-phenyl-9H-fluoren-9-yl)biphenyl-4'-yl]anthracene (abbreviation: FLPPA), 9-(1-naphthyl)-10-[4-(2-naphthyl)phenyl]anthracene (abbreviation: αN-βNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), and 3-[4-(1-naphthyl)-phenyl]-9-phenyl-9H-carbazole (abbreviation: PCPN).

In particular, CzPA, cgDBCzPA, 2mBnfPPA, and PCzPA have excellent characteristics.

[Substance Exhibiting Thermally Activated Delayed Fluorescence (TADF Material)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably includes a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. In particular, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

Structure Example 1 of Mixed Material

A material in which a plurality of kinds of substances are mixed can be used as the host material. For example, a material which includes an electron-transport material and a hole-transport material can be used as the mixed material. The weight ratio between the hole-transport material and the electron-transport material contained in the mixed material may be (the hole-transport material/the electron-transport material)=(1/19) or more and (19/1) or less. Accordingly, the carrier-transport property of the layer 111X can be easily adjusted. A recombination region can also be controlled easily.

Structure Example 2 of Mixed Material

A material mixed with a phosphorescent substance can be used as the host material. When a fluorescent substance is used as the light-emitting substance, a phosphorescent substance can be used as an energy donor for supplying excitation energy to the fluorescent substance.

Structure Example 3 of Mixed Material

A mixed material containing a material to form an exciplex can be used as the host material. For example, a material in which an emission spectrum of a formed exciplex overlaps with a wavelength of the absorption band on the lowest energy side of the light-emitting substance can be used as the host material. This enables smooth energy transfer and improves emission efficiency. The driving voltage can be reduced. With such a structure, light emission can be efficiently obtained by exciplex-triplet energy transfer (ExTET), which is energy transfer from the exciplex to the light-emitting substance (the phosphorescent material).

A phosphorescent substance can be used as at least one of the materials forming an exciplex. Accordingly, reverse intersystem crossing can be used. Triplet excitation energy can be efficiently converted into singlet excitation energy.

Combination of an electron-transport material and a hole-transport material whose HOMO level is higher than or equal to that of the electron-transport material is preferable for forming an exciplex. The LUMO level of the hole-transport material is preferably higher than or equal to the LUMO level of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectra of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

Note that this embodiment can be combined with any of the other embodiments in this specification as appropriate.

Embodiment 3

In this embodiment, a structure of the light-emitting device 550X of one embodiment of the present invention will be described with reference to FIGS. 7A and 7B.

Structure Example of Light-Emitting Device 550X

The light-emitting device 550X described in this embodiment includes the electrode 551X, the electrode 552X, the unit 103X, and the layer 104X. The electrode 552X overlaps with the electrode 551X, and the unit 103X is located between the electrode 551X and the electrode 552X. The layer 104X is located between the electrode 551X and the unit 103X. For example, the structure described in Embodiment 2 can be employed for the unit 103X.

Structure Example of Electrode 551X

For example, a conductive material can be used for the electrode 551X. Specifically, a single layer or a stack using a metal, an alloy, or a film containing a conductive compound can be used for the electrode 551X.

A film that efficiently reflects light can be used for the electrode 551X, for example. Specifically, an alloy containing silver, copper, and the like, an alloy containing silver, palladium, and the like, or a metal film of aluminum or the like can be used for the electrode 551X.

For example, a metal film that transmits part of light and reflects another part of light can be used for the electrode 551X. Thus, a microcavity structure can be provided in the light-emitting device 550X. Alternatively, light with a predetermined wavelength can be extracted more efficiently than light with the other wavelengths. Alternatively, light with a narrow spectral half-width can be extracted. Alternatively, light of a bright color can be extracted.

A film having a visible-light-transmitting property can be used for the electrode 551X, for example. Specifically, a single layer or a stack using a metal film, an alloy film, a conductive oxide film, or the like that is thin enough to transmit light can be used for the electrode 551X.

In particular, a material having a work function higher than or equal to 4.0 eV can be suitably used for the electrode 551X.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride) can be used. Graphene can also be used.

Structure Example 1 of Layer 104X

A hole-injection material can be used for the layer 104X, for example. The layer 104X can be referred to as a hole-injection layer.

For example, a material having a hole mobility lower than or equal to $1\times10^{-3}$ $cm^2/Vs$ when the square root of the electric field strength [V/cm] is 600 can be used for the layer 104X. A film having an electrical resistivity greater than or equal to $1\times10^4$ [Ω·cm] and less than or equal to $1\times10^7$ [Ω·cm] can be used as the layer 104X. The electrical resistivity of the layer 104X is preferably greater than or equal to 5×10 4 [Ω·cm] and less than or equal to 1×10 7 [Ω·cm], further preferably greater than or equal to $1\times10^5$ [Ω·cm] and less than or equal to $1\times10^7$ [Ω·cm].

Structure Example 2 of Layer 104X

Specifically, an electron-accepting substance can be used for the layer 104X. Alternatively, a composite material containing a plurality of kinds of substances can be used for the layer 104X. This can facilitate the injection of holes from the electrode 551X, for example. Alternatively, the driving voltage of the light-emitting device 550X can be reduced.

[Electron-Accepting Substance]

An organic compound or an inorganic compound can be used as the electron-accepting substance. The electron-accepting substance can extract electrons from an adjacent hole-transport layer or a hole-transport material by the application of an electric field.

For example, a compound having an electron-withdrawing group (a halogen or cyano group) can be used as the electron-accepting substance. Note that an electron-accepting organic compound is easily evaporated, which facilitates film deposition. Thus, the productivity of the light-emitting device 550X can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

For the electron-accepting substance, a transition metal oxide such as a molybdenum oxide, a vanadium oxide, a ruthenium oxide, a tungsten oxide, or a manganese oxide can be used.

It is possible to use any of the following materials: phthalocyanine-based compounds such as phthalocyanine (abbreviation: $H_2Pc$); phthalocyanine-based complex compounds such as copper(II) phthalocyanine (abbreviation: CuPc); and compounds each having an aromatic amine skeleton such as 4,4'-bis[N-(4-diphenylaminophenyl)-N-phenylamino]biphenyl (abbreviation: DPAB) and N,N-bis[4-bis(3-methylphenyl)aminophenyl]-N,N-diphenyl-4,4'-diaminobiphenyl (abbreviation: DNTPD).

In addition, high molecular compounds such as poly(3,4-ethylenedioxythiophene)/poly(styrenesulfonic acid) (abbreviation: PEDOT/PSS), and the like can be used.

Structure Example 1 of Composite Material

For example, a composite material containing an electron-accepting substance and a hole-transport material can be used for the layer 104X. Accordingly, not only a material having a high work function but also a material having a low work function can also be used for the electrode 551X. Alternatively, a material used for the electrode 551X can be selected from a wide range of materials regardless of its work function.

For the hole-transport material in the composite material, for example, a compound having an aromatic amine skeleton, a carbazole derivative, an aromatic hydrocarbon, an aromatic hydrocarbon having a vinyl group, or a high molecular compound (such as an oligomer, a dendrimer, or a polymer) can be used. A material having a hole mobility of $1\times10^{-6}$ $cm^2/Vs$ or higher can be suitably used as the hole-transport material in the composite material. For example, a hole-transport material that can be used for the layer 112X can be used for the composite material.

A substance having a relatively deep HOMO level can be suitably used for the hole-transport material in the composite material. Specifically, the HOMO level is preferably higher than or equal to −5.7 eV and lower than or equal to −5.4 eV. Accordingly, hole injection to the unit 103X can be facilitated. Hole injection to the layer 112X can be facilitated. The reliability of the light-emitting device 550X can be increased.

As the compound having an aromatic amine skeleton, for example, N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N-bis[4-bis(3-methylphenyl)aminophenyl]-N,N-diphenyl-4,4'-diaminobiphenyl (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-

(10-phenyl-9-anthracenyl)phenyl]-9H-carbazol e (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenyl phenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As aromatic hydrocarbon having a vinyl skeleton, for example, 4,4'-bis(2,2-diphenylvinyl)biphenyl (abbreviation: DPVBi) or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl) methacrylamide] (abbreviation: PTPDMA), or poly[N,N'-bis(4-butylphenyl)-N,N'-bis(phenyl)benzidine] (abbreviation: Poly-TPD) can be used.

Furthermore, a substance having any of a carbazole skeleton, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With use of a substance including an N,N-bis(4-biphenyl)amino group, the reliability of the light-emitting device 550X can be increased.

Specific examples of the above-described substances include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)(4)), NA-bis[4-(dibenzofuran-4-yl)phenyl]-4-amino-p-terphenyl (abbreviation: DBMB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBAβN2)B), 4,4'-diphenyl-4"-(7;2'-binaphthyl-2-yl)triphenylamine (abbreviation: BBAβN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4"-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis(biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Structure Example 2 of Composite Material

For example, a composite material including an electron-accepting substance, a hole-transport material, and a fluoride of an alkali metal or a fluoride of an alkaline earth metal can be used as the hole-injection material. In particular, a composite material in which the proportion of fluorine atoms is higher than or equal to 20% can be suitably used. Thus, the refractive index of the layer 104X can be reduced. A layer with a low refractive index can be formed inside the light-emitting device 550X. The external quantum efficiency of the light-emitting device 550X can be improved.

Note that this embodiment can be combined with any of the other embodiments in this specification as appropriate.

Embodiment 4

In this embodiment, a structure of the light-emitting device 550X of one embodiment of the present invention will be described with reference to FIGS. 7A and 7B.

Structure Example of Light-Emitting Device 550X

The light-emitting device 550X described in this embodiment includes the electrode 551X, the electrode 552X, the unit 103X, and a layer 105X. The electrode 552X includes a region overlapping with the electrode 551X, and the unit 103X includes a region located between the electrode 551X and the electrode 552X. The layer 105X includes a region located between the unit 103X and the electrode 552X. For example, the structure described in Embodiment 2 can be employed for the unit 103X.

Structure Example of Electrode 552X

For example, a conductive material can be used for the electrode 552X. Specifically, a single layer or a stack using a metal, an alloy, or a film containing a conductive compound can be used for the electrode 552X.

For example, the material that can be used for the electrode 551X described in Embodiment 3 can be used for the electrode 552X. In particular, a material with a lower work function than the electrode 551X can be suitably used for the electrode 552X. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 552X.

Specifically, an element such as lithium (Li) or cesium (Cs), an element such as magnesium (Mg), calcium (Ca), or strontium (Sr), an element such as europium (Eu) or ytterbium (Yb), or an alloy containing any of these elements such as an alloy of magnesium and silver or an alloy of aluminum and lithium can be used for the electrode 552X.

Structure Example of Layer 105X

An electron-injection material can be used for the layer 105X, for example. The layer 105X can be referred to as an electron-injection layer.

Specifically, an electron-donating substance can be used for the layer 105X. Alternatively, a material in which an electron-donating substance and an electron-transport material are combined can be used for the layer 105X. Alternatively, electride can be used for the layer 105X. This can facilitate the injection of electrons from the electrode 552X, for example. Alternatively, not only a material having a low work function but also a material having a high work function can also be used for the electrode 552X. Alternatively, a material used for the electrode 552X can be selected from a wide range of materials regardless of its work function. Specifically, aluminum (Al), silver (Ag), indium oxide-tin oxide (abbreviation: ITO), indium oxide-tin oxide containing silicon or silicon oxide, or the like can be used for the electrode 552X. Alternatively, the driving voltage of the light-emitting device 550X can be reduced.

[Electron-Donating Substance]

For example, an alkali metal, an alkaline earth metal, a rare earth metal, or a compound thereof (an oxide, a halide, a carbonate, or the like) can be used for the electron-donating substance. Alternatively, an organic compound such as tetrathianaphthacene (abbreviation: TTN), nickelocene, or decamethylnickelocene can be used as the electron-donating substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material composed of two or more kinds of substances can be used as the electron-injection material. For example, an electron-donating substance and an electron-transport material can be used for the composite material.

[Electron-Transport Material]

A material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the amount of electrons injected into the light-emitting layer can be controlled. The light-emitting layer can be prevented from having excess electrons.

For example, a metal complex or an organic compound having a π-electron deficient heteroaromatic ring skeleton can be used as the electron-transport material. For example, an electron-transport material that can be used for the layer 111X can be used for the layer 105X.

Structure Example 2 of Composite Material

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or an alkaline earth metal at 50 wt % or higher can be suitably used. Alternatively, a composite material including an organic compound having a bipyridine skeleton can be suitably used. Thus, the refractive index of the layer 105X can be reduced. The external quantum efficiency of the light-emitting device 550X can be improved.

Structure Example 3 of Composite Material

For example, a composite material of a first organic compound including an unshared electron pair and a first metal can be used for the layer 105X. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound including an unshared electron pair interacts with the first metal and thus can form a singly occupied molecular orbital (SOMO). Furthermore, in the case where electrons are injected from the electrode 552X into the layer 105X, a barrier therebetween can be reduced.

The layer 105X can adopt a composite material that allows the spin density measured by an electron spin resonance (ESR) method to be preferably greater than or equal to $1\times10^{16}$ spins/$cm^3$, further preferably greater than or equal to $5\times10^{16}$ spins/$cm^3$, still further preferably greater than or equal to $1\times10^{17}$ spins/$cm^3$.

[Organic Compound Including Unshared Electron Pair]

For example, an electron-transport material can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device 550X can be reduced.

Note that the lowest unoccupied molecular orbital (LUMO) level of the organic compound having an unshared electron pair is preferably higher than or equal to −3.6 eV and lower than or equal to −2.3 eV. In general, the HOMO level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(2-naphthyl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), 2,2'-(1,3-phenylene)bis(9-phenyl-1,10-phenanthroline) (abbreviation: mPPhen2P), or the like can be used as the organic compound having an unshared electron pair. Note that NBPhen has a higher glass transition temperature (Tg) than BPhen and thus has high heat resistance.

Alternatively, for example, copper phthalocyanine can be used for the organic compound including an unshared electron pair. The number of electrons of the copper phthalocyanine is an odd number.

[First Metal]

When the number of electrons of the first organic compound including an unshared electron pair is an even number, for example, a composite material of the first organic compound and the first metal that belongs to an odd-numbered group in the periodic table can be used for the layer 105X.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point. By using a metal having a low reactivity with water or oxygen as the first metal, the moisture resistance of the light-emitting device 550X can be improved.

The use of Ag for the electrode 552X and the layer 105X can increase the adhesion between the layer 105X and the electrode 552X.

When the number of electrons of the first organic compound including an unshared electron pair is an odd number, a composite material of the first organic compound and the first metal that belongs to an even-numbered group in the periodic table can be used for the layer 105X. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed can be used, for example, as the electron-injection material.

Note that this embodiment can be combined with any of the other embodiments in this specification as appropriate.

Embodiment 5

In this embodiment, a structure of the light-emitting device 550X of one embodiment of the present invention is described with reference to FIG. 8A.

Figure 8A:
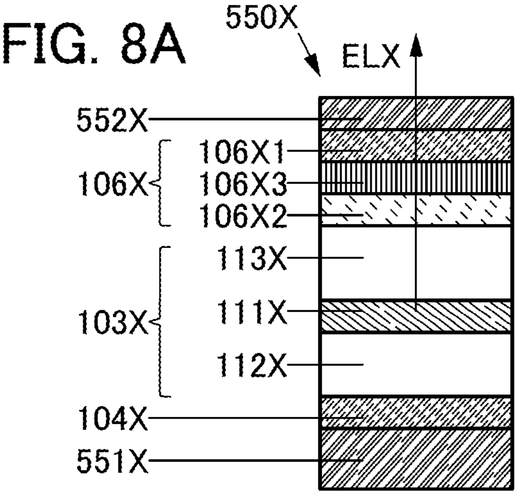
FIGS. 8A and 8B each illustrate a structure of a light-emitting device of an embodiment.

FIG. 8A is a cross-sectional view illustrating a structure of a light-emitting device of one embodiment of the present invention.

Structure Example of Light-Emitting Device 550X

The light-emitting device 550X described in this embodiment includes the electrode 551X, the electrode 552X, the unit 103X, and an intermediate layer 106X (see FIG. 8A). The electrode 552X includes a region overlapping with the electrode 551X, and the unit 103X includes a region located between the electrode 551X and the electrode 552X. The intermediate layer 106X includes a region located between the unit 103X and the electrode 552X.

Structure Example 1 of Intermediate Layer 106X

The intermediate layer 106X has a function of supplying electrons to the anode side and supplying holes to the cathode side when voltage is applied. The intermediate layer 106X can be referred to as a charge-generation layer.

For example, a hole-injection material that can be used for the layer 104X described in Embodiment 3 can be used for the intermediate layer 106X. Specifically, a composite material can be used for the intermediate layer 106X.

Alternatively, for example, a stacked film in which a film including the composite material and a film including a hole-transport material are stacked can be used for the intermediate layer 106X. Note that the film including a hole-transport material is located between the film including the composite material and the cathode.

Structure Example 2 of Intermediate Layer 106X

A stacked film in which a layer 106X1 and a layer 106X2 are stacked can be used for the intermediate layer 106X. The layer 106X1 includes a region located between the unit 103X and the electrode 552X and the layer 106X2 includes a region located between the unit 103X and the layer 106X1.

Structure Example of Layer 106X1

For example, a hole-injection material that can be used for the layer 104X described in Embodiment 3 can be used for the layer 106X1. Specifically, a composite material can be used for the layer 106X1. A film having an electrical resistivity greater than or equal to $1\times10^4$ [Ω·cm] and less than or equal to $1\times10^7$ [Ω·cm] can be used as the layer 106X1. The electrical resistivity of the layer 106X1 is preferably greater than or equal to $5\times10^4$ [Ω·cm] and less than or equal to $1\times10^7$ [Ω·cm], further preferably greater than or equal to $1\times10^5$ [Ω·cm] and less than or equal to $1\times10^7$ [Ω·cm].

Structure Example of Layer 106X2

For example, a material that can be used for the layer 105X described in Embodiment 4 can be used for the layer 106X2.

Structure Example 3 of Intermediate Layer 106X

A stacked film in which the layer 106X1, the layer 106X2, and a layer 106X3 are stacked can be used for the intermediate layer 106X. The layer 106X3 includes a region sandwiched between the layer 106X1 and the layer 106X2.

Structure Example of Layer 106X3

For example, an electron-transport material can be used for the layer 106X3. The layer 106X3 can be referred to as an electron-relay layer. With the layer 106X3, a layer that is on the anode side and in contact with the layer 106X3 can be distanced from a layer that is on the cathode side and in contact with the layer 106X3. Interaction between the layer that is on the anode side and in contact with the layer 106X3 and the layer that is on the cathode side and in contact with the layer 106X3 can be reduced. Electrons can be smoothly supplied to the layer that is on the anode side and in contact with the layer 106X3.

A substance whose LUMO level is between the LUMO level of the electron-accepting substance contained in the layer 106X1 and the LUMO level of the substance contained in the layer 106X2 can be suitably used for the layer 106X3.

For example, a material having a LUMO level in a range higher than or equal to −5.0 eV, preferably higher than or equal to −5.0 eV and lower than or equal to −3.0 eV, can be used for the layer 106X3.

Specifically, a phthalocyanine-based material can be used for the layer 106X3. For example, copper(II) phthalocyanine (abbreviation: CuPc) or a metal complex having a metal-oxygen bond and an aromatic ligand can be used for the layer 106X3.

Note that this embodiment can be combined with any of the other embodiments in this specification as appropriate.

Embodiment 6

In this embodiment, a structure of the light-emitting device 550X of one embodiment of the present invention will be described with reference to FIG. 8B.

Figure 8B:
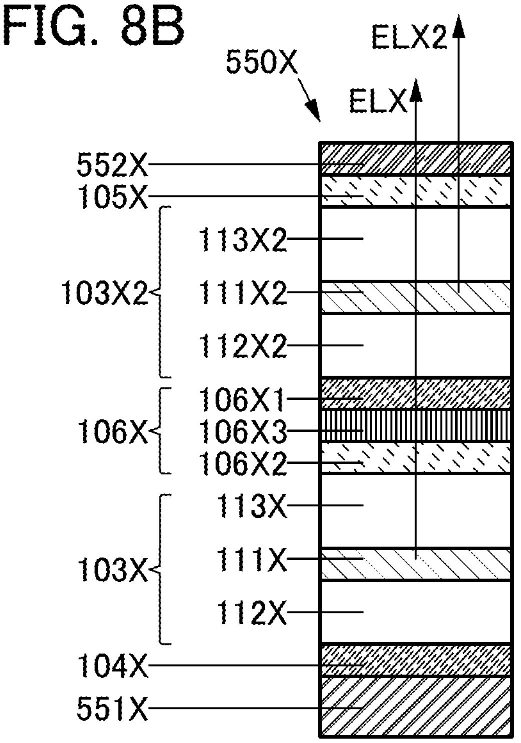

FIG. 8B is a cross-sectional view illustrating a structure of a light-emitting device of one embodiment of the present invention, which is different from that in FIG. 8A.

Structure Example of Light-Emitting Device 550X

The light-emitting device 550X described in this embodiment includes the electrode 551X, the electrode 552X, the unit 103X, the intermediate layer 106X, and a unit 103X2 (see FIG. 8B).

The unit 103X is located between the electrode 552X and the electrode 551X, and the intermediate layer 106X is located between the electrode 552X and the unit 103X.

The unit 103X2 is located between the electrode 552X and the intermediate layer 106X. The unit 103X2 has a function of emitting light ELX2.

In other words, the light-emitting device 550X includes the stacked units between the electrode 551X and the electrode 552X. The number of stacked units is not limited to two and may be three or more. A structure including the stacked units located between the electrode 551X and the electrode 552X and the intermediate layer 106X located between the units is referred to as a stacked light-emitting device or a tandem light-emitting device in some cases.

This structure enables high luminance emission while the current density is kept low. Reliability can be improved. The driving voltage can be reduced in comparison with that of another light-emitting device with the same luminance. The power consumption can be reduced.

Structure Example 1 of Unit 103X2

The unit 103X2 includes a layer 111X2, a layer 112X2, and a layer 113X2. The layer 111X2 is located between the layer 112X2 and the layer 113X2.

The structure that can be employed for the unit 103X can be employed for the unit 103X2. For example, the same structure as the unit 103X can be employed for the unit 103X2.

Structure Example 2 of Unit 103X2

The structure that is different from the structure of the unit 103X can be employed for the unit 103X2. For example, the unit 103X2 can have a structure emitting light whose hue is different from that of light emitted from the unit 103X.

Specifically, a stack including the unit 103X emitting red and green light and the unit 103X2 emitting blue light can be employed. With this structure, a light-emitting device emitting light of a desired color can be provided. A light-emitting device emitting white light can be provided, for example.

Structure Example of Intermediate Layer 106X

The intermediate layer 106X has a function of supplying electrons to one of the unit 103X and the unit 103X2 and supplying holes to the other. For example, the intermediate layer 106X described in Embodiment 5 can be used.

<Manufacturing Method of Light-Emitting Device 550X>

For example, each of the electrode 551X, the electrode 552X, the unit 103X, the intermediate layer 106X, and the unit 103X2 can be formed by a dry process, a wet process, an evaporation method, a droplet discharging method, a coating method, a printing method, or the like. A formation method may differ between components of the device.

Specifically, the light-emitting device 550X can be manufactured with a vacuum evaporation machine, an ink-jet machine, a coating machine such as a spin coater, a gravure printing machine, an offset printing machine, a screen printing machine, or the like.

For example, the electrode can be formed by a wet process or a sol-gel method using a paste of a metal material. In addition, an indium oxide-zinc oxide film can be formed by a sputtering method using a target obtained by adding indium zinc to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

Note that this embodiment can be combined with any of the other embodiments in this specification as appropriate.

Embodiment 7

In this embodiment, structures of a display apparatus of one embodiment of the present invention will be described with reference to FIG. 9A and FIGS. 10A and 10B.

Figure 9A:
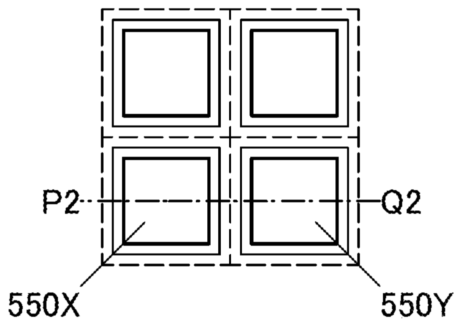
FIGS. 9A and 9B each illustrate a structure of a pixel of an embodiment.

FIG. 9A is a front view illustrating a structure of a pixel 703 in a display apparatus of one embodiment of the present invention.

Figure 10A:
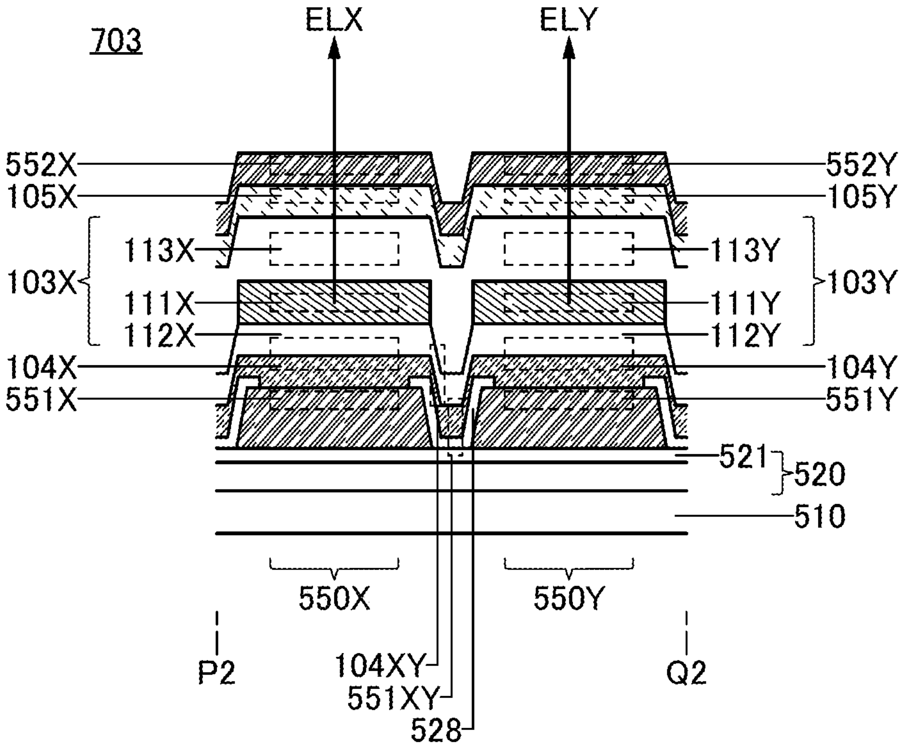
FIGS. 10A and 10B each illustrate a structure of a pixel of an embodiment.

FIG. 10A is a cross-sectional view taken along line P2-Q2 in FIG. 9A, and FIG. is a cross-sectional view illustrating a structure different from that in FIG. 10A.

Structure Example 1 of Pixel 703

The display apparatus described in this embodiment includes the pixel 703. The pixel 703 includes the light-emitting device 550X, and a light-emitting device 550Y (see FIG. 10A). The light-emitting device 550Y is adjacent to the light-emitting device 550X.

Note that the display apparatus includes the substrate 510 and the functional layer 520. The functional layer 520 includes an insulating film 521, and the light-emitting devices 550X and 550Y are formed over the insulating film 521. The functional layer 520 is located between the substrate 510 and the light-emitting device 550X.

Structure Example of Light-Emitting Device 550X

The light-emitting device 550X includes the electrode 551X, the electrode 552X, and the unit 103X. The electrode 552X overlaps with the electrode 551X, and the unit 103X is located between the electrode 552X and the electrode 551X. The light-emitting device 550X includes the layer 104X and the layer 105X, the layer 104X is located between the electrode 551X and the unit 103X, and the layer 105X is located between the electrode 552X and the unit 103X. The unit 103X includes a layer 111X, a layer 112X, and a layer 113X.

For example, the structure described in any one of Embodiments 2 to 6 can be used as the light-emitting device 550X.

Structure Example of Light-Emitting Device 550Y

The light-emitting device 550Y includes an electrode 551Y, an electrode 552Y, and a unit 103Y. The electrode 552Y overlaps with the electrode 551Y, and the unit 103Y is located between the electrode 552Y and the electrode 551Y. Furthermore, the light-emitting device 550Y includes a layer 104Y and a layer 105Y. The layer 104Y is located between the unit 103Y and the electrode 551Y, and the layer 105Y is located between the electrode 552Y and the unit 103Y.

The electrode 551Y is adjacent to the electrode 551X, and the electrode 551Y and the electrode 551X are provided so that a space 551XY is positioned therebetween.

Note that part of a structure that can be employed as a structure of the light-emitting device 550X can be employed as a structure of the light-emitting device 550Y. For example, part of a conductive film that can be used for the electrode 552X can be used for the electrode 552Y. A structure that can be employed for the electrode 551X can be employed for the electrode 551Y. A structure that can be used for the layer 104X and a structure that can be used for the layer 105X can be respectively employed for the layer 104Y and the layer 105Y. Thus, part of the shared components can be formed in one step. In addition, the manufacturing process can be simplified.

Moreover, the light-emitting device 550Y can have a structure emitting light whose hue is the same as that of light emitted from the light-emitting device 550X. For example, both the light-emitting device 550X and the light-emitting device 550Y may emit light including blue and green light.

For example, a color conversion layer is provided to overlap with the light-emitting device 550X, whereby blue light can be converted into light of a predetermined hue. Another coloring layer is provided to overlap with the light-emitting device 550Y, whereby light including blue and green light can be converted into light of another predetermined hue. For example, the light including blue and green light can be converted into green light or red light.

Furthermore, a color conversion layer is provided to overlap with the light-emitting device 550X, whereby blue light can be extracted from light including blue and green light. Another coloring layer is provided to overlap with the light-emitting device 550Y, whereby green light can be extracted from light including blue and green light.

For example, both the light-emitting device 550X and the light-emitting device 550Y may emit blue light. A color conversion layer is provided to overlap with the light-emitting device 550X, whereby blue light can be converted into light of a predetermined hue. Another coloring layer is provided to overlap with the light-emitting device 550Y, whereby blue light can be converted into light of another predetermined hue. Blue light can be converted into green light or red light, for example.

Furthermore, both the light-emitting device 550X and the light-emitting device 550Y may emit white light. A coloring layer is provided to overlap with the light-emitting device 550X, whereby light of a predetermined hue can be extracted from white light. Another coloring layer is provided to overlap with the light-emitting device 550Y, whereby light of another predetermined hue can be extracted from white light.

Moreover, the light-emitting device 550Y can have a structure emitting light whose hue is different from that of light emitted from the light-emitting device 550X. For example, the hue of light ELY emitted from the unit 103Y can be differentiated from that of the light ELX.

Structure Example 2 of Pixel 703

The pixel 703 described in this embodiment includes an insulating film 528 (see FIG. 10A).

Structure Example of Insulating Film 528

The insulating film 528 has openings; one opening overlaps with the electrode 551X and the other opening overlaps with the electrode 551Y. The insulating film 528 overlaps with the space 551XY.

Structure Example of Space 551XY

The space 551XY located between the electrode 551X and the electrode 551Y has a groove-like shape, for example. Thus, a step is formed along the groove. A film deposited over the groove is partly split or thinned between the space 551XY and the electrode 551X.

When an anisotropic deposition method such as a thermal evaporation method is employed, a split or thinned portion is formed along the step in a region 104XY located between the layer 104X and the layer 104Y.

Thus, current flowing through the region 104XY can be suppressed, for example. Moreover, current flowing between the layer 104X and the layer 104Y can be suppressed. Furthermore, a phenomenon in which the light-emitting device 550Y that is adjacent to the light-emitting device 550X unintentionally emits light in accordance with the operation of the light-emitting device 550X can be suppressed.

Structure Example 3 of Pixel 703

The display apparatus described in this embodiment includes the pixel 703. The pixel 703 includes the light-emitting device 550X and the light-emitting device 550Y (see FIG. 10B). The light-emitting device 550Y is adjacent to the light-emitting device 550X.

Figure 10B:
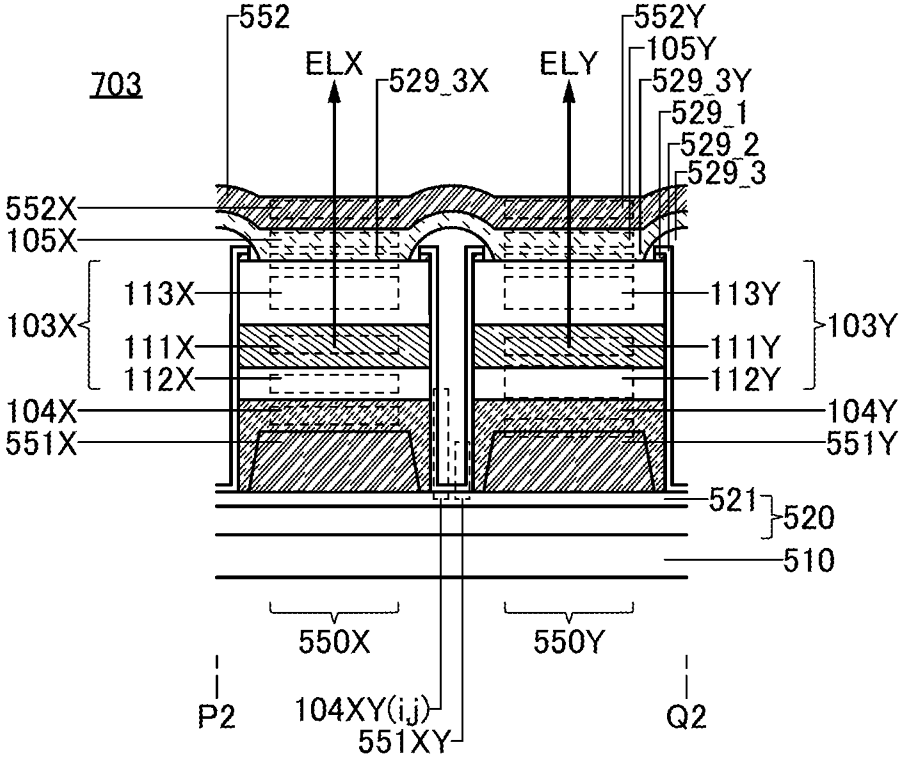

The display apparatus described with reference to FIG. 10B is different from the display device described with reference to FIG. 10A in that part or the whole of the structure of the light-emitting device 550X or the light-emitting device 550Y is removed from a portion overlapping with the space 551XY and a film 529_1, a film 529_2, and a film 529_3 are provided instead of the insulating film 528. Different parts will be described in detail below, and the above description is referred to for parts having the same structure as the above.

In this specification and the like, a device formed using a metal mask or a fine metal mask (FMM) may be referred to as a device having a metal mask (MM) structure. In this specification and the like, a device formed without using a metal mask or an FMM is sometimes referred to as a device having a metal maskless (MML) structure.

Structure Example of Film 529_1

The film 529_1 has openings; one opening overlaps with the electrode 551X and the other opening overlaps with the electrode 551Y (see FIG. 10B). The film 529_1 further has an opening overlapping with the space 551XY. For example, a film containing a metal, a metal oxide, an organic material, or an inorganic insulating material can be used as the film 529_1. Specifically, a light-blocking metal film can be used. Accordingly, light with which the components are irradiated during the processing step can be blocked, resulting in suppression of a phenomenon in which the characteristics of the light-emitting device are degraded by the light.

Structure Example of Film 529_2

The film 529_2 has openings; one opening overlaps with the electrode 551X and the other opening overlaps with the electrode 551Y. The film 529_2 overlaps with the space 551XY.

The film 529_2 includes a region in contact with the layer 104X and the unit 103X.

The film 529_2 includes a region in contact with the layer 104Y and the unit 103Y.

The film 529_2 includes a region in contact with the insulating film 521. The film 529_2 can be formed by an atomic layer deposition (ALD) method, for example. Thus, a film with favorable coverage can be formed. Specifically, a metal oxide film or the like can be used as the film 529_2. Aluminum oxide can be used, for example.

Structure Example of Film 529_3

The film 529_3 includes openings; an opening 529_3X overlaps with the electrode 551X, and an opening 529_3Y overlaps with the electrode 551Y. A groove formed in a region overlapping with the space 551XY is filled with the film 529_3. The film 529_3 can be formed using a photosensitive resin, for example. Specifically, an acrylic resin or the like can be used.

Thus, the layer 104X can be electrically isolated from the layer 104Y, for example. In addition, current flowing through the region 104XY can be suppressed, for example. Furthermore, a phenomenon in which the light-emitting device 550Y that is adjacent to the light-emitting device 550X unintentionally emits light in accordance with the operation of the light-emitting device 550X can be suppressed. A step formed between a top surface of the unit 103X and a top surface of the unit 103Y can be reduced in size. Occurrence of a phenomenon in which a split or thinned portion due to the step is formed between the electrode 552X and the electrode 552Y can be suppressed. A continuous conductive film can be used for the electrode 552X and the electrode 552Y.

Note that part or the whole of the structure that can be employed for the light-emitting device 550X or the light-emitting device 550Y) can be removed from a portion overlapping with the space 551XY by using photolithography technology, for example.

Specifically, in a first step, a first film to be the unit 103Y later is formed over the space 551XY.

In a second step, a second film to be the film 529_1 is formed over the first film, for example.

In a third step, an opening portion overlapping with the space 551XY is formed in the second film by a photolithography method.

In a fourth step, part of the first film is removed using the second film as a resist mask. For example, the first film in a region overlapping with the space 551XY is removed by a dry etching method. Specifically, the first film can be removed with use of an oxygen-containing gas. Accordingly, a groove-like structure is formed in the region overlapping with the space 551XY.

In a fifth step, for example, a third film to be the film 529_2 is formed over the second film by an atomic layer deposition (ALD) method.

In a sixth step, the film 529_3 is formed with use of a photosensitive polymer, for example. Accordingly, a groove-like structure formed in the region overlapping with the space 551XY is filled with the film 529_3.

In a seventh step, an opening portion overlapping with the electrode 551Y is formed in the third film and the second film by an etching method, whereby the film 529_2 and the film 529_1 are formed.

In an eighth step, the layer 105Y is formed over the unit 103Y and the electrode 552Y is formed over the layer 105Y.

Note that this embodiment can be combined with any of the other embodiments in this specification as appropriate.

Embodiment 8

In this embodiment, structures of a display apparatus of one embodiment of the present invention will be described with reference to FIG. 9B and FIGS. 11A and 11B.

FIG. 9A is a front view illustrating a structure of the pixel 703 of one embodiment of the present invention.

Figure 9B:
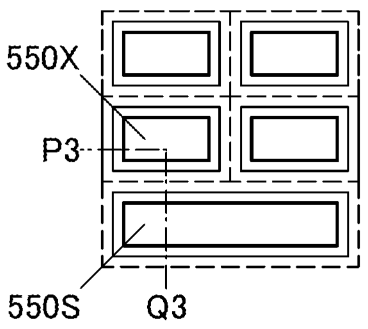
Figure 11A:
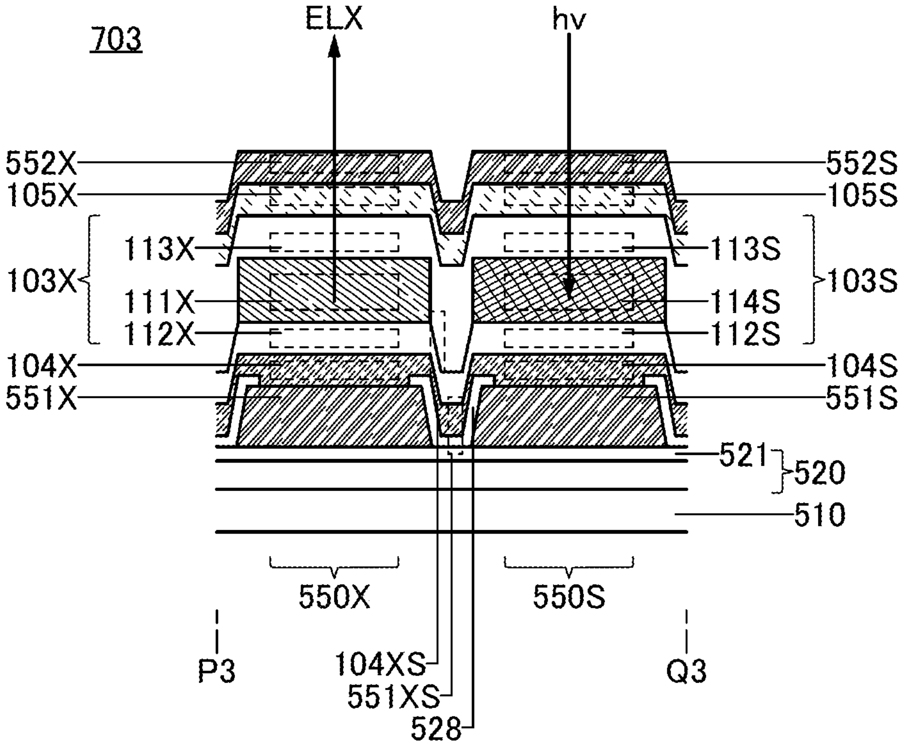
FIGS. 11A and 11B each illustrate a structure of a pixel of an embodiment.
Figure 11B:
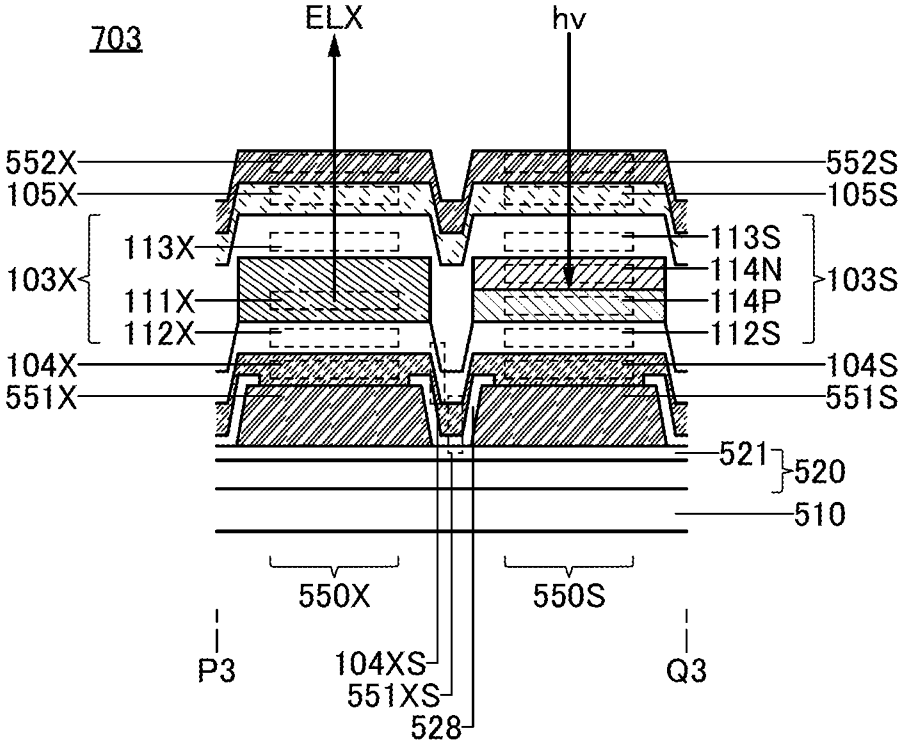

FIG. 11A is a cross-sectional view taken along line P3-Q3 in FIG. 9B, and FIG. 11B is a cross-sectional view illustrating a structure different from that in FIG. 11A.

Structure Example 1 of Pixel 703

The display apparatus described in this embodiment includes the pixel 703. The pixel 703 includes the light-emitting device 550X and a photoelectric conversion device 550S (see FIG. 11A). The photoelectric conversion device 550S is adjacent to the light-emitting device 550X.

Note that the display apparatus includes the substrate 510 and the functional layer 520. The functional layer 520 includes the insulating film 521, and the light-emitting device 550X and the photoelectric conversion device 550S are formed over the insulating film 521. The functional layer 520 is located between the substrate 510 and the light-emitting device 550X.

Structure Example of Light-Emitting Device 550X

The light-emitting device 550X includes the electrode 551X, the electrode 552X, and the unit 103X. The electrode 552X overlaps with the electrode 551X, and the unit 103X is located between the electrode 552X and the electrode 551X. The light-emitting device 550X includes the layer 104X and the layer 105X, the layer 104X is located between the electrode 551X and the unit 103X, and the layer 105X is located between the electrode 552X and the unit 103X.

For example, the light-emitting device 550X described in any one of Embodiments 2 to 6 can be used as the light-emitting device 550X in this embodiment.

Structure Example 1 of Photoelectric Conversion Device 550S

The photoelectric conversion device 550S includes an electrode 551S, an electrode 552S, and a unit 103S. The electrode 552S overlaps with the electrode 551S, and the unit 103S is located between the electrode 551S and the electrode 552S. The photoelectric conversion device 550S includes a layer 104S and a layer 105S. The layer 104S is located between the unit 103S and the electrode 551S, and the layer 105S is located between the electrode 552S and the unit 103S.

The electrode 551S is adjacent to the electrode 551X, and the electrode 551S and the electrode 551X are provided so that a space 551XS is positioned therebetween.

Note that part of a structure that can be employed as a structure of the light-emitting device 550X described in any one of Embodiments 2 to 6 can be employed as a structure of the photoelectric conversion device 550S. For example, part of a conductive film that can be used for the electrode 552X can be used for the electrode 552S. A structure that can be employed for the electrode 551X can be employed for the electrode 551S. A structure that can be used for the layer 104X and a structure that can be used for the layer 105X can be respectively employed for the layer 104S and the layer 105S. Thus, part of the structure can be employed in common. In addition, the manufacturing process can be simplified.

Note that the photoelectric conversion device 550S is different from the light-emitting device 550X in that the unit 103S having a function of converting light into current is included instead of the unit 103X having a function of emitting light. Different parts will be described in detail below, and the above description is referred to for parts having the same structure as the above.

Structure Example 1 of Unit 103S

The unit 103S has a single-layer structure or a stacked-layer structure. The unit 103S can include, for example, a layer selected from functional layers such as a photoelectric conversion layer, a hole-transport layer, an electron-transport layer, and a carrier-blocking layer, in addition to the photoelectric conversion layer.

The unit 103S includes a layer 114S, a layer 112S, and a layer 113S, for example (see FIG. 11A). The layer 114S is sandwiched between the layer 112S and the layer 113S. Note that the layer 112S is sandwiched between the electrode 551S and the layer 114S, and the layer 113S is sandwiched between the electrode 552S and the layer 114S.

Note that the unit 103S has a function of absorbing light hv and supplying electrons to one electrode and supplying holes to the other. For example, the unit 103S supplies holes to the electrode 551S and supplies electrons to the electrode 552S.

Note that part of a structure that can be employed as a structure of the unit 103X described in Embodiment 2 can be employed as a structure of the unit 103S. For example, a structure that can be employed for the layer 112X and a structure that can be employed for the layer 113X can be respectively employed for the layer 112S and the layer 113S. Thus, part of the structure can be employed in common. In addition, the manufacturing process can be simplified.

Structure Example 1 of Layer 114S

In addition, the layer 114S can be referred to as a photoelectric conversion layer. The layer 114S absorbs the light hv, supplies electrons to a layer in contact with one side of the layer 114S, and supplies holes to a layer in contact with the other side of the layer 114S. For example, the layer 114S supplies holes to the layer 112S, and supplies electrons to the layer 113S. For example, a material that can be used for an organic solar cell can be used for the layer 114S. Specifically, an electron-accepting material and an electron-donating material can be used for the layer 114S.

Example of Electron-Accepting Material

As the electron-accepting material, a fullerene derivative or a non-fullerene electron acceptor can be used, for example.

As the electron-accepting material, a $C_{60}$ fullerene, a $C_{70}$ fullerene, [6,6]-phenyl-$C_{71}$-butyric acid methyl ester (abbreviation: PC71BM), [6,6]-phenyl-$C_{61}$-butyric acid methyl ester (abbreviation: PC61BM), 1',1",4',4"-tetrahydro-di[1,4]methanonaphthaleno[1,2:2',3',56,60:2",3"][5,6]fullerene-$C_{60}$ (abbreviation: ICBA), or the like can be used.

As the non-fullerene electron acceptor, a perylene derivative, a compound having a dicyanomethyleneindanone group, or the like can be used. For example, N,N'-dimethyl-3,4,9,10-perylenetetracarboxylic diimide (abbreviation: Me-PTCDI) can be used.

Example of Electron-Donating Material

As the electron-donating material, a phthalocyanine compound, a tetracene derivative, a quinacridone derivative, a rubrene derivative, or the like can be used.

As the electron-donating material, copper(II) phthalocyanine (abbreviation: CuPc), tin(II) phthalocyanine (SnPc), zinc phthalocyanine (ZnPc), tetraphenyldibenzoperiflanthene (DBP), rubrene, or the like can be used.

Structure Example 2 of Layer 114S

The layer 114S can have a single-layer structure or a stacked-layer structure, for example. Specifically, the layer 114S can have a bulk heterojunction structure. Alternatively, the layer 114S can have a heterojunction structure.

Structure Example of Mixed Material

A mixed material containing an electron-accepting material and an electron-donating material can be used for the layer 114S, for example (see FIG. 11A). Note that a structure in which such a mixed material containing an electron-accepting material and an electron-donating material is used for the layer 114S can be referred to as a bulk heterojunction structure.

Specifically, a mixed material containing a $C_{70}$ fullerene and DBP can be used for the layer 114S.

Example of Heterojunction Structure

A layer 114N and a layer 114P can be used for the layer 114S (see FIG. 11B). The layer 114N includes a region between one electrode and the layer 114P, and the layer 114P includes a region between the layer 114N and the other electrode. For example, the layer 114N includes a region between the electrode 552S and the layer 114P, and the layer 114P includes a region between the layer 114N and the electrode 551S.

An n-type semiconductor can be used for the layer 114N. For example, Me-PTCDI can be used for the layer 114N.

A p-type semiconductor can be used for the layer 114P. For example, rubrene can be used for the layer 114P.

Note that the photoelectric conversion device 550S in which the layer 114P is in contact with the layer 114N can be referred to as a pn-junction photodiode.

Note that this embodiment can be combined with any of the other embodiments in this specification as appropriate.

Embodiment 9

In this embodiment, a display module of one embodiment of the present invention will be described.

<Display Module>

Figure 12:
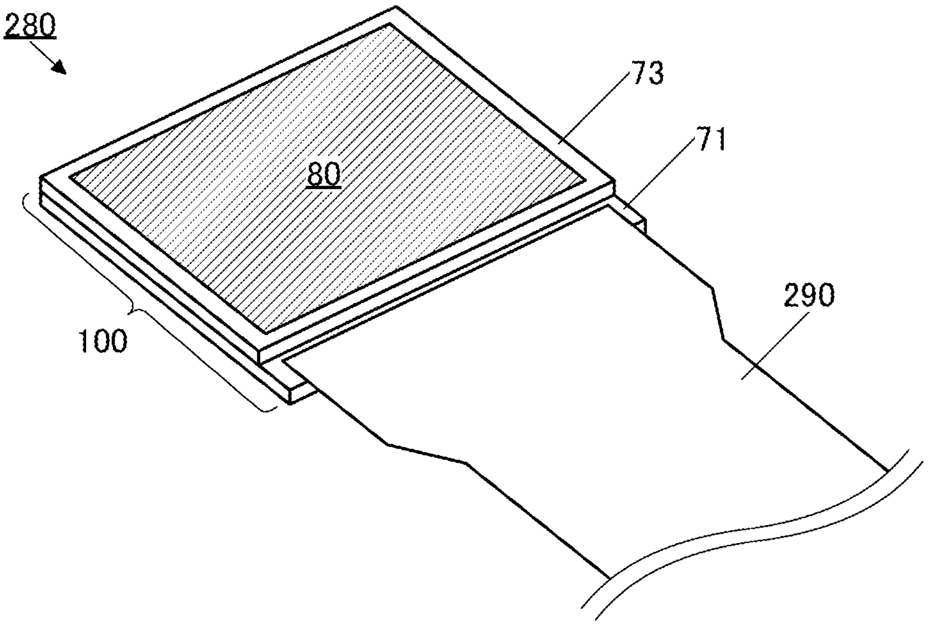
FIG. 12 illustrates a structure of a display module of an embodiment.

FIG. 12 is a perspective view illustrating a structure of a display module 280.

The display module 280 includes a display apparatus 100 and one of an FPC 290 and a connector. The FPC 290 is given a data signal, a power supply potential, or the like from the outside and supplies the data signal, the power supply potential, or the like to the display apparatus 100. An IC may be mounted on the FPC 290. The connector is a mechanical component for electrical connection through a conductor, and the conductor can electrically connect the display apparatus 100 to a component to be connected. For example, the FPC 290 can be used as the conductor. The connector can detach the display apparatus 100 from the connected component.

<<Display Apparatus 100A>>

Figure 13:
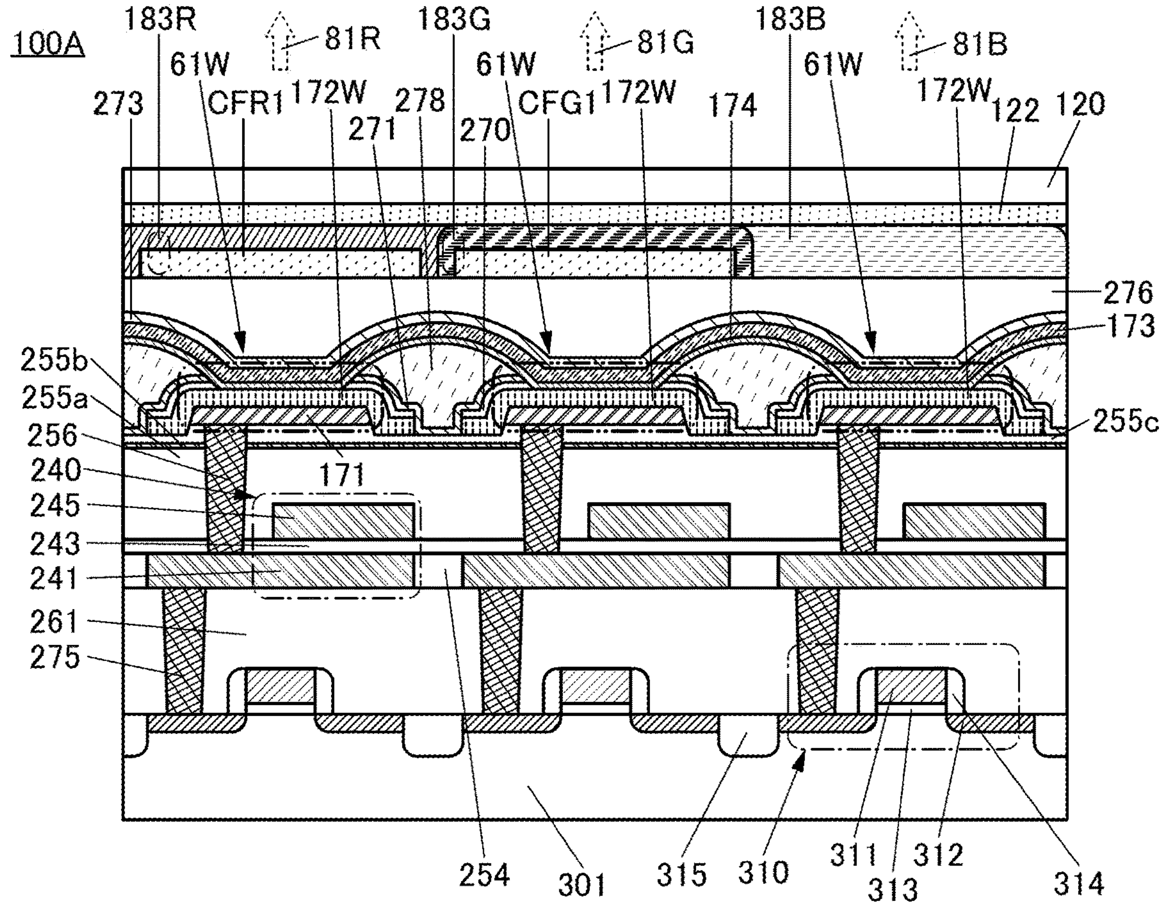
FIG. 13 illustrates a structure of a display apparatus of an embodiment.

FIG. 13 is a cross-sectional view illustrating a structure of a display apparatus 100A. The display apparatus 100A can be used for the display apparatus 100 of the display module 280. A substrate 301 corresponds to a substrate 71 in FIG. 12.

The display apparatus 100A includes the substrate 301, a transistor 310, an element isolation layer 315, an insulating layer 261, a capacitor 240, an insulating layer 255*a*, an insulating layer 255*b*, and a plurality of light-emitting devices 61W. The insulating layer 261 is provided over the substrate 301, and the transistor 310 is located between the substrate 301 and the insulating layer 261. The insulating layer 255*a* is provided over the insulating layer 261. The capacitor 240 is located between the insulating layer 261 and the insulating layer 255*a*. The insulating layer 255*a* is located between the light-emitting device 61W and the capacitor 240.

[Transistor 310]

The transistor 310 includes a conductive layer 311, a pair of low-resistance regions 312, an insulating layer 313, and an insulating layer 314. A channel of the transistor 310 is formed in part of the substrate 301. The conductive layer 311 functions as a gate electrode. The insulating layer 313 is located between the substrate 301 and the conductive layer 311 and functions as a gate insulating layer. The substrate 301 is provided with the pair of low-resistance regions 312 doped with impurities. Note that such regions function as a source and a drain. The side surface of the conductive layer 311 is covered with the insulating layer 314.

The element isolation layer 315 is embedded in the substrate 301 and located between two transistors 310 adjacent to each other.

[Capacitor 240]

The capacitor 240 includes a conductive layer 241, a conductive layer 245, and an insulating layer 243. The insulating layer 243 is located between the conductive layer 241 and the conductive layer 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 275 embedded in the insulating layer 261. The insulating layer 243 is provided to cover the conductive layer 241. The conductive layer 245 overlaps with the conductive layer 241 with the insulating layer 243 therebetween.

[Insulating Layer 255]

An insulating layer 255 includes the insulating layer 255*a*, the insulating layer 255*b*, and an insulating layer 255*c*. The insulating layer 255*b* is located between the insulating layer 255*a* and the insulating layer 255*c*.

[Light-Emitting Device 61W]

The light-emitting device 61W is provided over the insulating layer 255*c*. For example, the light-emitting device described in any one of Embodiments 2 to 6 can be used as the light-emitting device 61W. The light-emitting device 61W can emit light including blue light. For example, the light-emitting device 61W can emit blue light, light including blue and green light, or white light.

The light-emitting device 61W includes a conductive layer 171 and an EL layer 172W. The EL layer 172W covers the top and side surfaces of the conductive layer 171. A sacrificial layer 270 is located over the EL layer 172W.

The conductive layer 171 is electrically connected to one of the source and the drain of the transistor 310 through a plug 256 embedded in the insulating layer 243, the insulating layer 255*a*, the insulating layer 255*b*, and the insulating layer 255*c*, the conductive layer 241 embedded in the insulating layer 254, and the plug 275 embedded in the insulating layer 261. The top surface of the insulating layer 255*c* and the top surface of the plug 256 are level with or substantially level with each other. Any of a variety of conductive materials can be used for the plugs.

[Protective Layer 271, Insulating Layer 278, Protective Layer 273, Bonding Layer 122]

A protective layer 271 and an insulating layer 278 are located between adjacent light-emitting devices 61W, and the insulating layer 278 is provided over the protective layer 271. A protective layer 273 is provided over the light-emitting device 61W.

A bonding layer 122 attaches the protective layer 273 and a substrate 120 to each other.

[Substrate 120]

The substrate 120 corresponds to the substrate 73 in FIG. 12. For example, a light-blocking layer can be provided for the surface of the substrate 120 on the bonding layer 122 side. A variety of optical members can be provided outside the substrate 120.

A film can be used as the substrate; a film with a low water absorption rate is particularly preferable. For example, the water absorption rate is preferably lower than or equal to 1%, further preferably lower than or equal to 0.1%. Thus, a change in size of the film can be inhibited. Furthermore, generation of wrinkles or the like can be inhibited. Moreover, a change in shape of the display apparatus can be inhibited.

For example, a polarizing plate, a retardation plate, a light diffusion layer (e.g., a diffusion film), an anti-reflection layer, a light-condensing film, or the like can be used as the optical member.

It is possible that a highly optically isotropic material, in other words, a material with a low birefringence index is used for the substrate and a circular polarizing plate is provided to overlap with the display apparatus. For example, it is possible to use, for the substrate, a material that has an absolute value of a retardation (phase difference) of nm or less, preferably 20 nm or less, further preferably 10 nm or less. For example, a triacetyl cellulose (TAC, also referred to as cellulose triacetate) film, a cycloolefin polymer (COP) film, a cycloolefin copolymer (COC) film, or an acrylic resin film can be used as a highly optically isotropic film.

Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 120. For example, a glass layer, a silica layer ($SiO_x$ layer), diamond like carbon (DLC), aluminum oxide ($AlO_x$), a polyester-based material, a polycarbonate-based material, or the like can be used for the surface protective layer. Note that a material having a high visible light transmittance can be suitably used for the surface protective layer. In addition, a material having high hardness can be suitably used for the surface protective layer.

The display apparatus 100A includes a layer 183R, a layer 183G, and a layer 183B. The layer 183R includes a region overlapping with one light-emitting device 61W, the layer 183G includes a region overlapping with another light-emitting device 61W, and the layer 183B includes a region overlapping with another light-emitting device 61W.

The layer 183R includes a layer CFR1, and the layer CFR1 contains a color conversion material. The layer 183G includes a layer CFG1, and the layer CFG1 contains a color conversion material. The layer 183B contains a color conversion material and functions as a color filter.

Accordingly, for example, the layer 183R can convert light emitted by the light-emitting device 61W into red light and transmit the light, the layer 183G can convert light emitted by the light-emitting device 61W into green light and transmit the light, and the layer 183B can transmit blue light included in light emitted by the light-emitting device 61W.

<<Display Apparatus 100C>>

Figure 14:
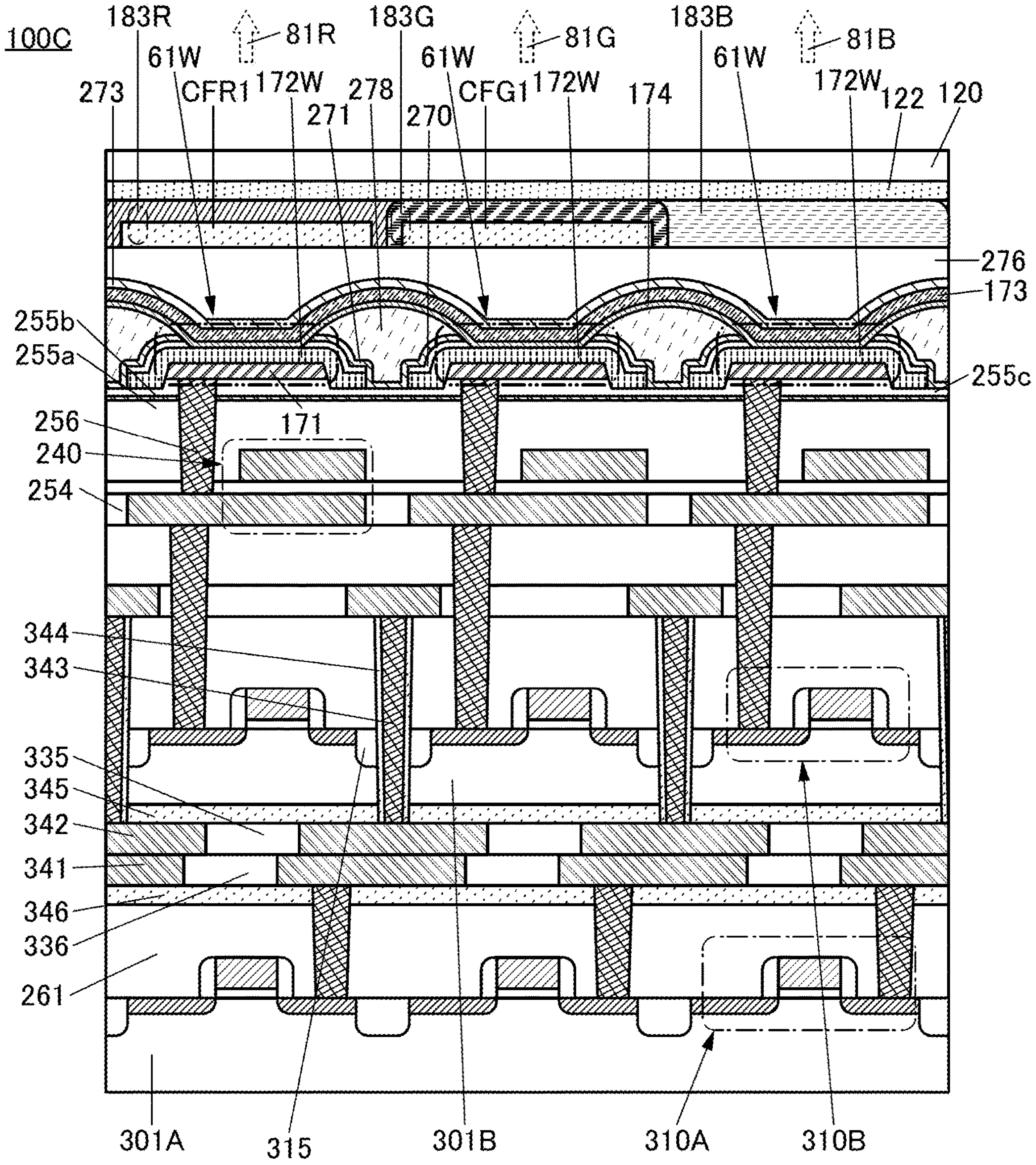
FIG. 14 illustrates a structure of a display apparatus of an embodiment.

FIG. 14 is a cross-sectional view illustrating a structure of a display apparatus 100C. The display apparatus 100C can be used as the display apparatus 100 of the display module 280, for example (see FIG. 12). Note that in the following description of display apparatuses, the description of portions similar to those of the above-described display apparatuses may be omitted.

The display apparatus 100C includes a substrate 301B and a substrate 301A. The display apparatus 100C includes a transistor 310B, the capacitor 240, the plurality of light-emitting devices 61W, and a transistor 310A. A channel of the transistor 310A is formed in part of the substrate 301A and a channel of the transistor 310B is formed in part of the substrate 301B.

[Insulating Layer 345 and Insulating Layer 346]

An insulating layer 345 is in contact with the bottom surface of the substrate 301B, and an insulating layer 346 is positioned over the insulating layer 261. For example, an inorganic insulating film that can be used as the protective layer 273 can be used as the insulating layers 345 and 346. The insulating layers 345 and 346 function as protective layers and can inhibit impurities from being diffused into the substrates 301B and 301A.

[Plug 343]

A plug 343 penetrates the substrate 301B and the insulating layer 345. An insulating layer 344 covers the side surface of the plug 343. For example, the inorganic insulating film that can be used as the protective layer 273 can be used as the insulating layer 344. The insulating layer 344 functions as a protective layer and can inhibit impurities from being diffused into the substrate 301B.

[Conductive Layer 342]

A conductive layer 342 is located between the insulating layer 345 and the insulating layer 346. The conductive layer 342 is embedded in an insulating layer 335, and a plane formed by the conductive layer 342 and the insulating layer 335 is preferably flat. Note that the conductive layer 342 is electrically connected to the plug 343.

[Conductive Layer 341]

A conductive layer 341 is located between the insulating layer 346 and the insulating layer 335. It is preferable that the conductive layer 341 be embedded in an insulating layer 336 and a plane formed by the conductive layer 341 and the insulating layer 336 be flat. The conductive layer 341 is bonded to the conductive layer 342. Thus, the substrate 301A is electrically connected to the substrate 301B.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (e.g., a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

<<Display Apparatus 100D>>

Figure 15:
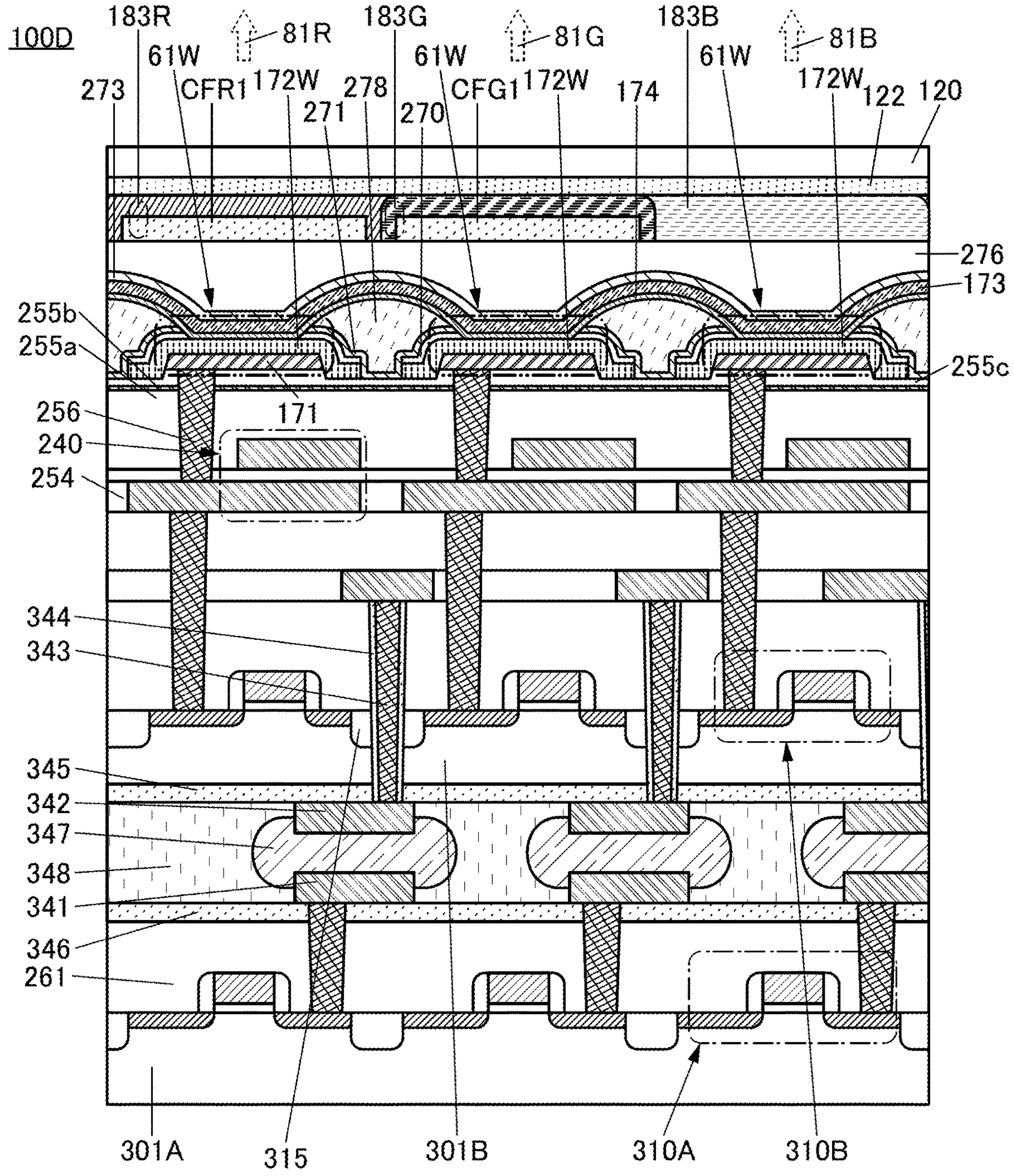
FIG. 15 illustrates a structure of a display apparatus of an embodiment.

FIG. 15 is a cross-sectional view illustrating a structure of a display apparatus 100D. The display apparatus 100D can be used as the display apparatus 100 of the display module 280, for example (see FIG. 12).

The display apparatus 100D includes a bump 347, and the bump 347 bonds the conductive layer 341 to the conductive layer 342. The bump 347 electrically connects the conductive layer 341 to the conductive layer 342. The bump 347 can be formed using a conductive material containing gold (Au), nickel (Ni), indium (In), tin (Sn), or the like, for example. Solder can be used for the bump 347, for example.

The display apparatus 100D includes a bonding layer 348. The bonding layer 348 attaches the insulating layer 345 to the insulating layer 346.

<<Display Apparatus 100E>>

Figure 16:
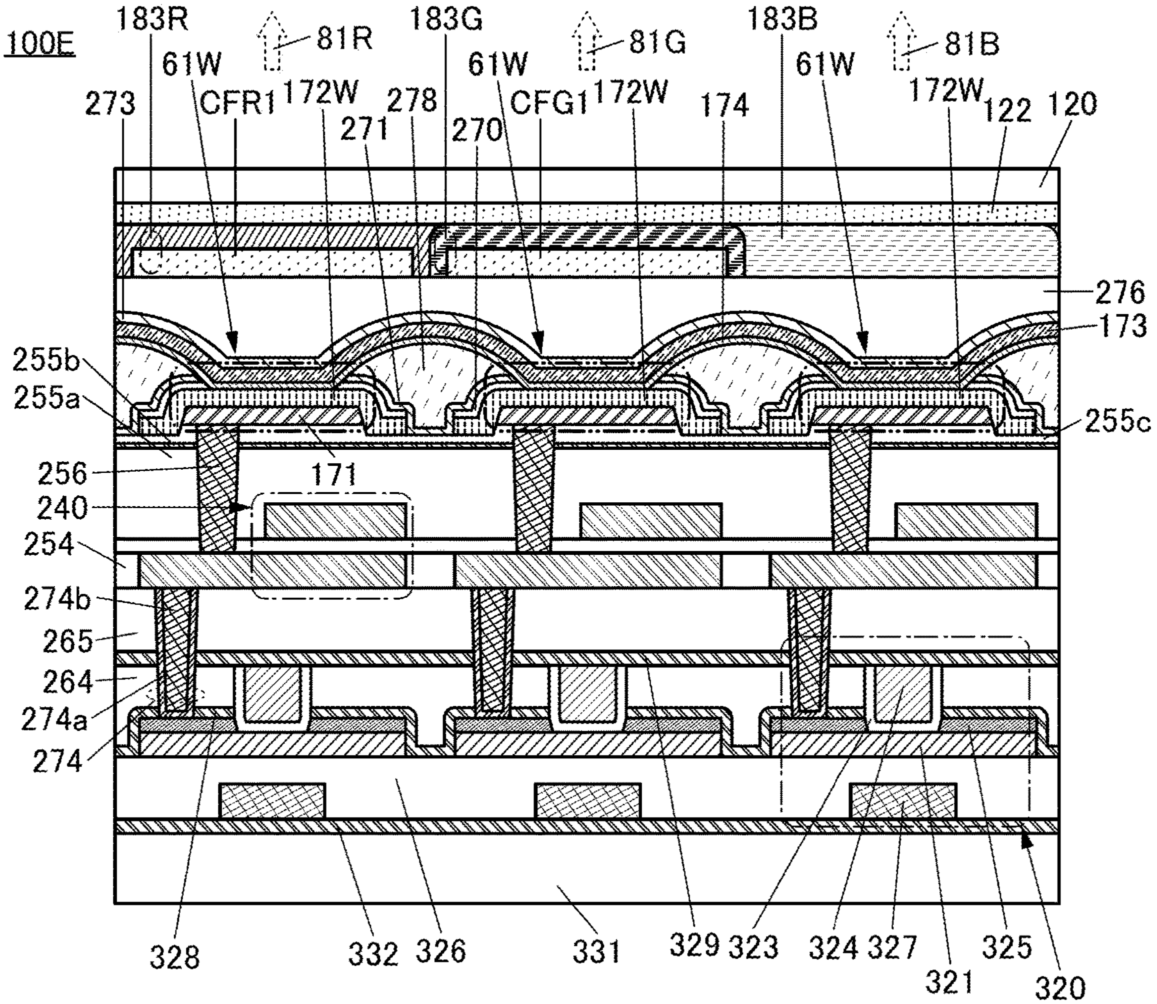
FIG. 16 illustrates a structure of a display apparatus of an embodiment.

FIG. 16 is a cross-sectional view illustrating a structure of a display apparatus 100E. The display apparatus 100E can be used as the display apparatus 100 of the display module 280, for example (see FIG. 12). A substrate 331 corresponds to the substrate 71 in FIG. 12. An insulating substrate or a semiconductor substrate can be used as the substrate 331. The display apparatus 100E includes a transistor 320. Note that the display apparatus 100E is different from the display apparatus 100A in that the transistor is an OS transistor.

[Insulating Layer 332]

An insulating layer 332 is provided over the substrate 331. For example, a film in which hydrogen or oxygen is less likely to be diffused than in a silicon oxide film can be used as the insulating layer 332. Specifically, an aluminum oxide film, a hafnium oxide film, a silicon nitride film, or the like can be used as the insulating layer 332. Thus, the insulating layer 332 can prevent impurities such as water or hydrogen from being diffused from the substrate 331 into the transistor 320. Furthermore, oxygen can be prevented from being released from a semiconductor layer 321 to the insulating layer 332 side.

[Transistor 320]

The transistor 320 includes the semiconductor layer 321, an insulating layer 323, a conductive layer 324, a pair of conductive layers 325, an insulating layer 326, and a conductive layer 327.

The conductive layer 327 is provided over the insulating layer 332 and functions as a first gate electrode of the transistor 320. The insulating layer 326 covers the conductive layer 327. Part of the insulating layer 326 functions as a first gate insulating layer. The insulating layer 326 includes an oxide insulating film at least in a region in contact with the semiconductor layer 321. Specifically, a silicon oxide film or the like is preferably used. The insulating layer 326 has a flat top surface. The semiconductor layer 321 is provided over the insulating layer 326. A metal oxide film having semiconductor characteristics can be used as the semiconductor layer 321. The pair of conductive layers 325 is provided on and in contact with the semiconductor layer 321, and functions as a source electrode and a drain electrode.

[Insulating Layer 328 and Insulating Layer 264]

An insulating layer 328 covers the top and side surfaces of the pair of conductive layers 325, the side surface of the semiconductor layer 321, and the like. An insulating layer 264 is provided over the insulating layer 328 and functions as an interlayer insulating layer. The insulating layers 328 and 264 have an opening reaching the semiconductor layer 321. For example, an insulating film similar to the insulating layer 332 can be used as the insulating layer 328. Thus, the insulating layer 328 can prevent impurities such as water and hydrogen from being diffused from the insulating layer 264 into the semiconductor layer 321. Furthermore, oxygen can be prevented from being released from the semiconductor layer 321.

[Insulating Layer 323]

The insulating layer 323 is in contact with the side surfaces of the insulating layers 264 and 328 and the conductive layer 325 and the top surface of the semiconductor layer 321 inside the opening.

[Conductive Layer 324]

Inside the opening, the conductive layer 324 is embedded and in contact with the insulating layer 323. The conductive layer 324 has a top surface subjected to planarization treatment, and is level with or substantially level with the top surface of the insulating layer 323 and the top surface of the insulating layer 264. The conductive layer 324 functions as a second gate electrode, and the insulating layer 323 functions as a second gate insulating layer.

[Insulating Layer 329 and Insulating Layer 265]

An insulating layer 329 covers the conductive layer 324 and the insulating layers 323 and 264. An insulating layer 265 is provided over the insulating layer 329 and functions as an interlayer insulating layer. For example, an insulating film similar to the insulating layers 328 and 332 can be used as the insulating layer 329. Thus, impurities such as water or hydrogen can be prevented from being diffused from the insulating layer 265 into the transistor 320, for example.

[Plug 274]

A plug 274 is embedded in the insulating layers 265, 329, 264, and 328 and is electrically connected to one of the pair of conductive layers 325. The plug 274 includes a conductive layer 274*a* and a conductive layer 274*b*. The conductive layer 274*a* is in contact with each of the side surfaces of openings in the insulating layers 265, 329, 264, and 328. In addition, the conductive layer 274*a* covers part of the top surface of the conductive layer 325. The conductive layer 274*b* is in contact with the top surface of the conductive layer 274*a*. For example, a conductive material in which hydrogen and oxygen are less likely to be diffused can be suitably used for the conductive layer 274*a*.

<<Display Apparatus 100F>>

Figure 17:
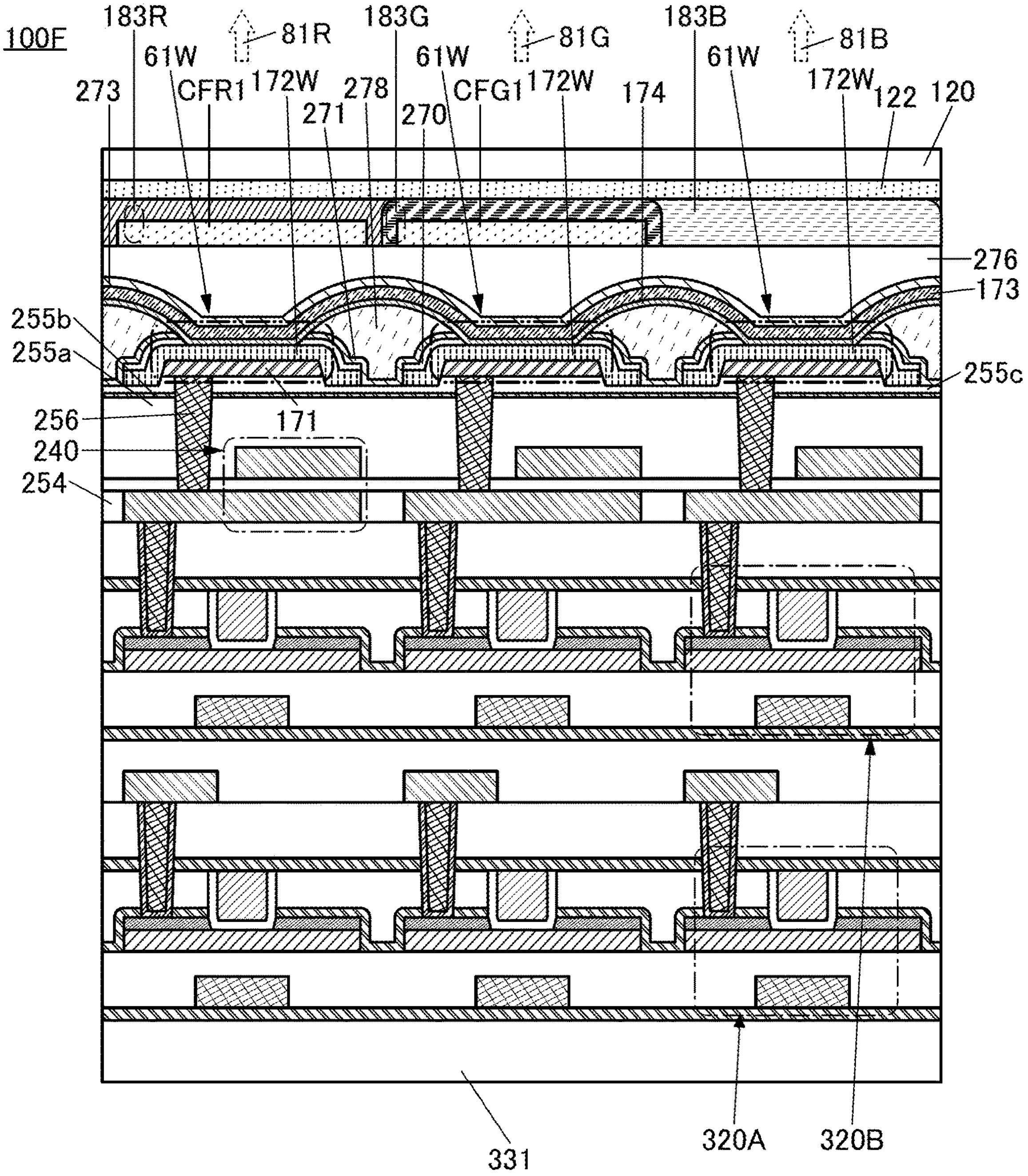
FIG. 17 illustrates a structure of a display apparatus of an embodiment.

FIG. 17 is a cross-sectional view illustrating a structure of a display apparatus 100F. The display apparatus 100F has a structure in which a transistor 320A and a transistor 320B are stacked. Each of the transistors 320A and 320B includes an oxide semiconductor and a channel formed in the oxide semiconductor. Note that the structure of the display apparatus 100F is not limited to the stacked structure of two transistors, and may be a structure in which three or more transistors are stacked, for example.

The structures of the transistor 320A and the peripheral components are the same as those of the transistor 320 and the peripheral components of the display apparatus 100E. The structures of the transistor 320B and the peripheral components are the same as those of the transistor 320 and the peripheral components of the display apparatus 100E.

<<Display Apparatus 100G>>

Figure 18:
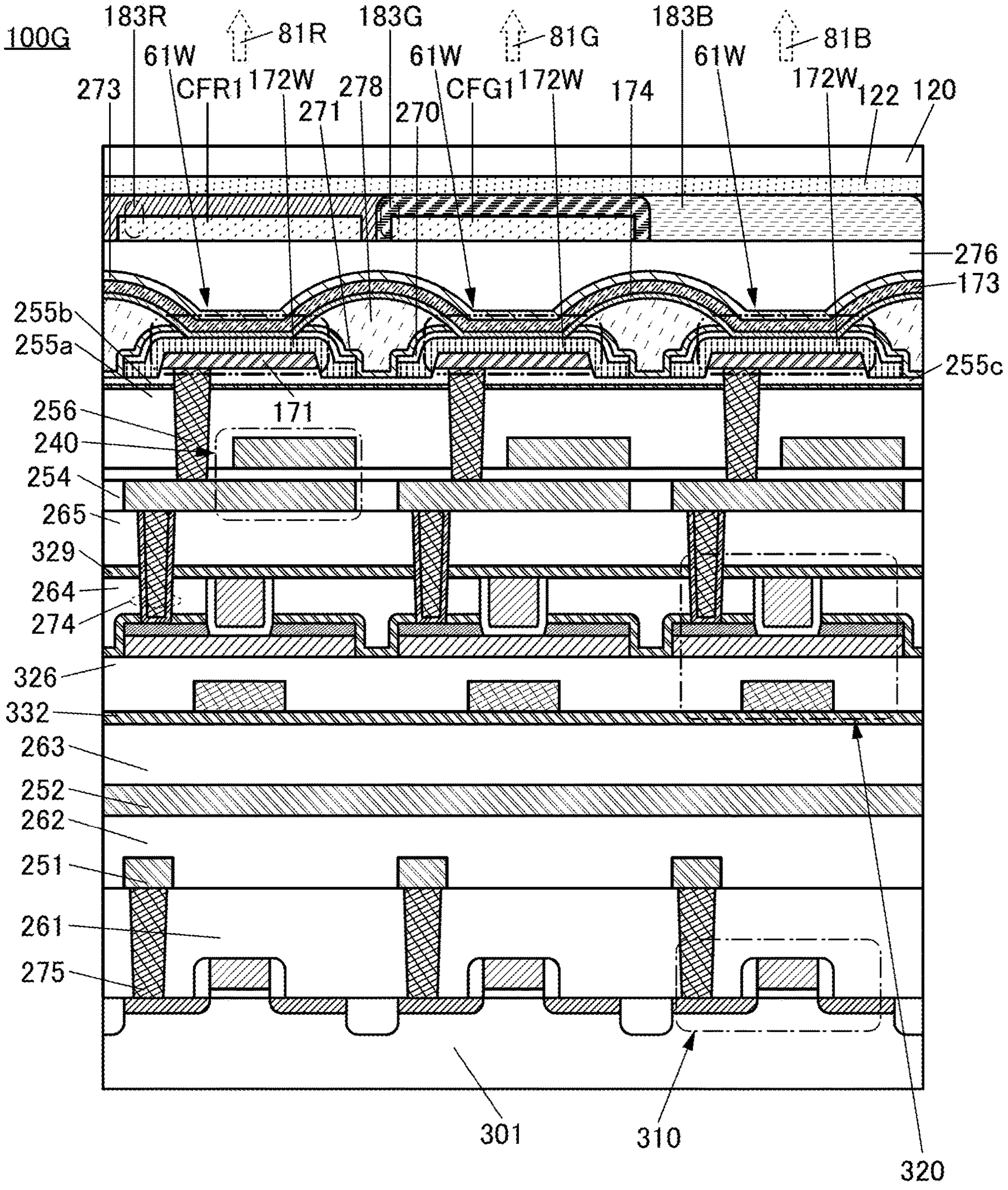
FIG. 18 illustrates a structure of a display apparatus of an embodiment.

FIG. 18 is a cross-sectional view illustrating a structure of a display apparatus 100G. The display apparatus 100G has a structure in which the transistor 310 and the transistor 320 are stacked. The channel of the transistor 310 is formed in the substrate 301. The transistor 320 includes an oxide semiconductor and the channel formed in the oxide semiconductor.

The insulating layer 261 covers the transistor 310 and a conductive layer 251 is provided over the insulating layer 261. An insulating layer 262 covers the conductive layer 251 and a conductive layer 252 is provided over the insulating layer 262. An insulating layer 263 and the insulating layer 332 covers the conductive layer 252. The conductive layer 251 and the conductive layer 252 each function as a wiring.

The transistor 320 is provided over the insulating layer 332 and the insulating layer 265 covers the transistor 320. The capacitor 240 is provided over the insulating layer 265 and is electrically connected to the transistor 320 through the plug 274.

For example, the transistor 320 can be used as a transistor included in a pixel circuit. For another example, the transistor 310 can be used as a transistor included in a pixel circuit or for a driver circuit (e.g., a gate driver circuit or a source driver circuit) for driving the pixel circuit. The transistor 310 and the transistor 320 can be used for a variety of circuits such as an arithmetic circuit and a memory circuit. Thus, not only a pixel circuit but also a driver circuit can be provided directly under the light-emitting device, for example. The display apparatus can be downsized as compared to the case where a driver circuit is provided around a display region.

At least part of this embodiment can be implemented in combination with any of the other embodiments described in this specification, as appropriate.

Embodiment 10

In this embodiment, a display apparatus of one embodiment of the present invention will be described.

<Display Module>

Figure 19:
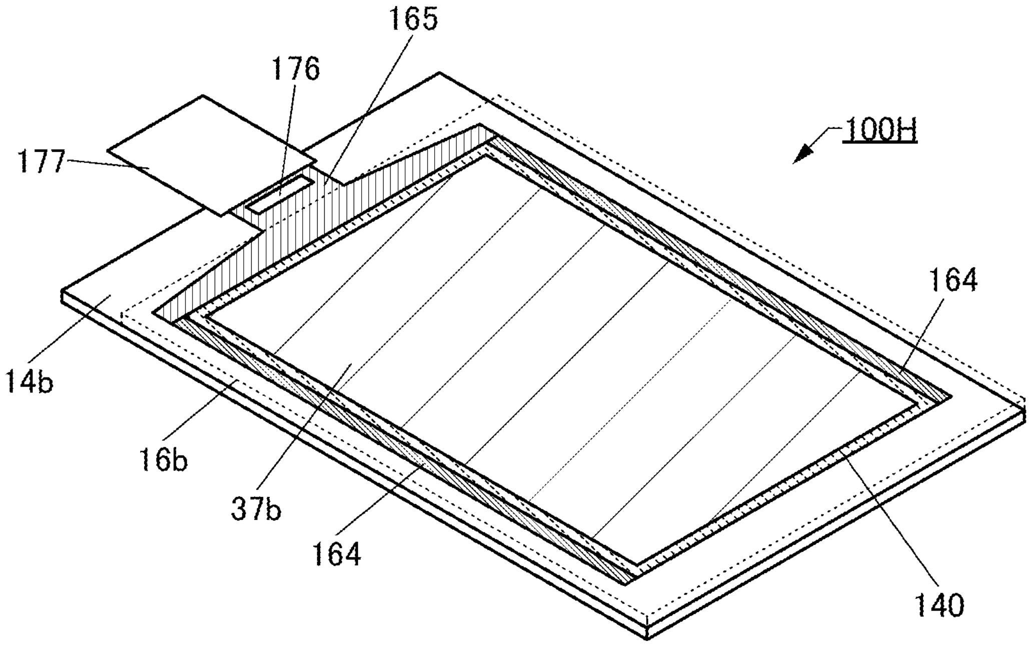
FIG. 19 illustrates a structure of a display module of an embodiment.

FIG. 19 is a perspective view illustrating a structure of a display module.

The display module includes a display apparatus 100H, an integrated circuit (IC), and one of an FPC 177 and a connector. The display apparatus 100H is electrically connected to an IC 176 and the FPC 177. The FPC 177 is supplied with a signal and electric power from the outside and supplies the signal and the electric power to the display apparatus 100H. Note that a connector is a mechanical component for electrical connection through a conductor, and the conductor can electrically connect the display apparatus 100H to a component to be connected. For example, the FPC 177 can be used as the conductor. The connector can detach the display apparatus 100H from the connected component.

The display module includes the IC 176. For example, the IC 176 can be provided for a substrate 14*b* by a chip on glass (COG) method. Alternatively, the IC 176 can be provided for an FPC by a chip on film (COF) method, for example. Note that a gate driver circuit, a source driver circuit, or the like can be used as the IC 176.

<<Display Apparatus 100H>>

Figures 20A, 20B, 20C:
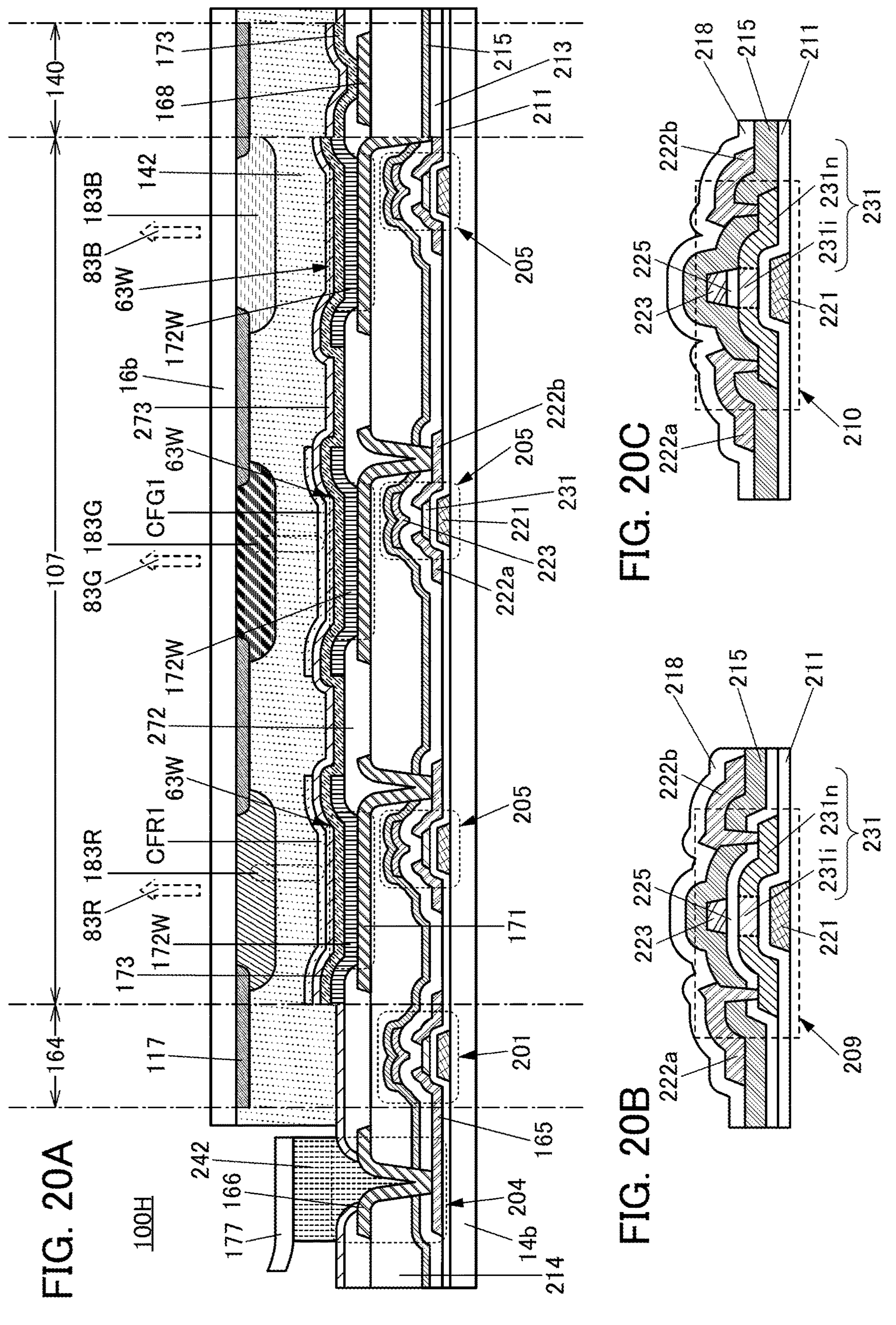
FIGS. 20A to 20C illustrate a structure of a display apparatus of an embodiment.

FIG. 20A is a cross-sectional view illustrating a structure of the display apparatus 100H.

The display apparatus 100H includes a display portion 37*b*, a connection portion 140, a circuit 164, a wiring 165, and the like. The display apparatus 100H includes a substrate 16*b* and the substrate 14*b*, which are bonded to each other. The display apparatus 100H includes one or more connection portions 140. The connection portion(s) can be provided outside the display portion 37*b*. For example, the connection portion can be provided along one side of the display portion 37*b*. Alternatively, the connection portion(s) can be provided along a plurality of sides, for example, the connection portion(s) can be provided to surround four sides. In the connection portion 140, a common electrode of a light-emitting device is electrically connected to a conductive layer, which supplies a predetermined potential to the common electrode.

The wiring 165 is supplied with a signal or electric power from the FPC 177 or the IC 176. The wiring 165 supplies a signal and electric power to the display portion 37*b* and the circuit 164.

For example, a gate driver circuit can be used as the circuit 164.

The display apparatus 100H includes the substrate 14*b*, the substrate 16*b*, a transistor 201, a transistor 205, a plurality of light-emitting devices 63W, and the like (see FIG. 20A).

The light-emitting device 63W can emit light including blue light. For example, the light-emitting device 63W can emit blue light, light including blue and green light, or white light.

The display apparatus 100H includes the layer 183R, the layer 183G, and the layer 183B.

[Layer 183R, Layer 183G, and Layer 183B]

The layer 183R includes a region overlapping with one light-emitting device 63W, the layer 183G includes a region overlapping with another light-emitting device 63W, the layer 183B includes a region overlapping with another light-emitting device 63W.

The layer 183R includes the layer CFR1, and the layer CFR1 contains a color conversion material. The layer 183G includes the layer CFG1, and the layer CFG1 contains a color conversion material. The layer 183B contains a color conversion material and functions as a color filter.

Accordingly, for example, the layer 183R can convert light emitted by the light-emitting device 63W into red light and transmit the light, the layer 183G can convert light emitted by the light-emitting device 63W into green light and transmit the light, and the layer 183B can transmit blue light included in light emitted by the light-emitting device 63W.

Note that a variety of optical members can be provided on the outer side of the substrate 16*b*. For example, a polarizing plate, a retardation plate, a light diffusion layer (e.g., a diffusion film), an anti-reflection layer, a light-condensing film, or the like can be provided.

The light-emitting device 63W includes the conductive layer 171 and the EL layer 172W. For example, the light-emitting device described in any one of Embodiments 2 to 6 can be used as the light-emitting device 63W.

The light-emitting device 63W includes the conductive layer 171, and the conductive layer 171 functions as a pixel electrode. The conductive layer 171 includes a depression portion, which overlaps with an opening provided in an insulating layer 214, an insulating layer 215, and an insulating layer 213. The transistor 205 includes a conductive layer 222*b*, and the conductive layer 222*b* is electrically connected to the conductive layer 171.

The display apparatus 100H includes an insulating layer 272. The insulating layer 272 covers an end portion of the conductive layer 171 to fill the depression portion of the conductive layer 171 (see FIG. 20A).

The display apparatus 100H includes the protective layer 273 and a bonding layer 142. The protective layer 273 covers the plurality of light-emitting devices 63W. The protective layer 273 and the substrate 16*b* are attached to each other with the bonding layer 142. The bonding layer 142 fills a space between the substrate 16*b* and the protective layer 273. Note that the bonding layer 142 may be formed in a frame shape so as not to overlap with the light-emitting devices and a region surrounded by the bonding layer 142, the substrate 16*b*, and the protective layer 273 may be filled with a resin different from the material of the bonding layer 142. Alternatively, a hollow sealing structure may be employed, in which the region is filled with an inert gas (e.g., nitrogen or argon). For example, the material that can be used for the bonding layer 122 can be used for the bonding layer 142.

The display apparatus 100H includes the connection portion 140, and the connection portion 140 includes a conductive layer 168. Note that a power supply potential is supplied to the conductive layer 168. The light-emitting device 63W includes a conductive layer 173. The conductive layer 168 is electrically connected to the conductive layer 173, and the conductive layer 173 is supplied with a power supply potential. Note that the conductive layer 173 functions as a common electrode. For example, the conductive layer 171 and the conductive layer 168 can be formed by processing one conductive film.

The display apparatus 100H has a top-emission structure. The light-emitting device 63W emits light toward the substrate 16*b* side. The conductive layer 171 contains a material reflecting visible light, and the conductive layer 173 contains a material transmitting visible light.

[Insulating Layer 211, Insulating Layer 213, Insulating Layer 215, and Insulating Layer 214]

An insulating layer 211, the insulating layer 213, the insulating layer 215, and the insulating layer 214 are provided in this order over the substrate 14*b*. Note that the number of insulating layers is not limited and each insulating layer may be a single layer or a stacked layer of two or more layers.

For example, an inorganic insulating film can be used as each of the insulating layers 211, 213, and 215. A silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

The insulating layers 215 and 214 cover the transistors. The insulating layer 214 functions as a planarization layer. For example, a material in which impurities such as water and hydrogen are less likely to be diffused is preferably used for the insulating layer 215 or the insulating layer 214. This can effectively inhibit impurities from being diffused to the transistors from the outside. Furthermore, the reliability of the display apparatus can be improved.

For example, an organic insulating layer can be favorably used as the insulating layer 214. Specifically, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used for the organic insulating layer. Alternatively, the insulating layer 214 can have a stacked layer structure of an organic insulating layer and an inorganic insulating layer. Thus, the outermost layer of the insulating layer 214 can be used as an etching protective layer. For example, in the case where a phenomenon of forming a depression portion in the insulating layer 214 should be avoided in processing the conductive layer 171 in a predetermined shape, the phenomenon can be inhibited.

[Transistor 201 and Transistor 205]

The transistor 201 and the transistor 205 are formed over the substrate 14*b*. These transistors can be fabricated using the same materials in the same steps.

Each of the transistors 201 and 205 includes a conductive layer 221, the insulating layer 211, a conductive layer 222*a*, the conductive layer 222*b*, a semiconductor layer 231, the insulating layer 213, and a conductive layer 223. The insulating layer 211 is located between the conductive layer 221 and the semiconductor layer 231. The conductive layer 221 functions as a gate and the insulating layer 211 functions as a first gate insulating layer. The conductive layer 222*a* and the conductive layer 222*b* function as a source and a drain. The insulating layer 213 is located between the conductive layer 223 and the semiconductor layer 231. The conductive layer 223 functions as a gate and the insulating layer 213 functions as a second gate insulating layer. Here, a plurality of layers obtained by processing the same conductive film are shown with the same hatching pattern.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gates may be provided above and below a semiconductor layer where a channel is formed.

The structure in which the semiconductor layer where a channel is formed is provided between two gates is used for the transistors 201 and 205. The two gates may be connected to each other and supplied with the same signal to operate the transistor. Alternatively, the threshold voltage of the transistor may be controlled by applying a potential for controlling the threshold voltage to one of the two gates and a potential for driving to the other of the two gates.

There is no particular limitation on the crystallinity of a semiconductor layer of the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case deterioration of the transistor characteristics can be suppressed.

The semiconductor layer of the transistor preferably contains a metal oxide. That is, an OS transistor is preferably used as the transistor included in the display apparatus of this embodiment.

[Semiconductor Layer]

For example, indium oxide, gallium oxide, and zinc oxide can be used for the semiconductor layer. The metal oxide preferably contains two or three kinds selected from indium, an element M, and zinc. The element M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, cobalt, and magnesium. Specifically, the element M is preferably one or more of aluminum, gallium, yttrium, and tin.

It is particularly preferable that an oxide containing indium (In), gallium (Ga), and zinc (Zn) (also referred to as IGZO) be used as the metal oxide used for the semiconductor layer. Alternatively, it is preferable to use an oxide containing indium, tin, and zinc (also referred to as ITZO (registered trademark)). It is preferable to use an oxide containing indium, gallium, tin, and zinc. It is preferable to use an oxide containing indium (In), aluminum (Al), and zinc (Zn) (also referred to as IAZO). It is preferable to use an oxide containing indium (In), aluminum (Al), gallium (Ga), and zinc (Zn) (also referred to as IAGZO).

When the metal oxide used for the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 1:3:2, 1:3:4, 2:1:3, 3:1:2, 4:2:3, 4:2:4.1, 5:1:3, 5:1:6, 5:1:8, 6:1:6, and 5:2:5 and a composition in the vicinity of any of the above atomic ratios. Note that the vicinity of the atomic ratio includes ±30% of an intended atomic ratio.

For example, when the atomic ratio is described as In:Ga:Zn=4:2:3 or a composition in the vicinity thereof, the case is included where the atomic ratio of Ga is greater than or equal to 1 and less than or equal to 3 and the atomic ratio of Zn is greater than or equal to 2 and less than or equal to 4 with the atomic ratio of In being 4. In addition, when the atomic ratio is described as In:Ga:Zn=5:1:6 or a composition in the vicinity thereof, the case is included where the atomic ratio of Ga is greater than 0.1 and less than or equal to 2 and the atomic ratio of Zn is greater than or equal to 5 and less than or equal to 7 with the atomic ratio of In being 5. Furthermore, when the atomic ratio is described as In:Ga:Zn=1:1:1 or a composition in the vicinity thereof, the case is included where the atomic ratio of Ga is greater than 0.1 and less than or equal to 2 and the atomic ratio of Zn is greater than 0.1 and less than or equal to 2 with the atomic ratio of In being 1.

The semiconductor layer may include two or more metal oxide layers having different compositions. For example, a stacked structure of a first metal oxide layer having In:M:Zn=1:3:4 [atomic ratio] or a composition in the vicinity thereof and a second metal oxide layer having In:M:Zn=1:1:1 [atomic ratio] or a composition in the vicinity thereof and being formed over the first metal oxide layer can be favorably employed. In particular, gallium or aluminum is preferably used as the element M.

Alternatively, a stacked structure of one selected from indium oxide, indium gallium oxide, and IGZO, and one selected from IAZO, IAGZO, and ITZO (registered trademark) may be employed, for example.

Examples of an oxide semiconductor having crystallinity include a c-axis-aligned crystalline oxide semiconductor (CAAC-OS) and a nanocrystalline oxide semiconductor (nc-OS).

Alternatively, a transistor using silicon in its channel formation region (a Si transistor) may be used. Examples of silicon include single crystal silicon, polycrystalline silicon, and amorphous silicon. In particular, a transistor containing low-temperature polysilicon (LTPS) in its semiconductor layer (also referred to as an LTPS transistor) can be used. The LTPS transistor has high field-effect mobility and excellent frequency characteristics.

With the use of Si transistors such as LTPS transistors, a circuit required to be driven at a high frequency (e.g., a data driver circuit) can be formed on the same substrate as the display portion. This allows simplification of an external circuit mounted on the display apparatus and a reduction in costs of parts and mounting costs.

An OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display apparatus can be reduced with the OS transistor.

To increase the luminance of the light-emitting device included in the pixel circuit, the amount of current fed through the light-emitting device needs to be increased. To increase the current amount, the source-drain voltage of a driving transistor included in the pixel circuit needs to be increased. An OS transistor has a higher withstand voltage between a source and a drain than a Si transistor; hence, high voltage can be applied between the source and the drain of the OS transistor. Therefore, when an OS transistor is used as the driving transistor in the pixel circuit, the amount of current flowing through the light-emitting device can be increased, so that the luminance of the light-emitting device can be increased.

When transistors are driven in a saturation region, a change in source-drain current relative to a change in gate-source voltage can be smaller in an OS transistor than in a Si transistor. Accordingly, when an OS transistor is used as the driving transistor included in the pixel circuit, a current flowing between the source and the drain can be minutely determined by controlling the gate-source voltage. Thus, the amount of current flowing through the light-emitting device can be controlled. Consequently, the number of gray levels expressed by the pixel circuit can be increased.

Regarding saturation characteristics of current flowing when transistors are driven in the saturation region, even when the source-drain voltage of an OS transistor increases gradually, a more stable current (saturation current) can be fed through the OS transistor than through a Si transistor. Thus, by using an OS transistor as the driving transistor, a stable current can be fed through light-emitting devices even when the current-voltage characteristics of the light-emitting devices vary, for example. In other words, when the OS transistor is driven in the saturation region, the source-drain current hardly changes with an increase in the source-drain voltage. Hence, the luminance of the light-emitting device can be stable.

As described above, by using OS transistors as the driving transistors included in the pixel circuits, it is possible to inhibit black-level degradation, increase the luminance, increase the number of gray levels, and suppress variations in characteristics of light-emitting devices, for example.

The transistors included in the circuit 164 and the transistors included in the display portion 107 may have the same structure or different structures. One structure or two or more kinds of structures may be employed for a plurality of transistors included in the circuit 164. Similarly, one structure or two or more kinds of structures may be employed for a plurality of transistors included in the display portion 107.

All transistors included in the display portion 107 may be OS transistors, or all transistors included in the display portion 107 may be Si transistors. Alternatively, some of the transistors included in the display portion 107 may be OS transistors and the others may be Si transistors.

For example, when both an LTPS transistor and an OS transistor are used in the display portion 107, the display apparatus can have low power consumption and high driving capability. Note that a structure in which an LTPS transistor and an OS transistor are used in combination is referred to as LTPO in some cases. For example, it is preferable that an OS transistor be used as a transistor functioning as a switch for controlling electrical continuity between wirings and an LTPS transistor be used as a transistor for controlling current.

For example, one transistor included in the display portion 107 functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased.

Another transistor included in the display portion 107 functions as a switch for controlling selection or non-selection of a pixel and can be referred to as a selection transistor. A gate of the selection transistor is electrically connected to a gate line, and one of a source and a drain thereof is electrically connected to a signal line. An OS transistor is preferably used as the selection transistor. In that case, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, high resolution, high display quality, and low power consumption.

Note that the display apparatus of one embodiment of the present invention has a structure including the OS transistor and the light-emitting device having an MML structure. This structure can significantly reduce a leakage current that would flow through a transistor and a leakage current that would flow between adjacent light-emitting devices. Displaying images on the display apparatus having this structure can bring one or more of image crispness, image sharpness, high color saturation, and a high contrast ratio to the viewer. When a leakage current that would flow through the transistor and a lateral leakage current that would flow between light-emitting devices are extremely low, display with little leakage of light at the time of black display (black-level degradation), for example, can be achieved.

In particular, current flowing between adjacent light-emitting devices having the MML structure can be extremely reduced.

[Transistor 209 and Transistor 210]

FIGS. 20B and 20C are cross-sectional views each illustrating another example of a cross-sectional structure of a transistor that can be used for the display apparatus 100H.

A transistor 209 and a transistor 210 each include the conductive layer 221, the insulating layer 211, the semiconductor layer 231, the conductive layer 222*a*, the conductive layer 222*b*, an insulating layer 225, the conductive layer 223, and the insulating layer 215. The semiconductor layer 231 includes a channel formation region 231*i* and a pair of low-resistance regions 231*n*. The insulating layer 211 is located between the conductive layer 221 and the channel formation region 231*i*. The conductive layer 221 functions as a gate and the insulating layer 211 functions as a first gate insulating layer. The insulating layer 225 is located at least between the conductive layer 223 and the channel formation region 231*i*. The conductive layer 223 functions as a gate, and the insulating layer 225 functions as a second gate insulating layer. The conductive layer 222*a* is electrically connected to one of the pair of low-resistance regions 231*n* and the conductive layer 222*b* is electrically connected to the other of the pair of low-resistance regions 231*n*. The insulating layer 215 covers the conductive layer 223. An insulating layer 218 covers the transistor.

Structure Example 1 of Insulating Layer 225

In the transistor 209, the insulating layer 225 covers the top and side surfaces of the semiconductor layer 231 (see FIG. 20B). The insulating layer 225 and the insulating layer 215 have openings, through which the conductive layers 222*a* and 222*b* are electrically connected to the low-resistance regions 231*n*. One of the conductive layers 222*a* and 222*b* functions as a source, and the other functions as a drain.

Structure Example 2 of Insulating Layer 225

In the transistor 210, the insulating layer 225 overlaps with the channel formation region 231*i* of the semiconductor layer 231 and does not overlap with the low-resistance regions 231*n* (see FIG. 20C). For example, the insulating layer 225 can be processed in a predetermined shape using the conductive layer 223 as a mask. The insulating layer 215 covers the insulating layer 225 and the conductive layer 223. The insulating layer 215 has openings, through which the conductive layers 222*a* and 222*b* are electrically connected to the low-resistance regions 231*n*.

[Connection Portion 204]

A connection portion 204 is provided for the substrate 14*b*. The connection portion 204 includes a conductive layer 166, and the conductive layer 166 is electrically connected to the wiring 165. Note that the connection portion 204 does not overlap with the substrate 16*b*, and the conductive layer 166 is exposed. Note that the conductive layer 166 and the conductive layer 171 can be formed by processing one conductive film. The conductive layer 166 is electrically connected to the FPC 177 through a connection layer 242. As the connection layer 242, for example, an anisotropic conductive film (ACF) or an anisotropic conductive paste (ACP) can be used.

<<Display Apparatus 100I>>

Figure 21:
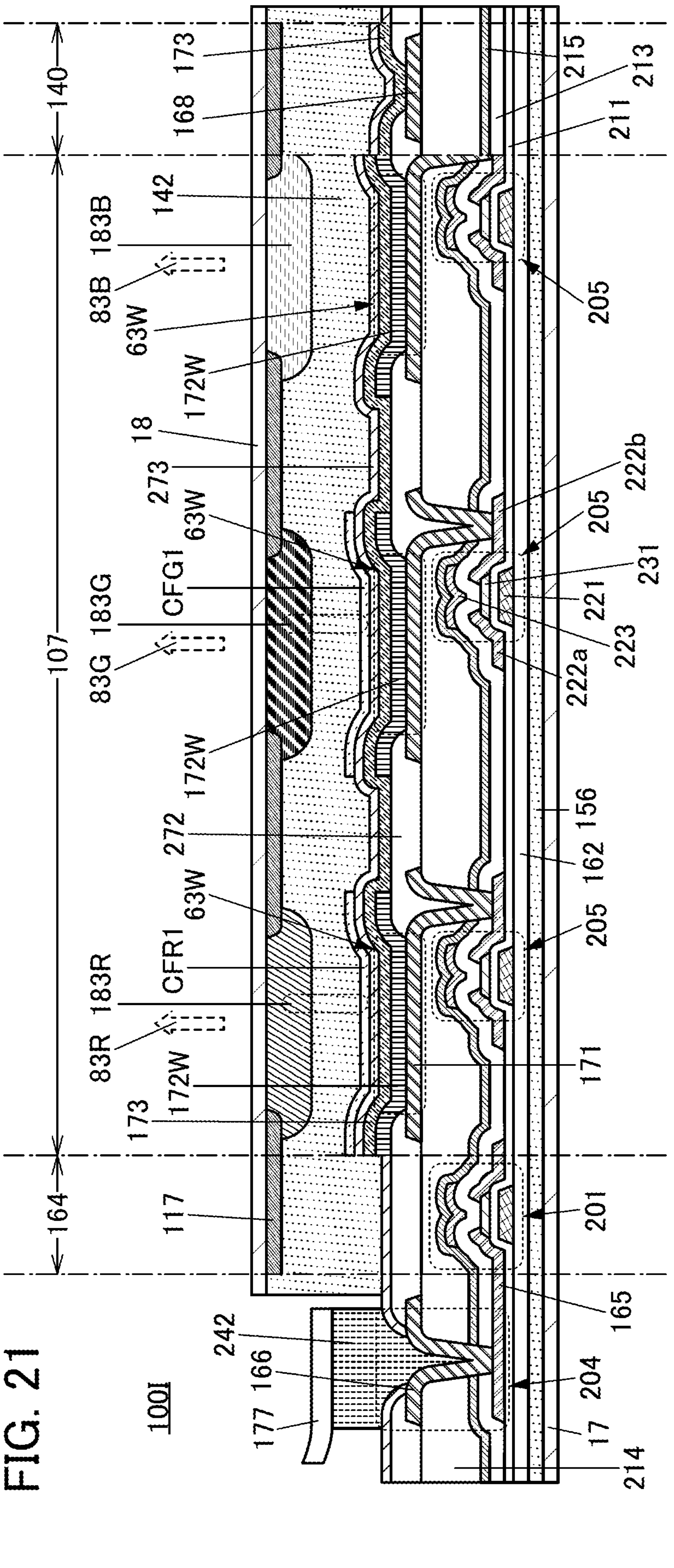
FIG. 21 illustrates a structure of a display apparatus of an embodiment.

FIG. 21 is a cross-sectional view illustrating a structure of a display apparatus 100I. The display apparatus 100I is different from the display apparatus 100H in having flexibility. In other words, the display apparatus 100I is a flexible display. The display apparatus 100I includes a substrate 17 and a substrate 18 instead of the substrate 14*b* and the substrate 16*b*, respectively. The substrates 17 and 18 both have flexibility.

The display apparatus 100I includes a bonding layer 156 and an insulating layer 162. The insulating layer 162 and the substrate 17 are attached to each other with the bonding layer 156. For example, the material that can be used for the bonding layer 122 can be used for the bonding layer 156. For example, the material that can be used for the insulating layer 211, the insulating layer 213, or the insulating layer 215 can be used for the insulating layer 162. Note that the transistors 201 and 205 are provided over the insulating layer 162.

For example, the insulating layer 162 is formed over a formation substrate, and the transistors, the light-emitting devices, and the like are formed over the insulating layer 162. Then, the bonding layer 142 is formed over the light-emitting devices 63, and the formation substrate and the substrate 18 are attached to each other with the bonding layer 142. After that, the formation substrate is separated from the insulating layer 162 and the surface of the insulating layer 162 is exposed. Then, the bonding layer 156 is formed on the exposed surface of the insulating layer 162, and the insulating layer 162 and the substrate 17 are attached to each other with the bonding layer 156. In this manner, the components formed over the formation substrate can be transferred onto the substrate 17, whereby the display apparatus 100I can be manufactured.

<<Display Apparatus 100J>>

Figure 22:
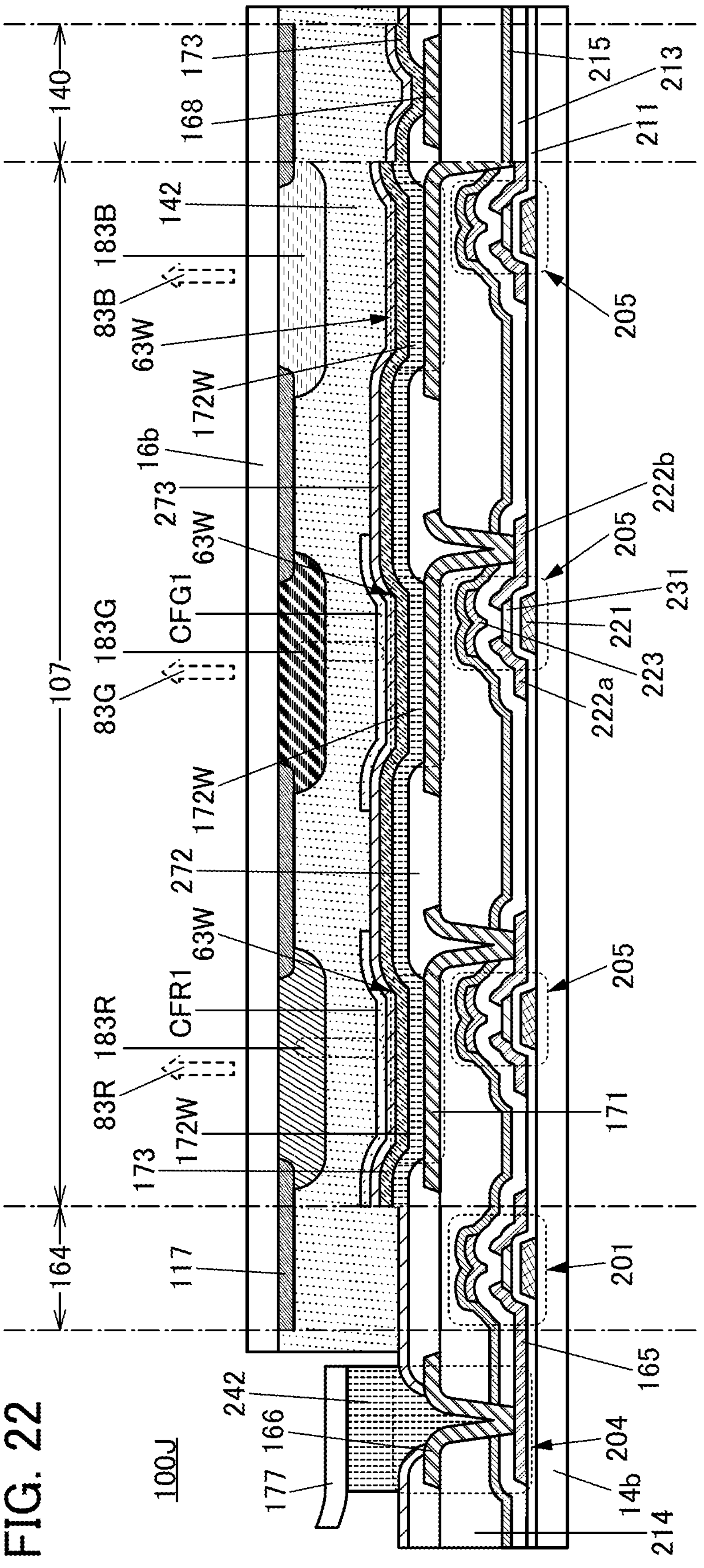
FIG. 22 illustrates a structure of a display apparatus of an embodiment.

FIG. 22 is a cross-sectional view illustrating a structure of a display apparatus 100J. The display apparatus 100J is different from the display apparatus 100H in that an EL layer 172 is continuous between the adjacent light-emitting devices 63W, instead of a structure where the EL layer 172W is divided between the adjacent light-emitting devices 63W.

The display apparatus 100J includes the layers 183R, 183G, and 183B between the substrate 16*b* and the substrate 14*b*. The layer 183R overlaps with one of the light-emitting devices 63W, the layer 183G overlaps with another light-emitting device 63W, and the layer 183B overlaps with another light-emitting device 63W.

The display apparatus 100J includes a light-blocking layer 117. For example, the light-blocking layer 117 is provided between the layers 183R and 183G, between the layers 183G and 183B, and between the layers 183B and 183R. The light-blocking layer 117 includes a region overlapping with the connection portion 140 and a region overlapping with the circuit 164.

The light-emitting device 63W can emit blue light, for example. Furthermore, for example, the layer 183R can convert light emitted by the light-emitting device 63W into red light and transmit the light, the layer 183G can convert light emitted by the light-emitting device 63W into green light and transmit the light, and the layer 183B can transmit blue light included in light emitted by the light-emitting device 63W. Accordingly, the display apparatus 100J can perform full color display, emitting red light 83R, green light 83G, and blue light 83B.

<<Display Apparatus 100K>>

Figure 23:
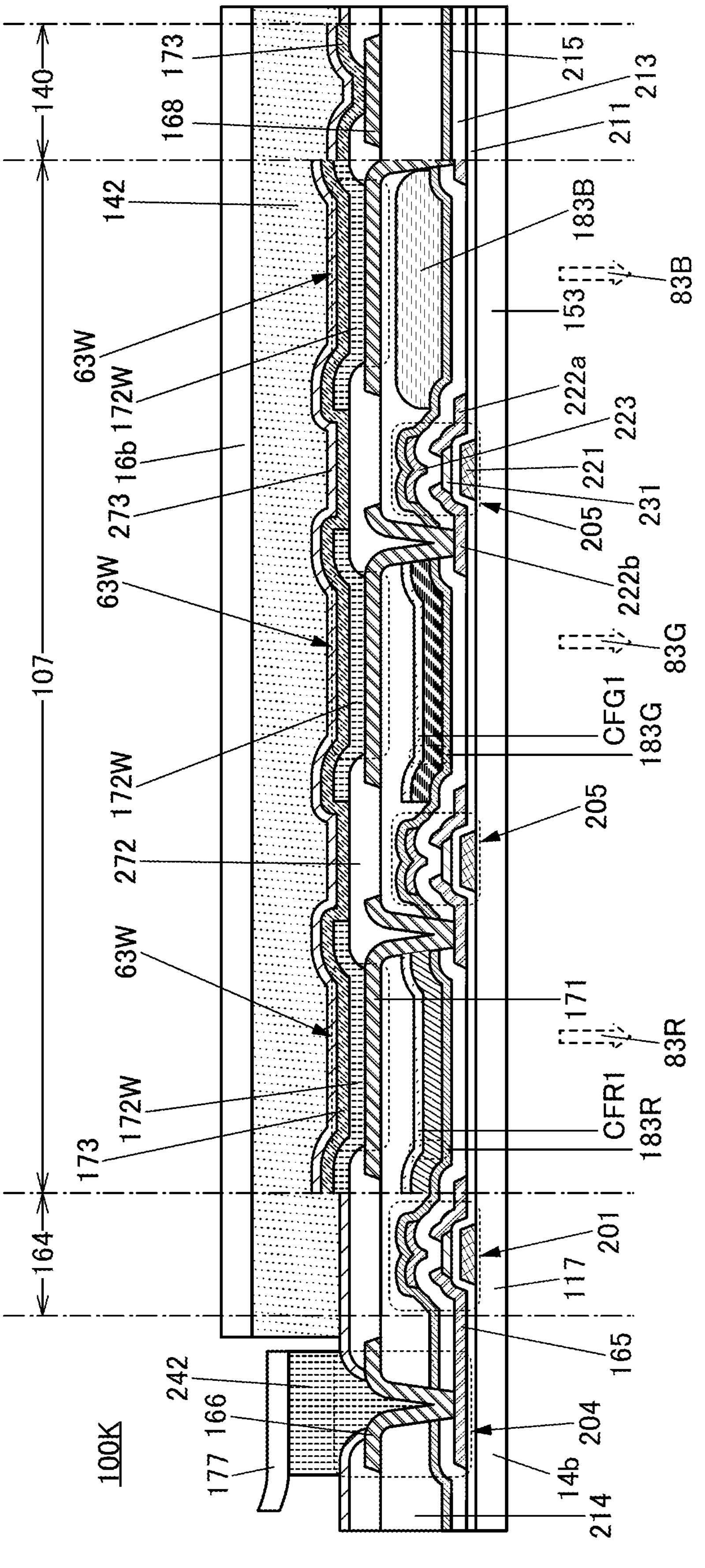
FIG. 23 illustrates a structure of a display apparatus of an embodiment.

FIG. 23 is a cross-sectional view illustrating a structure of a display apparatus 100K. The display apparatus 100K is of a bottom-emission type, which is different from the display apparatus 100H. The light-emitting device emits light to the substrate 14*b* side, and the light 83R, the light 83G, and the light 83B emitted by the display apparatus 100K are extracted from the substrate 14*b* side. A material transmitting visible light is used for the conductive layer 171. A material reflecting visible light is used for the conductive layer 173.

<<Display Apparatus 100L>>

Figure 24:
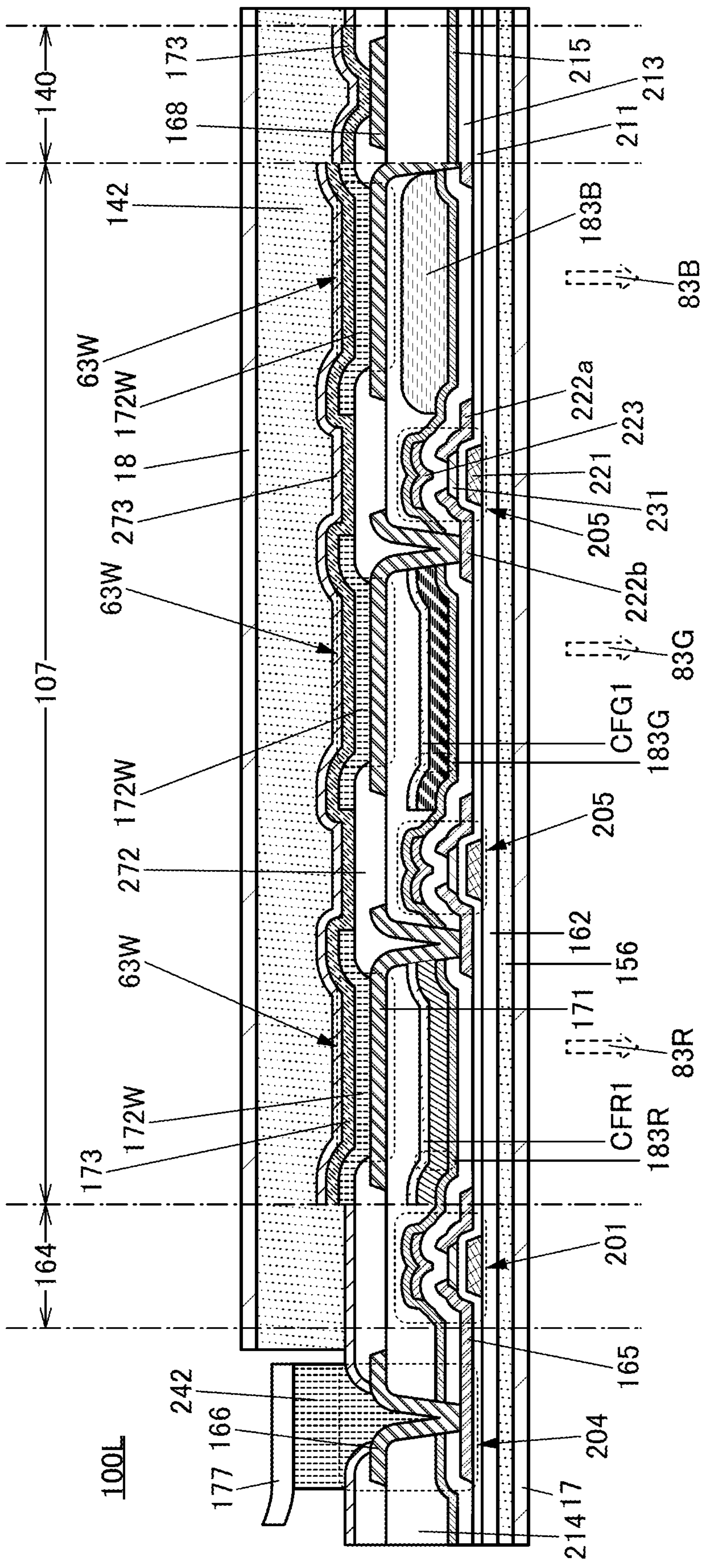
FIG. 24 illustrates a structure of a display apparatus of an embodiment.

FIG. 24 is a cross-sectional view illustrating a structure of a display apparatus 100L. The display apparatus 100L is of a bottom-emission type and has flexibility, which is different from the display apparatus 100H. The display apparatus 100L includes the substrate 17 and the substrate 18 instead of the substrate 14*b* and the substrate 16*b*, respectively. The substrate 17 and the substrate 18 each have flexibility. The light-emitting device emits light to the substrate 17 side, and the light 83R, the light 83G, and the light 83B emitted by the display apparatus 100L are extracted from the substrate 17 side.

The conductive layer 221 and the conductive layer 223 may have a property of transmitting visible light and a property of reflecting visible light. When the conductive layers 221 and 223 have a property of transmitting visible light, the visible-light transmittance in the display portion 107 can be improved. On the other hand, when the conductive layers 221 and 223 has a property of reflecting visible light, the amount of visible light entering the semiconductor layer 231 can be reduced. In addition, damage to the semiconductor layer 231 can be reduced. Accordingly, the reliability of the display apparatus 100K or the display apparatus 100L can be increased.

Even in a top-emission display apparatus such as the display apparatus 100H or the display apparatus 100I, at least part of the layers included in the transistor 205 may have a property of transmitting visible light. In this case, the conductive layer 171 also has a property of transmitting visible light. Accordingly, the display portion 107 can have the visible-light transmittance improved.

<<Display Apparatus 100M>>

Figure 25:
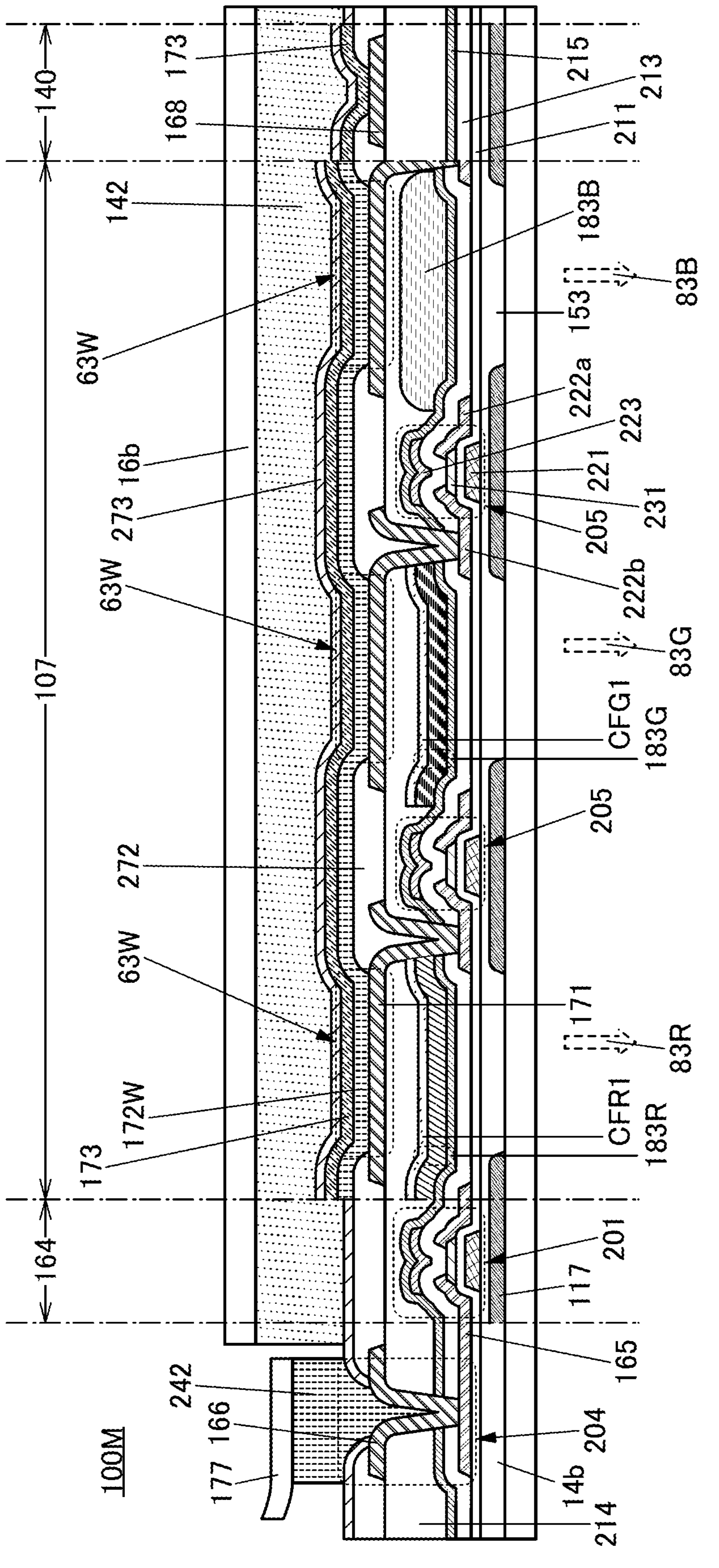
FIG. 25 illustrates a structure of a display apparatus of an embodiment.

FIG. 25 is a cross-sectional view illustrating a structure of a display apparatus 100M. The display apparatus 100M is different from the display apparatus 100H in that the EL layer 172W is continuous between the adjacent light-emitting devices 63W, instead of a structure where the EL layer 172W is divided between the adjacent light-emitting devices 63W and that the display apparatus 100M is of a bottom-emission type.

The display apparatus 100M includes the layer 183R, the layer 183G, and the layer 183B. The display apparatus 100M also includes the light-blocking layer 117.

[Light-Blocking Layer 117]

The light-blocking layer 117 is provided over the substrate 14*b* and located between the substrate 14*b* and the transistor 205. The insulating layer 153 is located between the light-blocking layer 117 and the transistor 205. For example, the light-blocking layer 117 does not overlap with the light-emitting device 63W. For example, the light-blocking layer 117 overlaps with the connection portion 140 and the circuit 164.

The light-blocking layer 117 can be provided in the display apparatus 100K or the display apparatus 100L. This case can inhibit light emitted by the light-emitting device 63W from being reflected by the substrate 14*b* and being diffused inside the display apparatus 100K or the display apparatus 100L, for example. Thus, the display apparatus 100K and the display apparatus 100L can provide high display quality.

<<Display Apparatus 100N>>

Figure 26:
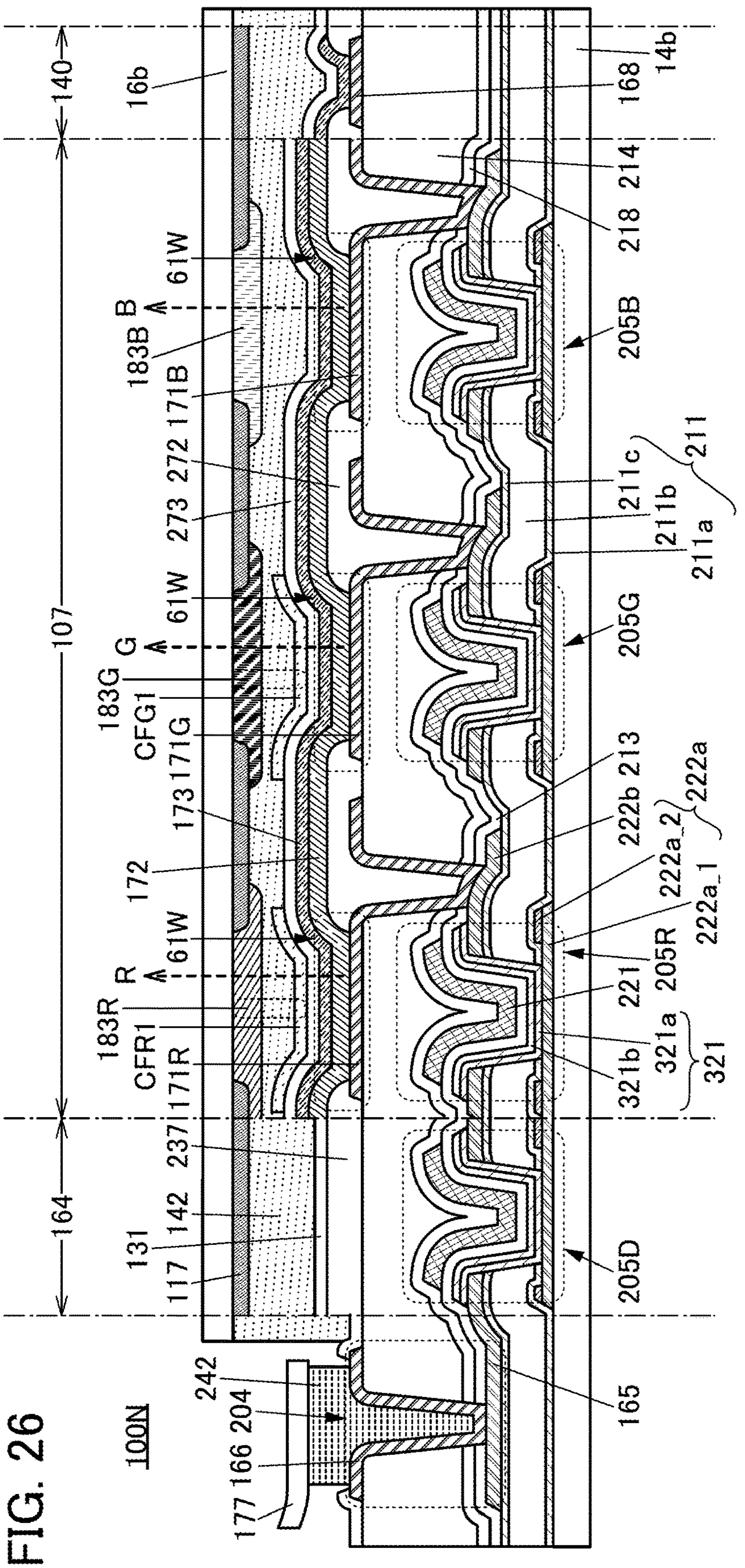
FIG. 26 illustrates a structure of a display apparatus of an embodiment.

FIG. 26 illustrates an example of cross sections of part of a region including the FPC 177, part of the circuit 164, part of the display portion 107, part of the connection portion 140, and part of a region including an end portion in a display apparatus 100N.

The display apparatus 100N illustrated in FIG. 26 includes a transistor 205D, a transistor 205R, a transistor 205G, a transistor 205B, the light-emitting device 61W, and the like between the substrate 14*b* and the substrate 16*b*.

Each of the transistors 205D, 205R, 205G, and 205B is formed over the substrate 14*b*. These transistors can be fabricated using the same material through the same process.

Specifically, the transistors 205D, 205R, 205G, and 205B each include the conductive layer 221 functioning as a gate, the insulating layer 213 functioning as a gate insulating layer, the conductive layer 222*a* and the conductive layer 222*b* functioning as a source and a drain, the semiconductor layer 321, and the insulating layer 211 (insulating layers 211*a*, 211*b*, and 211*c*). Here, a plurality of layers obtained by processing the same conductive film are shown with the same hatching pattern. The insulating layer 211 is located between the conductive layer 222*a* and the semiconductor layer 222*b*. The insulating layer 213 is located between the conductive layer 221 and the semiconductor layer 321.

The transistors included in the circuit 164 and the transistors included in the display portion 107 may have the same structure or different structures. A plurality of transistors included in the circuit 164 may have the same structure or two or more kinds of structures. Similarly, one structure or two or more kinds of structures may be employed for a plurality of transistors included in the display portion 107.

All of the transistors included in the display portion 107 may be OS transistors or Si transistors. Alternatively, some of the transistors included in the display portion 107 may be OS transistors and the others may be Si transistors.

For example, when both an LTPS transistor and an OS transistor are used in the display portion 107, the display device can have low power consumption and high drive capability. Note that a structure in which an LTPS transistor and an OS transistor are used in combination is referred to as LTPO in some cases. As a favorable example, a structure is given in which the OS transistor is used as a transistor functioning as a switch for controlling electrical continuity and discontinuity between wirings and the LTPS transistor is used as a transistor for controlling current.

For example, one transistor included in the display portion 107 may function as a transistor for controlling current flowing through the light-emitting device and be referred to as a driving transistor. One of a source and a drain of the driving transistor is electrically connected to the pixel electrode of the light-emitting device. An LTPS transistor is preferably used as the driving transistor. In that case, the amount of current flowing through the light-emitting device can be increased in the pixel circuit.

By contrast, another transistor included in the display portion 107 functions as a switch for controlling selection or non-selection of a pixel and can also be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

The insulating layer 218 is provided to cover the transistors 205D, 205R, 205G, and 205B and an insulating layer 214 is provided over the insulating layer 218.

The insulating layer 218 preferably functions as a protective layer of the transistors. A material through which impurities such as water and hydrogen are less likely to be diffused is preferably used for the insulating layer 218. This is because the insulating layer 218 can function as a barrier film. Such a structure can effectively inhibit diffusion of impurities into the transistors from the outside and increase the reliability of the display apparatus.

The insulating layer 218 preferably includes one or more inorganic insulating films. Examples of the inorganic insulating film include an oxide insulating film, a nitride insulating film, an oxynitride insulating film, and a nitride oxide insulating film. Specific examples of these inorganic insulating films are as described above.

The insulating layer 214 preferably has a function of a planarization layer, and an organic insulating film is suitably used. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, the insulating layer 214 may have a stacked-layer structure of an organic insulating film and an inorganic insulating film. The outermost layer of the insulating layer 214 preferably functions as an etching protective layer. Thus, the formation of a depression in the insulating layer 214 can be inhibited in processing conductive layers 171R, 171G, and 171B, for example. Alternatively, a depression may be formed in the insulating layer 214 in processing the conductive layers 171R, 171G, and 171B, for example.

The light-emitting device 61W is provided over the insulating layer 214.

The layers 183R, 183G, 183B and the like are provided for the surface of the substrate 16*b* which faces the substrate 14*b*.

One of the light-emitting devices 61W includes a conductive layer 171R, the EL layer 172 over the conductive layer 171R, and the conductive layer 173 over the EL layer 172. The layer 183R includes the layer CFR1, and the layer CFR1 contains a color conversion material. Accordingly, light emitted by the light-emitting device 61W is extracted as red light to the outside of the display apparatus 100N through the layer 183R.

Another light-emitting device 61W includes a conductive layer 171G, the EL layer 172 over the conductive layer 171G, and the conductive layer 173 over the EL layer 172. The layer 183G includes the layer CFG1, and the layer CFG1 contains a color conversion material. Accordingly, light emitted by the light-emitting device 61W is extracted as green light to the outside of the display apparatus 100N through the layer 183G.

Another light-emitting device 61W includes a conductive layer 171B, the EL layer 172 over the conductive layer 171B, and the conductive layer 173 over the EL layer 172. The layer 183B contains a color conversion material and functions as a color filter. Accordingly, light emitted by the light-emitting device 61W is extracted as blue light to the outside of the display apparatus 100N through the layer 183B.

The plurality of light-emitting devices 61W includes the EL layer 172 and the conductive layer 173. The number of manufacturing steps can be smaller in the case where the EL layer 172 is shared by subpixels of different colors than in the case where EL layers are independently provided for the subpixels of different colors.

The conductive layer 171R is electrically connected to the conductive layer 222*b* included in the transistor 205R through an opening provided in the insulating layers 213, 218, and 214. In a similar manner, the conductive layer 171G is electrically connected to the conductive layer 222*b* included in the transistor 205G and the conductive layer 171B is electrically connected to the conductive layer 222*b* included in the transistor 205B.

End portions of the conductive layer 171R, 171G, and 171B are covered with the insulating layer 272. The insulating layer 272 functions as a partition (also referred to as a bank or a spacer). The insulating layer 272 can have a single-layer structure or a stacked-layer structure including one or both of an inorganic insulating material and an organic insulating material. A material that can be used for the insulating layer 218 and a material that can be used for the insulating layer 214 can be used for the insulating layer 272, for example. The insulating layer 272 can electrically isolate the pixel electrode and the common electrode. Furthermore, the insulating layer 272 can electrically isolate light-emitting devices adjacent to each other.

The conductive layer 173 is a continuous film shared by the plurality of light-emitting devices 61W. The conductive layer 173 shared by the plurality of light-emitting devices 61W is electrically connected to the conductive layer 168 provided in the connection portion 140. The conductive layer 168 is preferably formed using a conductive layer formed using the same material through the same process as the conductive layers 171R, 171G, and 171B.

The protective layer 273 is provided over the plurality of light-emitting devices 61W. The protective layer 273 and the substrate 16*b* are attached to each other with the bonding layer 142. The substrate 16*b* is provided with the light-blocking layer 117. A solid sealing structure, a hollow sealing structure, or the like can be employed to seal the light-emitting devices. In FIG. 26, a solid sealing structure is employed, in which a space between the substrate 16*b* and the substrate 14*b* is filled with the bonding layer 142. Alternatively, a hollow sealing structure may be employed, in which the space is filled with an inert gas (e.g., nitrogen or argon). In that case, the bonding layer 142 may be provided not to overlap with the light-emitting device. Alternatively, the space may be filled with a resin other than the frame-like bonding layer 142.

The protective layer 273 is provided at least in the display portion 107, and preferably provided to cover the entire display portion 107. The protective layer 273 is preferably provided to cover not only the display portion 107 but also the connection portion 140 and the circuit 164. It is further preferable that the protective layer 273 be provided to extend to the end portion of the display apparatus 100N. Meanwhile, the connection portion 204 has a portion not provided with the protective layer 273 so that the FPC 177 and the conductive layer 166 are electrically connected to each other.

Providing the protective layer 273 over the light-emitting devices 61W can improve the reliability of the light-emitting devices.

The protective layer 273 may have a single-layer structure or a stacked-layer structure including two or more layers. There is no limitation on the conductivity of the protective layer 273. As the protective layer 273, at least one type of insulating films, semiconductor films, and conductive films can be used.

The protective layer 273 including an inorganic film can inhibit deterioration of the light-emitting devices by preventing oxidation of the conductive layer 173 and inhibiting entry of impurities (e.g., moisture and oxygen) into the light-emitting devices, for example; thus, the reliability of the display apparatus can be improved.

For the protective layer 273, an inorganic insulating film such as an oxide insulating film, a nitride insulating film, an oxynitride insulating film, or a nitride oxide insulating film can be used, for example. Specific examples of these inorganic insulating films are as described above. In particular, the protective layer 273 preferably includes a nitride insulating film or a nitride oxide insulating film, and further preferably includes a nitride insulating film.

An inorganic film containing ITO, In—Zn oxide, Ga—Zn oxide, Al—Zn oxide, IGZO, or the like can be used for the protective layer 273. The inorganic film preferably has high resistance, specifically, higher resistance than the conductive layer 173. The inorganic film may further contain nitrogen.

When light emitted from the light-emitting device is extracted through the protective layer 273, the protective layer 273 preferably has a good property of transmitting visible light. For example, ITO, IGZO, and aluminum oxide are preferable because they are inorganic materials having a high visible-light-transmitting property.

The protective layer 273 can be, for example, a stack of an aluminum oxide film and a silicon nitride film over the aluminum oxide film, or a stack of an aluminum oxide film and an IGZO film over the aluminum oxide film. Such a stacked-layer structure can inhibit entry of impurities (e.g., water and oxygen) into the EL layer.

Furthermore, the protective layer 273 may include an organic film. For example, the protective layer 273 may include both an organic film and an inorganic film. Examples of an organic film that can be used for the protective layer 273 include organic insulating films that can be used for the insulating layer 214.

The connection portion 204 is provided in a region of the substrate 14*b* not overlapping with the substrate 16*b*. In the connection portion 204, the wiring 165 is electrically connected to the FPC 177 through the conductive layer 166 and a connection layer 242. In this example, the conductive layer 166 is a single conductive layer obtained by processing the same conductive film as the conductive layers 171R, 171G, and 171B. On the top surface of the connection portion 204, the conductive layer 166 is exposed. Thus, the connection portion 204 and the FPC 177 can be electrically connected to each other through the connection layer 242.

The display apparatus 100N has a top-emission structure. Light from the light-emitting device is emitted toward the substrate 16*b* side. For the substrate 16*b*, a material having a high visible-light-transmitting property is preferably used. The conductive layers 171R, 171G, and 171B each contain a material reflecting visible light, and the conductive layer 173 contains a material transmitting visible light.

The light-blocking layer 117 is preferably provided on the surface of the substrate 16*b* on the substrate 14*b* side. The light-blocking layer 117 can be provided over a region between adjacent light-emitting devices, in the connection portion 140, in the circuit 164, and the like.

Moreover, a variety of optical members can be provided on the outside of the substrate 16*b* (the surface opposite to the substrate 14*b*). Examples of the optical members include a polarizing plate, a retardation plate, a light diffusion layer (e.g., a diffusion film), an anti-reflective layer, and a light-condensing film. Furthermore, an antistatic film inhibiting the attachment of dust, a water repellent film inhibiting the attachment of stain, a hard coat film inhibiting generation of a scratch caused by the use, an impact-absorbing layer, or the like may be provided as a surface protective layer on the outer surface of the substrate 16*b*. For example, it is preferable to provide, as the surface protective layer, a glass layer or a silica layer ($SiO_x$ layer) because the surface contamination or damage can be prevented. The surface protective layer may be formed using diamond like carbon (DLC), aluminum oxide ($AlO_x$), a polyester-based material, a polycarbonate-based material, or the like. For the surface protective layer, a material having high transmittance with respect to visible light is preferably used. The surface protective layer is preferably formed using a material with high hardness.

As the connection layer 242, an anisotropic conductive film (ACF), an anisotropic conductive paste (ACP), or the like can be used.

At least part of this embodiment can be implemented in combination with any of the other embodiments described in this specification, as appropriate.

Embodiment 11

In this embodiment, electronic devices of one embodiment of the present invention will be described.

Electronic devices of this embodiment each include the display apparatus of one embodiment of the present invention in a display portion. The display apparatus of one embodiment of the present invention is highly reliable and can be easily increased in resolution and definition. Thus, the light-emitting apparatus of one embodiment of the present invention can be used for display portions of a variety of electronic apparatuses.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and notebook personal computers, a monitor of a computer and the like, digital signage, and a large game machine such as a pachinko machine.

In particular, the display apparatus of one embodiment of the present invention can have a high definition, and thus can be favorably used for an electronic device having a relatively small display portion. Examples of such an electronic device include watch-type and bracelet-type information terminal devices (wearable devices) and wearable devices worn on the head, such as a VR device like a head-mounted display, a glasses-type AR device, and an MR device.

The definition of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, definition of 4K, 8K, or higher is preferable. The pixel density (resolution) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. With such a display apparatus having one or both of high definition and high resolution, the electronic device can provide higher realistic sensation, sense of depth, and the like in personal use such as portable use or home use. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, odor, or infrared rays).

The electronic device in this embodiment can have a variety of functions. For example, the electronic device in this embodiment can have a function of displaying a variety of data (e.g., a still image, a moving image, and a text image) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 27A to 27D. These wearable devices have at least one of a function of displaying AR contents, a function of displaying VR contents, a function of displaying SR contents, and a function of displaying MR contents. The electronic device having a function of displaying contents of at least one of AR, VR, SR, MR, and the like enables the user to feel a higher level of immersion.

Figure 27A:
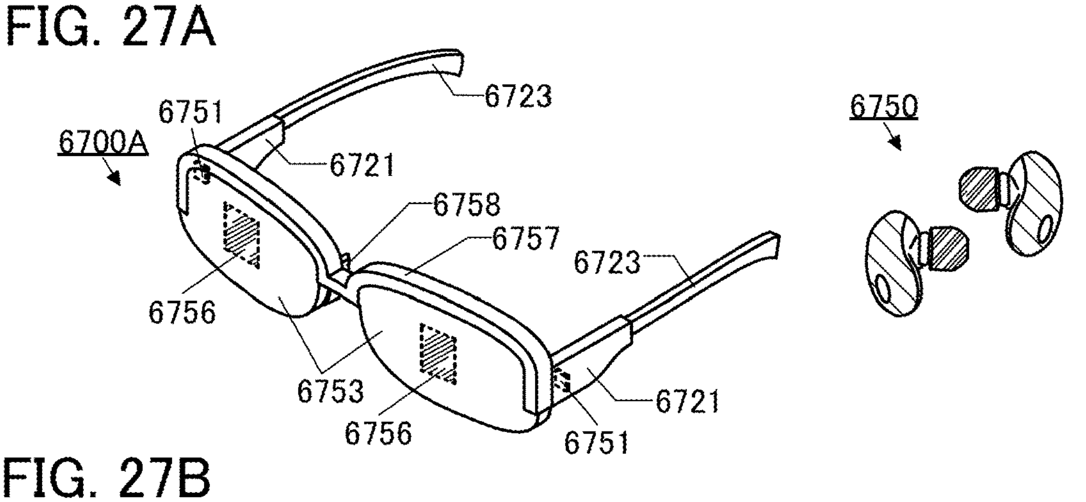
FIGS. 27A to 27D each illustrate one example of an electronic device of an embodiment.
Figure 27B:
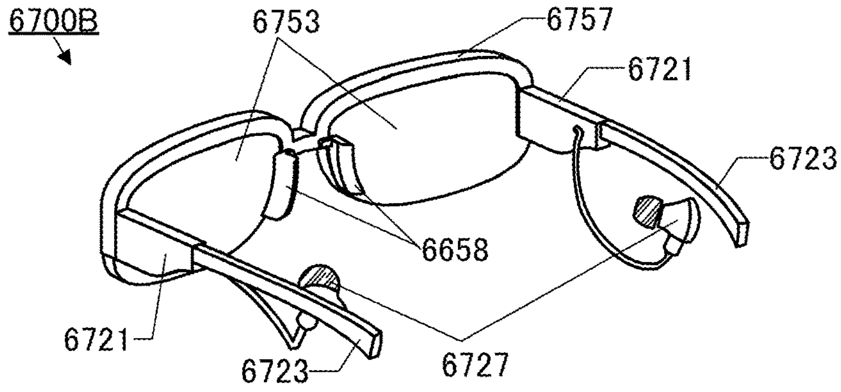

An electronic device 6700A illustrated in FIG. 27A and an electronic device 6700B illustrated in FIG. 27B each include a pair of display panels 6751, a pair of housings 6721, a communication portion (not illustrated), a pair of mounting portions 6723, a control portion (not illustrated), an imaging portion (not illustrated), a pair of optical members 6753, a frame 6757, and a pair of nose pads 6758.

The display apparatus of one embodiment of the present invention can be used for the display panels 6751. Thus, a highly reliable electronic device can be obtained.

The electronic devices 6700A and 6700B can each project images displayed on the display panels 6751 onto display regions 6756 of the optical members 6753. Since the optical members 6753 have a light-transmitting property, the user can see images displayed on the display regions, which are superimposed on transmission images seen through the optical members 6753. Accordingly, the electronic devices 6700A and 6700B are electronic devices capable of AR display.

In the electronic devices 6700A and 6700B, a camera capable of capturing images of the front side may be provided as the image capturing portion. Furthermore, when the electronic devices 6700A and 6700B are provided with an acceleration sensor such as a gyroscope sensor, the orientation of the user's head can be sensed and an image corresponding to the orientation can be displayed on the display regions 6756.

The communication portion includes a wireless communication device, and a video signal, for example, can be supplied by the wireless communication device. Instead of or in addition to the wireless communication device, a connector that can be connected to a cable for supplying a video signal and a power supply potential may be provided.

The electronic devices 6700A and 6700B are provided with a battery so that they can be charged wirelessly and/or by wire.

A touch sensor module may be provided in the housing 6721. The touch sensor module has a function of detecting a touch on the outer surface of the housing 6721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 6721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion element (also referred to as a photoelectric conversion device) can be used as a light-receiving element. One or both of an inorganic semiconductor and an organic semiconductor can be used for an active layer of the photoelectric conversion element.

Figure 27C:
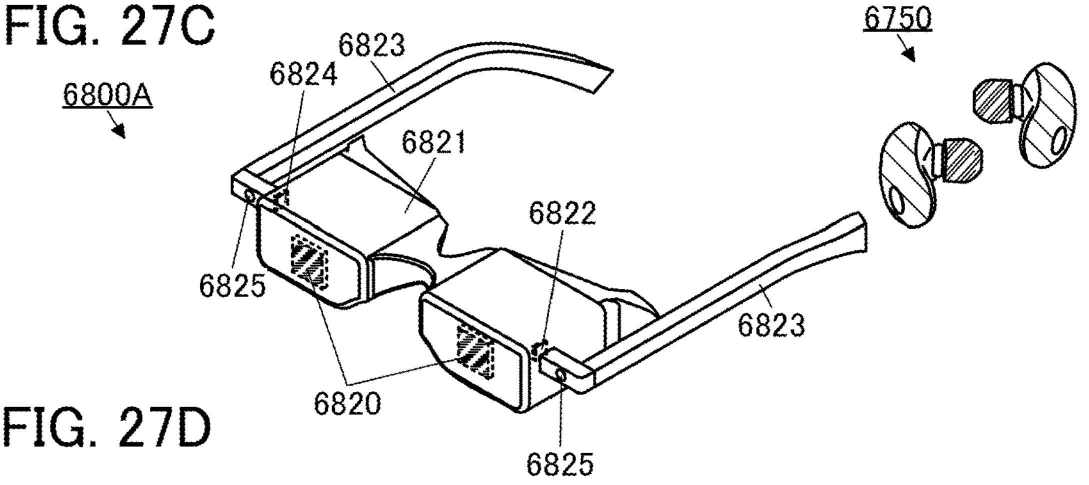
Figure 27D:
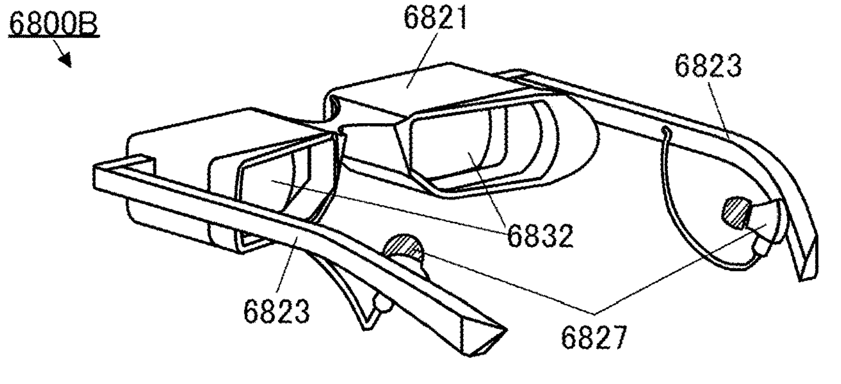

An electronic device 6800A illustrated in FIG. 27C and an electronic device 6800B illustrated in FIG. 27D each include a pair of display portions 6820, a housing 6821, a communication portion 6822, a pair of wearing portions 6823, a control portion 6824, a pair of image capturing portions 6825, and a pair of lenses 6832.

The display apparatus of one embodiment of the present invention can be used in the display portions 6820. Thus, a highly reliable electronic device can be obtained.

The display portions 6820 are positioned inside the housing 6821 so as to be seen through the lenses 6832. When the pair of display portions 6820 display different images, three-dimensional display using parallax can be performed.

The electronic devices 6800A and 6800B can be regarded as electronic devices for VR. The user who wears the electronic device 6800A or the electronic device 6800B can see images displayed on the display portions 6820 through the lenses 6832.

The electronic devices 6800A and 6800B preferably include a mechanism for adjusting the lateral positions of the lenses 6832 and the display portions 6820 so that the lenses 6832 and the display portions 6820 are positioned optimally in accordance with the positions of the user's eyes. Moreover, the electronic devices 6800A and 6800B preferably include a mechanism for adjusting focus by changing the distance between the lenses 6832 and the display portions 6820.

The electronic device 6800A or the electronic device 6800B can be mounted on the user's head with the wearing portions 6823. FIG. 27C, for instance, shows an example where the wearing portion 6823 has a shape like a temple (also referred to as a joint or the like) of glasses; however, one embodiment of the present invention is not limited thereto. The wearing portion 6823 can have any shape with which the user can wear the electronic device, for example, a shape of a helmet or a band.

The image capturing portion 6825 has a function of obtaining information on the external environment. Data obtained by the image capturing portion 6825 can be output to the display portion 6820. An image sensor can be used for the image capturing portion 6825. Moreover, a plurality of cameras may be provided so as to cover a plurality of fields of view, such as a telescope field of view and a wide field of view.

Although an example where the image capturing portions 6825 are provided is shown here, a range sensor (also referred to as a sensing portion) capable of measuring a distance between the user and an object just needs to be provided. In other words, the image capturing portion 6825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 6800A may include a vibration mechanism that functions as bone-conduction earphones. For example, at least one of the display portion 6820, the housing 6821, and the wearing portion 6823 can include the vibration mechanism. Thus, without additionally requiring an audio device such as headphones, earphones, or a speaker, the user can enjoy video and sound only by wearing the electronic device 6800A.

The electronic devices 6800A and 6800B may each include an input terminal. To the input terminal, a cable for supplying a video signal from a video output device or the like, power for charging a battery provided in the electronic device, and the like can be connected.

The electronic device of one embodiment of the present invention may have a function of performing wireless communication with earphones 6750. The earphones 6750 include a communication portion (not illustrated) and has a wireless communication function. The earphones 6750 can receive information (e.g., audio data) from the electronic device with the wireless communication function. For example, the electronic device 6700A in FIG. 27A has a function of transmitting information to the earphones 6750 with the wireless communication function. As another example, the electronic device 6800A in FIG. 27C has a function of transmitting information to the earphones 6750 with the wireless communication function.

The electronic device may include an earphone portion. The electronic device 6700B in FIG. 27B includes earphone portions 6727. For example, the earphone portion 6727 can be connected to the control portion by wire. Part of a wiring that connects the earphone portion 6727 and the control portion may be positioned inside the housing 6721 or the mounting portion 6723.

Similarly, the electronic device 6800B in FIG. 27D includes earphone portions 6827. For example, the earphone portion 6827 can be connected to the control portion 6824 by wire. Part of a wiring that connects the earphone portion 6827 and the control portion 6824 may be positioned inside the housing 6821 or the mounting portion 6823. Alternatively, the earphone portions 6827 and the mounting portions 6823 may include magnets. This is preferred because the earphone portions 6827 can be fixed to the mounting portions 6823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 6700A and 6700B) and the goggles-type device (e.g., the electronic devices 6800A and 6800B) are preferable as the electronic device of one embodiment of the present invention.

The electronic device of one embodiment of the present invention can transmit information to earphones by wire or wirelessly.

Figure 28A:
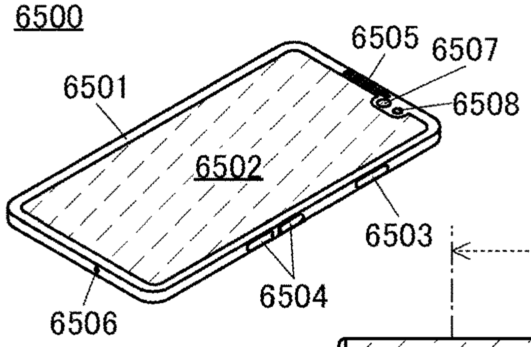
FIGS. 28A to 28F illustrate examples of electronic devices of an embodiment.

An electronic device 6500 in FIG. 28A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502. Thus, a highly reliable electronic device can be obtained.

Figure 28B:
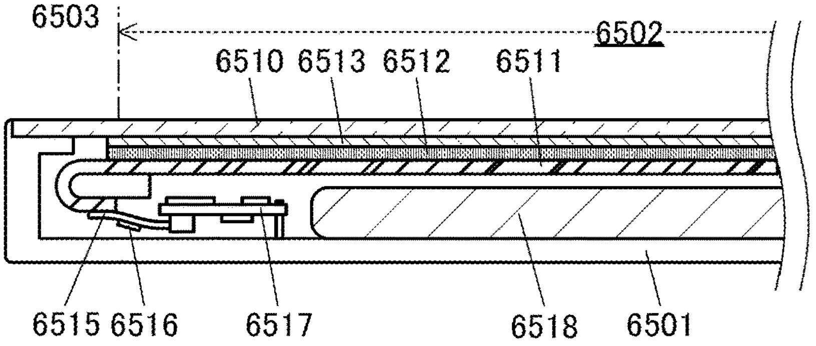

FIG. 28B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the region that is folded back. An IC 6516 is mounted on the FPC 6515. The FPC 6515 is connected to a terminal provided on the printed circuit board 6517.

A flexible display of one embodiment of the present invention can be used in the display panel 6511. Thus, an extremely lightweight electronic device can be achieved. Since the display panel 6511 is extremely thin, the battery 6518 with high capacity can be mounted without an increase in the thickness of the electronic device. Moreover, part of the display panel 6511 is folded back so that a connection portion with the FPC 6515 is provided on the back side of the pixel portion, whereby an electronic device with a narrow bezel can be achieved.

Figure 28C:
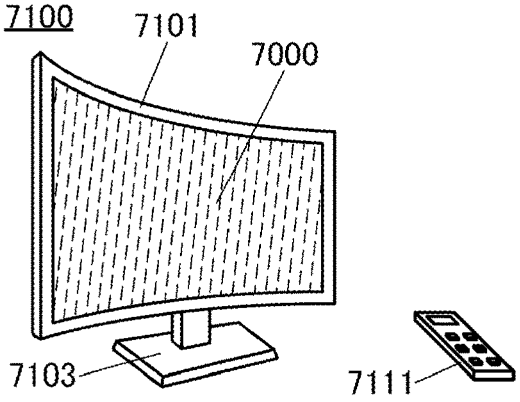

FIG. 28C illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000. Thus, a highly reliable electronic device can be obtained.

Operation of the television device 7100 illustrated in FIG. 28C can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel of the remote controller 7111, channels and volume can be controlled and images displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (e.g., between a transmitter and a receiver or between receivers) information communication can be performed.

Figure 28D:
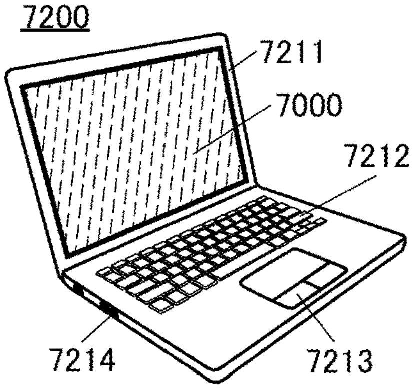

FIG. 28D illustrates an example of a notebook personal computer. A notebook personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000. Thus, a highly reliable electronic device can be obtained.

Figure 28E:
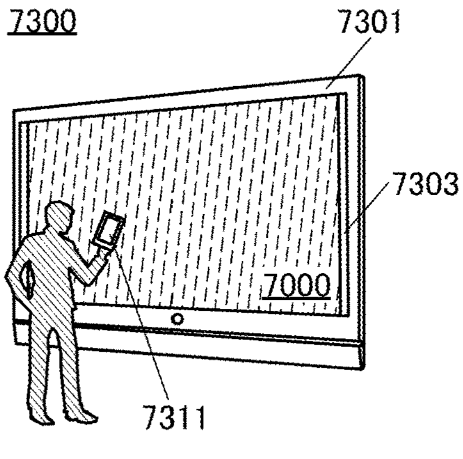
Figure 28F:
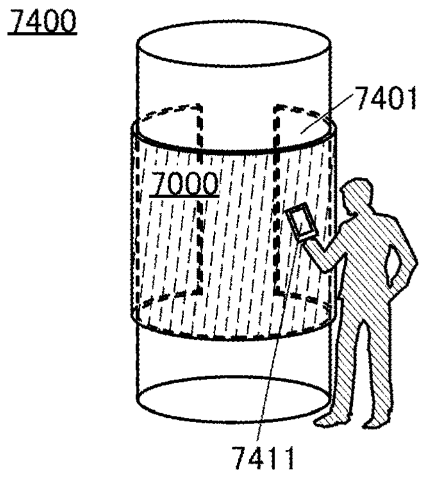

FIGS. 28E and 28F illustrate examples of digital signage.

Digital signage 7300 illustrated in FIG. 28E includes a housing 7301, the display portion 7000, a speaker 7303, and the like. The digital signage 7300 can also include an LED lamp, operation keys (including a power switch or an operation switch), a connection terminal, a variety of sensors, a microphone, and the like.

FIG. 28F shows digital signage 7400 attached to a cylindrical pillar 7401. The digital signage 7400 includes the display portion 7000 provided along a curved surface of the pillar 7401.

In FIGS. 28E and 28F, the display apparatus of one embodiment of the present invention can be used in the display portion 7000. Thus, a highly reliable electronic device can be obtained.

A larger area of the display portion 7000 can increase the amount of information that can be provided at a time. The display portion 7000 having a larger area attracts more attention, so that the effectiveness of the advertisement can be increased, for example.

The touch panel is preferably used in the display portion 7000, in which case in addition to display of still or moving images on the display portion 7000, intuitive operation by a user is possible. Moreover, for an application for providing information such as route information or traffic information, usability can be enhanced by intuitive operation.

As illustrated in FIGS. 28E and 28F, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, a displayed image on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIGS. 29A to 29G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 9008, and the like.

The electronic devices illustrated in FIGS. 29A to 29G have a variety of functions. For example, the electronic devices can have a function of displaying a variety of information (e.g., a still image, a moving image, and a text image) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The electronic devices illustrated in FIGS. 29A to 29G will be described in detail below.

Figure 29A:
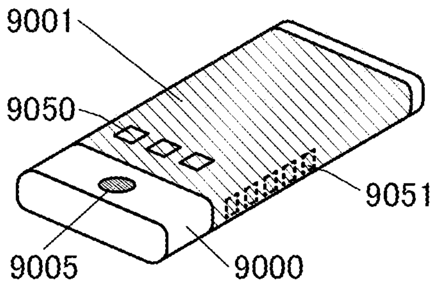
FIGS. 29A to 29G illustrate examples of electronic devices of an embodiment.

FIG. 29A is a perspective view showing a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 29A illustrates an example in which three icons 9050 are displayed. Furthermore, information 9051 indicated by dashed rectangles can be displayed on another surface of the display portion 9001. Examples of the information 9051 include notification of reception of an e-mail, an SNS message, an incoming call, or the like, the title and sender of an e-mail, an SNS message, or the like, the date, the time, remaining battery, and the radio field intensity. Alternatively, the icon 9050, for example, may be displayed at the position where the information 9051 is displayed.

Figure 29B:
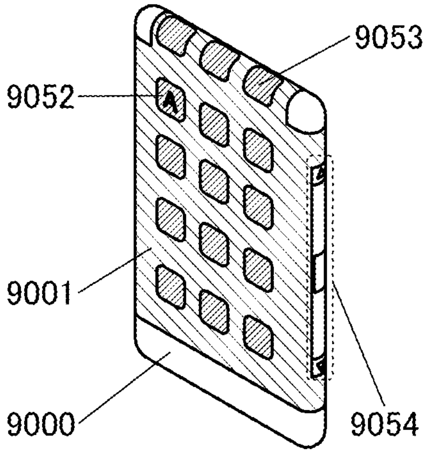

FIG. 29B is a perspective view showing a portable information terminal 9102. The portable information terminal 9102 has a function of displaying information on three or more surfaces of the display portion 9001. Here, information 9052, information 9053, and information 9054 are displayed on different surfaces. For example, the user can check the information 9053 displayed on the portable information terminal 9102 put in a breast pocket of the user's clothes, seeing the portable information terminal 9102 from above. The user can see the display without taking out the portable information terminal 9102 from the pocket and decide whether to answer the call, for example.

Figure 29C:
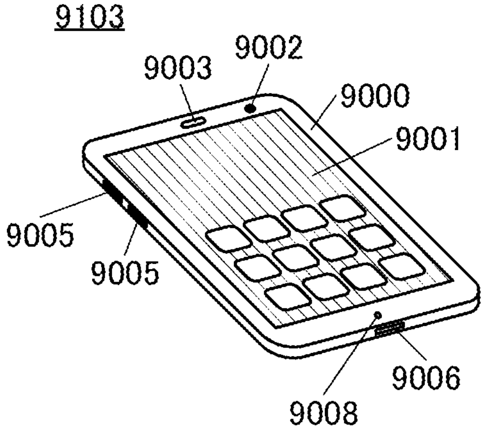

FIG. 29C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

Figure 29D:
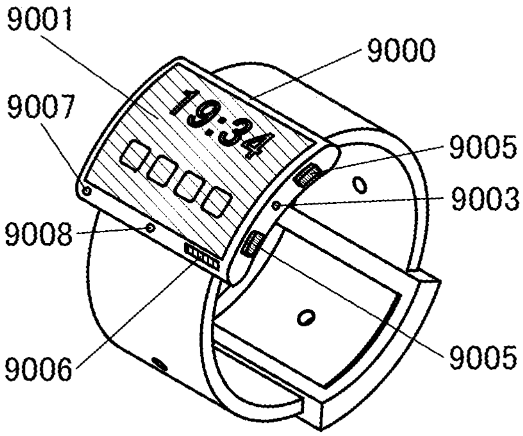

FIG. 29D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 29E:
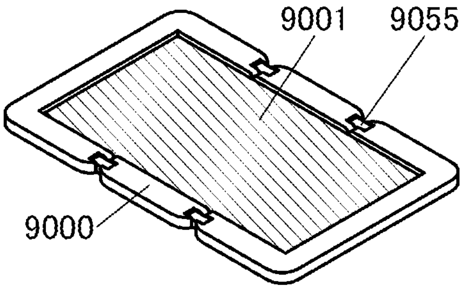
Figure 29F:
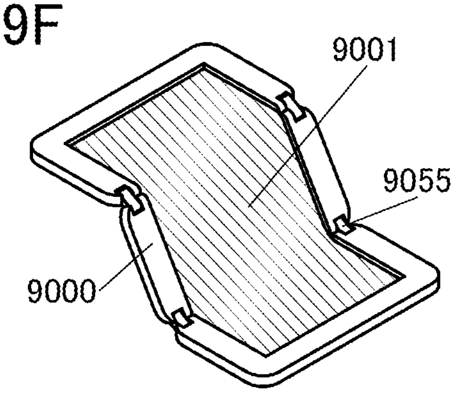
Figure 29G:
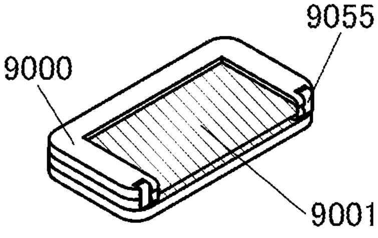

FIGS. 29E to 29G are perspective views of a foldable portable information terminal 9201. FIG. 29E is a perspective view showing the portable information terminal 9201 that is opened. FIG. 29G is a perspective view showing the portable information terminal 9201 that is folded. FIG. 29F is a perspective view showing the portable information terminal 9201 that is shifted from one of the states in FIGS. 29E and 29G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature of greater than or equal to 0.1 mm and less than or equal to 150 mm, for example.

This embodiment can be combined with any of the other embodiments as appropriate. In this specification, in the case where a plurality of structure examples are shown in one embodiment, the structure examples can be combined as appropriate.

This application is based on Japanese Patent Application Serial No. 2022-116351 filed with Japan Patent Office on Jul. 21, 2022, the entire contents of which are hereby incorporated by reference.

What is claimed is:

1. A display apparatus comprising a set of pixels,
wherein the set of pixels comprises a first pixel, a second pixel, a third pixel, and a fourth pixel,
wherein the first pixel comprises a first light-emitting device and a first layer,
wherein the first light-emitting device and the first layer overlap with each other,
wherein the first light-emitting device emits first light toward the first layer,
wherein an emission spectrum of the first light has an intensity in a blue-light wavelength range and an intensity in a green-light wavelength range,
wherein the first layer is configured to absorb the first light,
wherein the first layer comprises a color conversion material converting blue and green light into red light,
wherein the second pixel comprises a second light-emitting device and a second layer,
wherein the second light-emitting device and the second layer overlap with each other,
wherein the second light-emitting device emits second light toward the second layer,
wherein the second layer is configured to transmit blue light,
wherein the third pixel comprises a third light-emitting device and a third layer,
wherein the third light-emitting device and the third layer overlap with each other,
wherein the third light-emitting device emits third light toward the third layer,
wherein the third layer is configured to absorb blue light and transmit green light,
wherein the fourth pixel comprises a fourth light-emitting device and a fourth layer,
wherein the fourth light-emitting device and the fourth layer overlap with each other,
wherein the fourth light-emitting device emits fourth light toward the fourth layer,
wherein the fourth layer is configured to transmit blue light and green light, and
wherein the first to fourth light have the same emission spectrum.

2. A display module comprising:
the display apparatus according to claim 1; and
at least one of a connector and an integrated circuit.

3. An electronic device comprising:
the display apparatus according to claim 1; and
at least one of a battery, a camera, a speaker, and a microphone.

4. The display apparatus according to claim 1,
wherein each of the first light-emitting device, the second light-emitting device, the third light-emitting device, and the fourth light-emitting device comprises a light-emitting layer, and
wherein the light-emitting layer comprises a light-emitting material.

5. The display apparatus according to claim 4, wherein the light-emitting material emits blue and green light.

6. The display apparatus according to claim 4, wherein the light-emitting material is a single light-emitting material having an emission spectrum with blue and green light.

7. A display apparatus comprising a set of pixels, wherein the set of pixels comprises a first pixel, a second pixel, a third pixel, and a fourth pixel, wherein the first pixel comprises a first light-emitting device and a first layer, wherein the first light-emitting device and the first layer overlap with each other, wherein the first light-emitting device emits first light toward the first layer, wherein an emission spectrum of the first light has an intensity in a blue-light wavelength range and an intensity in a green-light wavelength range, wherein the first layer is configured to absorb the first light, wherein the first layer comprises a color conversion material converting blue and green light into red light, wherein the second pixel comprises a second light-emitting device and a second layer, wherein the second light-emitting device and the second layer overlap with each other, wherein the second light-emitting device emits second light toward the second layer, wherein an emission spectrum of the second light is the same as the emission spectrum of the first light, wherein the second layer is configured to transmit blue light, wherein the third pixel comprises a third light-emitting device and a third layer, wherein the third light-emitting device and the third layer overlap with each other, wherein the third light-emitting device emits third light toward the third layer, wherein an emission spectrum of the third light is the same as the emission spectrum of the first light, wherein the third layer is configured to absorb blue light and transmit green light, wherein the third layer comprises a color conversion material converting blue light into green light, wherein the fourth pixel comprises a fourth light-emitting device and a fourth layer, wherein the fourth light-emitting device and the fourth layer overlap with each other, wherein the fourth light-emitting device emits fourth light toward the fourth layer, wherein an emission spectrum of the fourth light is the same as the emission spectrum of the first light, and wherein the fourth layer is configured to transmit blue light and green light.

8. A display module comprising:

the display apparatus according to claim 7; and at least one of a connector and an integrated circuit.

9. An electronic device comprising:

the display apparatus according to claim 7; and at least one of a battery, a camera, a speaker, and a microphone.

10. The display apparatus according to claim 7, wherein each of the first light-emitting device, the second light-emitting device, the third light-emitting device, and the fourth light-emitting device comprises a light-emitting layer, and wherein the light-emitting layer comprises a light-emitting material.

11. The display apparatus according to claim 10, wherein the light-emitting material emits blue and green light.

12. The display apparatus according to claim 10, wherein the light-emitting material is a single light-emitting material having an emission spectrum with blue and green light.

* * * * *